United States Patent
Tanaka et al.

(10) Patent No.: US 9,590,115 B2
(45) Date of Patent: Mar. 7, 2017

(54) SEMICONDUCTOR DEVICE

(71) Applicant: Semiconductor Energy Laboratory Co., Ltd., Atsugi-shi, Kangawa-ken (JP)

(72) Inventors: Tetsuhiro Tanaka, Tokyo (JP); Daisuke Matsubayashi, Kanagawa (JP); Kazuki Tanemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/941,930

(22) Filed: Nov. 16, 2015

(65) Prior Publication Data

US 2016/0149045 A1     May 26, 2016

(30) Foreign Application Priority Data

Nov. 21, 2014   (JP) ................... 2014-236313

(51) Int. Cl.
*H01L 29/10*      (2006.01)
*H01L 27/146*    (2006.01)
(Continued)

(52) U.S. Cl.
CPC ...... *H01L 29/7869* (2013.01); *H01L 27/1156* (2013.01); *H01L 27/1225* (2013.01);
(Continued)

(58) Field of Classification Search
CPC .............. H01L 27/14612; H01L 29/1083
(Continued)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| | (Continued) | |

FOREIGN PATENT DOCUMENTS

| | | |
|---|---|---|
| EP | 1737044 A | 12/2006 |
| EP | 2226847 A | 9/2010 |
| | (Continued) | |

OTHER PUBLICATIONS

Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
(Continued)

*Primary Examiner* — George Fourson, III
(74) *Attorney, Agent, or Firm* — Fish & Richardson P.C.

(57) ABSTRACT

A semiconductor device includes a first conductor, a second conductor, a first insulator, a second insulator, a third insulator, a semiconductor, and an electron trap layer. The semiconductor includes a channel formation region. The electron trap layer overlaps with the channel formation region with the second insulator interposed therebetween. The first conductor overlaps with the channel formation region with the first insulator interposed therebetween. The second conductor overlaps with the electron trap layer with the third insulator interposed therebetween. The second conductor does not overlap with the channel formation region.

15 Claims, 36 Drawing Sheets

(51) Int. Cl.
*H01L 29/786* (2006.01)
*H01L 29/788* (2006.01)
*H01L 27/12* (2006.01)
*H01L 27/115* (2006.01)

(52) U.S. Cl.
CPC ........ *H01L 29/788* (2013.01); *H01L 29/7881* (2013.01); *H01L 27/14612* (2013.01); *H01L 29/1083* (2013.01)

(58) Field of Classification Search
USPC .................................................. 257/288, 349
See application file for complete search history.

(56) References Cited

U.S. PATENT DOCUMENTS

| | | | |
|---|---|---|---|
| 6,294,274 | B1 | 9/2001 | Kawazoe et al. |
| 6,518,625 | B1* | 2/2003 | Nishida ............... H01L 21/2652 257/344 |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 7,952,392 | B2 | 5/2011 | Koyama et al. |
| 8,067,775 | B2 | 11/2011 | Miyairi et al. |
| 8,106,400 | B2 | 1/2012 | Miyairi et al. |
| 8,188,477 | B2 | 5/2012 | Miyairi et al. |
| 8,305,109 | B2 | 11/2012 | Okazaki et al. |
| 8,319,215 | B2 | 11/2012 | Yamazaki et al. |
| 8,344,372 | B2 | 1/2013 | Yamazaki et al. |
| 8,384,080 | B2 | 2/2013 | Taniguchi et al. |
| 8,518,739 | B2 | 8/2013 | Miyairi et al. |
| 8,547,771 | B2 | 10/2013 | Koyama |
| 8,692,252 | B2 | 4/2014 | Takata et al. |
| 8,995,174 | B2 | 3/2015 | Koyama |
| 2001/0046027 | A1 | 11/2001 | Tai et al. |
| 2002/0005553 | A1* | 1/2002 | Ootsuka ............... H01L 21/8238 257/369 |
| 2002/0056838 | A1 | 5/2002 | Ogawa |
| 2002/0132454 | A1 | 9/2002 | Ohtsu et al. |
| 2002/0196665 | A1* | 12/2002 | Kim ................... G11C 16/0475 365/185.22 |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0231916 | A1* | 10/2006 | Fukumoto ........... H01L 29/7833 257/500 |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0069047 | A1 | 3/2011 | Koyama et al. |
| 2011/0242921 | A1* | 10/2011 | Tran ..................... G11C 7/062 365/210.1 |
| 2012/0056175 | A1 | 3/2012 | Takemura |
| 2015/0008428 | A1 | 1/2015 | Yamamoto et al. |
| 2015/0011046 | A1 | 1/2015 | Tanaka et al. |
| 2015/0011048 | A1 | 1/2015 | Tanaka et al. |
| 2015/0024577 | A1 | 1/2015 | Kato et al. |
| 2015/0041803 | A1* | 2/2015 | Endo ................... H01L 21/31155 257/43 |
| 2015/0054548 | A1 | 2/2015 | Kato et al. |
| 2015/0060846 | A1 | 3/2015 | Yamamoto et al. |
| 2015/0069385 | A1 | 3/2015 | Yamamoto et al. |
| 2015/0069387 | A1 | 3/2015 | Yamamoto et al. |
| 2015/0280691 | A1 | 10/2015 | Koyama |
| 2016/0043110 | A1* | 2/2016 | Atsumi ............... H01L 27/1225 257/43 |
| 2016/0087085 | A1* | 3/2016 | Yamazaki ............ H01L 29/24 438/104 |

(56) References Cited

U.S. PATENT DOCUMENTS

| | | | |
|---|---|---|---|
| 2016/0126274 A1* | 5/2016 | Kobayashi | H01L 27/14612 257/291 |
| 2016/0149045 A1* | 5/2016 | Tanaka | H01L 29/788 257/315 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-257187 A | 12/2012 |
| JP | 2013-247143 A | 12/2013 |
| WO | WO-2004/114391 | 12/2004 |

OTHER PUBLICATIONS

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Yamazaki.S et al., "Back-channel-etched thin-film transistor using c-axis-aligned crystal In—Ga—Zn oxide", J. Soc. Inf. Display (Journal of the Society for Information Display), 2014, vol. 22, No. 1, pp. 55-67.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Asakuma.N et al., "Crystallization and Reduction of SOL-GEL-Derived Zinc Oxide Films by Irradiation with Ultraviolet Lamp", Journal of SOL-GEL Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium on Electron Devices, Jul. 1, 1995, vol. 42, No. 7, pp. 1240-1246.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, May 20, 2008, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5') Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Compostites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meetings, 2008, No. 2317, ECS.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3-Ga2ZnO4-ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin- Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

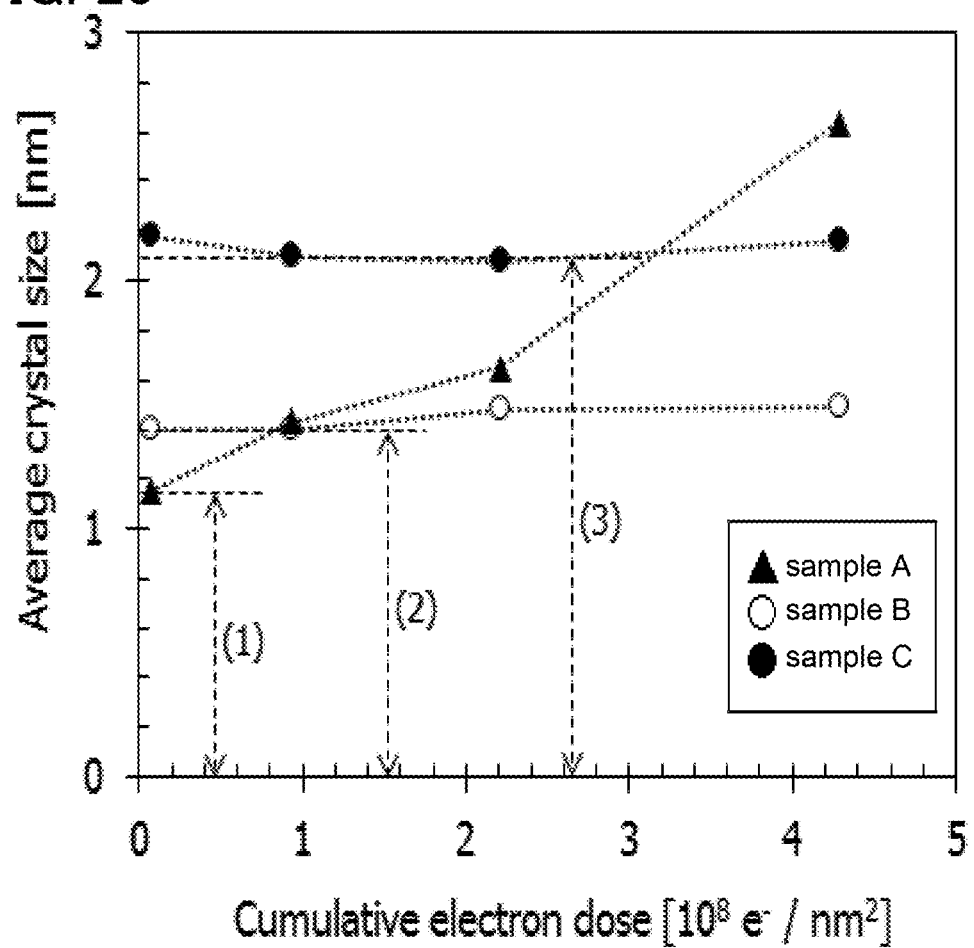

FIG. 28A1
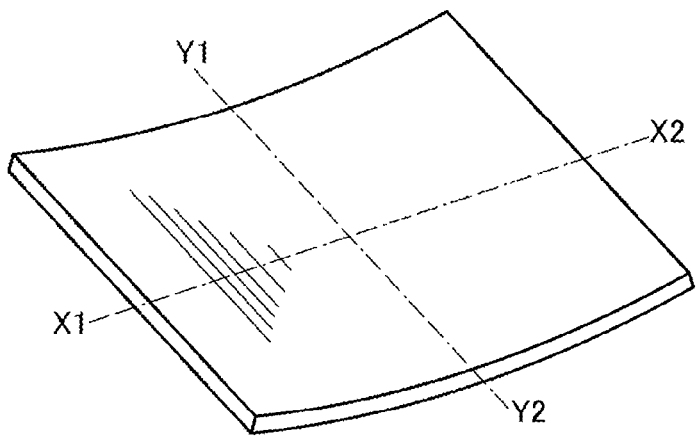
FIG. 28A2
FIG. 28A3
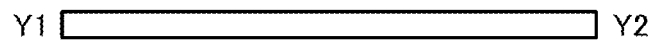
FIG. 28B1
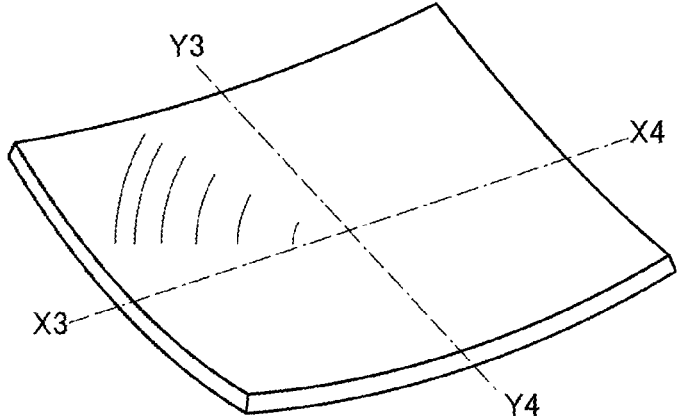
FIG. 28B2
FIG. 28B3

SEMICONDUCTOR DEVICE

BACKGROUND OF THE INVENTION

1. Field of the Invention

The present invention relates to an object, a method, or a manufacturing method. The present invention relates to a process, a machine, manufacture, or a composition of matter. One embodiment of the present invention relates to a semiconductor device, a display device, a light-emitting device, a power storage device, an imaging device, a memory device, a driving method thereof, or a manufacturing method thereof. In particular, one embodiment of the present invention relates to a semiconductor device, a display device, or a light-emitting device each including an oxide semiconductor.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

As silicon that is used as a semiconductor of a transistor, either amorphous silicon or polycrystalline silicon is used depending on the purpose. For example, for a transistor included in a large display device, it is preferable to use amorphous silicon, which can be used to form a film on a large substrate with the established technique. For a transistor included in a high-performance display device where a driver circuit and a pixel portion are formed over the same substrate, it is preferable to use polycrystalline silicon, which can be used to form a transistor having a high field-effect mobility. As a method for forming polycrystalline silicon, high-temperature heat treatment or laser light treatment that is performed on amorphous silicon has been known.

In recent years, transistors including oxide semiconductors (typically, an In—Ga—Zn oxide) have been actively developed. The transistors including oxide semiconductors have features different from those of the transistors including amorphous silicon or polycrystalline silicon. For example, a display device for which a transistor including an oxide semiconductor is used is known to have low power consumption.

It is known that a transistor including an oxide semiconductor has an extremely low leakage current in an off state. For example, a low-power-consumption CPU utilizing a characteristic of low leakage current of the transistor including an oxide semiconductor has been disclosed (see Patent Document 1).

For reduction of power consumption by power gating, the transistor including an oxide semiconductor preferably has normally-off electrical characteristics. As a method for making the transistor including an oxide semiconductor have normally-off electrical characteristics by controlling the threshold voltage of the transistor, Patent Document 2 has disclosed a method in which a floating gate is provided in a region overlapping with the oxide semiconductor and negative fixed charge is injected into the floating gate.

An oxide semiconductor can be deposited by a sputtering method or the like, and thus can be used in a transistor included in a large display device. Because a transistor including an oxide semiconductor has high field-effect mobility, a high-performance display device in which a driver circuit and a pixel portion are formed over the same substrate can be obtained. In addition, there is an advantage that capital investment can be reduced because part of production equipment for a transistor including amorphous silicon or a transistor including polycrystalline silicon can be retrofitted and utilized.

Oxide semiconductors have a long history, and in 1985, synthesis of an In—Ga—Zn oxide crystal was reported (see Non-Patent Document 1). Furthermore, in 1995, it was reported that an In—Ga—Zn oxide has a homologous structure and is represented by a composition formula $InGaO_3(ZnO)_m$ (m is a natural number) (see Non-Patent Document 2).

In 1995, a transistor including an oxide semiconductor was invented, and its electrical characteristics were disclosed (see Patent Document 3).

In 2014, transistors including a crystalline oxide semiconductor were reported (see Non-Patent Documents 3 and 4). The transistors in these reports include a c-axis aligned crystalline oxide semiconductor (CAAC-OS) and thus are capable of mass-production and have excellent electrical characteristics and high reliability.

REFERENCE

Patent Document

[Patent Document 1] Japanese Published Patent Application No. 2012-257187
[Patent Document 2] Japanese Published Patent Application No. 2013-247143
[Patent Document 3] Japanese Translation of PCT International Application No. H11-505377

Non-Patent Document

[Non-Patent Document 1] N. Kimizuka, and T. Mohri, *Journal of Solid State Chemistry*, Vol. 60, 1985, pp. 382-384
[Non-Patent Document 2] N. Kimizuka, M. Isobe, and M. Nakamura, *Journal of Solid State Chemistry*, Vol. 116, 1995, pp. 170-178
[Non-Patent Document 3] S. Yamazaki, T. Hirohashi, M. Takahashi, S. Adachi, M. Tsubuku, J. Koezuka, K. Okazaki, Y. Kanzaki, H. Matsukizono, S. Kaneko, S. Mori, and T. Matsuo, *Journal of the Society for Information Display*, Vol. 22, Issue 1, 2014, pp. 55-67
[Non-Patent Document 4] S. Yamazaki, T. Atsumi, K. Dairiki, K. Okazaki, and N. Kimizuka, *ECS Journal of Solid State Science and Technology*, Vol. 3, Issue 9, 2014, pp. Q3012-Q3022

SUMMARY OF THE INVENTION

An object of one embodiment of the present invention is to provide a semiconductor device including a transistor with low off-state current. Another object of one embodiment of the present invention is to provide a semiconductor device with low power consumption. Another object of one embodiment of the present invention is to provide a miniaturized semiconductor device. Another object of one embodiment of the present invention is to provide a highly reliable semiconductor device. Another object of one embodiment of the present invention is to provide a semiconductor device capable of high-speed writing. Another object of one embodiment of the present invention is to provide a semiconductor device capable of high-speed reading. Another object of one embodiment of the present invention is to provide a semiconductor device capable of retaining data for a long period. Another object of one embodiment of the present invention is to provide a novel semiconductor device. Another object of one embodiment of the present invention is to provide an eye-friendly display device. Another object of one embodiment of the present invention is to provide a semiconductor device including a transparent semiconductor.

Note that the descriptions of these objects do not disturb the existence of other objects. Note that one embodiment of the present invention does not necessarily achieve all the objects listed above. Other objects are apparent from and can be derived from the description of the specification, the drawings, the claims, and the like.

(1) One embodiment of the present invention is a semiconductor device including a first conductor, a second conductor, a first insulator, a second insulator, a third insulator, a semiconductor, and an electron trap layer. The semiconductor includes a channel formation region. The electron trap layer overlaps with the channel formation region with the second insulator interposed therebetween. The first conductor overlaps with the channel formation region with the first insulator interposed therebetween. The second conductor overlaps with the electron trap layer with the third insulator interposed therebetween. The second conductor does not overlap with the channel formation region.

(2) Another embodiment of the present invention is a semiconductor device including a first conductor, a second conductor, a third conductor, a fourth conductor, a first insulator, a second insulator, a third insulator, a semiconductor, and an electron trap layer. The semiconductor includes a first region in contact with the third conductor, a second region in contact with the fourth conductor, and a third region between the first and second regions. The electron trap layer overlaps with the third region with the second insulator interposed therebetween. The first conductor overlaps with the third region with the first insulator interposed therebetween. The second conductor overlaps with the electron trap layer with the third insulator interposed therebetween. The second conductor does not overlap with the third region.

(3) Another embodiment of the present invention is a semiconductor device including a first conductor, a second conductor, a third conductor, a fourth conductor, a first insulator, a second insulator, a third insulator, a semiconductor, and an electron trap layer. The semiconductor includes a first region in contact with the third conductor, a second region in contact with the fourth conductor, and a third region between the first and second regions. The electron trap layer overlaps with the first and third regions with the second insulator interposed therebetween. The first conductor overlaps with the third region with the first insulator interposed therebetween. The second conductor overlaps with the electron trap layer with the third insulator interposed therebetween. The second conductor overlaps with the first region.

(4) Another embodiment of the present invention is the semiconductor device described in any one of (1), (2), and (3) in which the electron trap layer includes a conductor or a semiconductor.

A semiconductor device or the like including a transistor with low off-state current can be provided. A semiconductor device with low power consumption can be provided. A miniaturized semiconductor device can be provided. A highly reliable semiconductor device can be provided. A semiconductor device capable of high-speed writing can be provided. A semiconductor device capable of retaining data for a long period can be provided. A semiconductor device capable of high-speed reading can be provided. A novel semiconductor device can be provided. An eye-friendly display device can be provided. A semiconductor device including a transparent semiconductor can be provided.

Note that the description of these effects does not disturb the existence of other effects. One embodiment of the present invention does not necessarily achieve all the effects listed above. Other effects are apparent from and can be derived from the description of the specification, the drawings, the claims, and the like.

BRIEF DESCRIPTION OF THE DRAWINGS

FIG. 20 shows a change of crystal parts of an In—Ga—Zn oxide owing to electron irradiation.

FIGS. 28A1, 28A2, 28A3, 28B1, 28B2, and 28B3 are perspective views and cross-sectional views of semiconductor devices according to one embodiment of the present invention.

DETAILED DESCRIPTION OF THE INVENTION

Figure 1A:
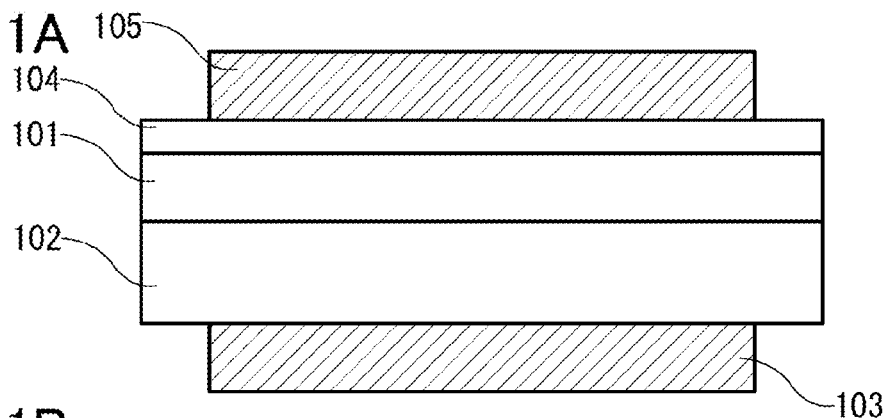
FIGS. 1A to 1C illustrate examples of a semiconductor device of an embodiment.

Embodiments are described in detail with reference to drawings. Note that the present invention is not limited to the following description and it is readily appreciated by those skilled in the art that modes and details can be modified in various ways without departing from the spirit and the scope of the present invention. Therefore, the present invention should not be interpreted as being limited to the description of the embodiments below.

Note that in structures of the present invention described below, the same portions or portions having similar functions are denoted by the same reference numerals in different drawings, and description thereof is not repeated in some cases. Furthermore, the same hatching pattern is applied to portions having similar functions, and the portions are not denoted by reference numerals in some cases.

Note that functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification.

Note that in this specification and the like, ordinal numbers such as "first" and "second" are used in order to avoid confusion among components and do not limit the components numerically.

Note that in each drawing described in this specification, the size, the layer thickness, or the region of each component is exaggerated for clarity in some cases. Therefore, embodiments of the present invention are not limited to such a scale.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Note that the terms "film" and "layer" can be interchanged with each other. For example, the term "conductive layer" can be changed into the term "conductive film" in some cases. Also, the term "insulating film" can be changed into the term "insulating layer" in some cases.

Unless otherwise specified, the off-state current in this specification refers to a drain current of a transistor in the off state (also referred to as non-conduction state and cutoff state). Unless otherwise specified, the off state of an n-channel transistor means that a voltage (Vgs) between its gate and source is lower than the threshold voltage (Vth), and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. Thus, "the off-state current of a transistor is lower than or equal to I" may mean "there is Vgs with which the off-state current of the transistor becomes lower than or equal to I". Furthermore, "the off-state current of a transistor" means "the off-state current in an off state at predetermined Vgs", "the off-state current in an off state at Vgs in a predetermined range", "the off-state current in an off state at Vgs with which sufficiently reduced off-state current is obtained", or the like.

As an example, the assumption is made of an n-channel transistor where the threshold voltage Vth is 0.5 V and the drain current is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The drain current of the transistor is $1\times10^{-19}$ A or lower at Vgs of −0.5 V or at Vgs in the range of −0.8 V to −0.5 V; therefore, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

In this specification, the off-state current of a transistor with a channel width W is sometimes represented by a current value per the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is Vgs at which the off-state current of a transistor is lower than or equal to I at room temperature, 60° C., 85° C., 95° C., 125° C., a temperature at which the reliability of a semiconductor device or the like including the transistor is ensured, or a temperature at which the semiconductor device or the like including the transistor is used (e.g., temperature in the range of 5° C. to 35° C.).

The off-state current of a transistor depends on voltage Vds between its drain and source in some cases. Unless otherwise specified, the off-state current in this specification may be an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at Vds at which the reliability of a semiconductor device or the like including the transistor is ensured or Vds at which the semiconductor device or the like including the transistor is used. The description "an off-state current of a transistor is lower than or equal to I" may refer to a situation where there is Vgs at which the off-state current of a transistor is lower than or equal to I at Vds of 0.1 V, 0.8 V, 1 V, 1.2 V, 1.8 V, 2.5 V, 3 V, 3.3 V, 10 V, 12 V, 16 V, or 20 V, Vds at which the reliability of a semiconductor device or the like including the transistor is ensured, or Vds used in the semiconductor device or the like including the transistor.

In this specification, the term "leakage current" sometimes expresses the same meaning as off-state current.

In this specification, the off-state current sometimes refers to a current that flows between a source and a drain when a transistor is off, for example.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

In this embodiment, a structure of a semiconductor device including a semiconductor, an electron trap layer, and a gate electrode, the operation principle of the semiconductor device, and a circuit that uses the semiconductor device are described. FIG. 1A shows a semiconductor device including a semiconductor 101, an electron trap layer 102, a gate electrode 103, a gate insulating layer 104, and a gate electrode 105.

Figure 1B:
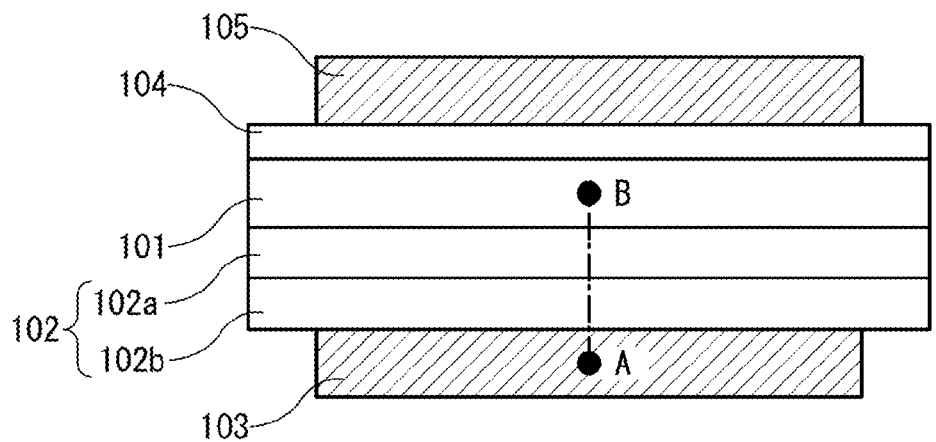
Figure 1C:
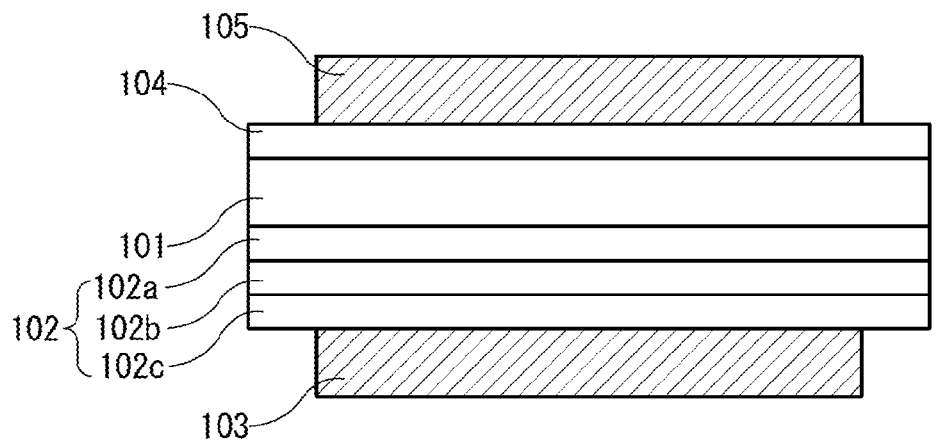
Figure 2:
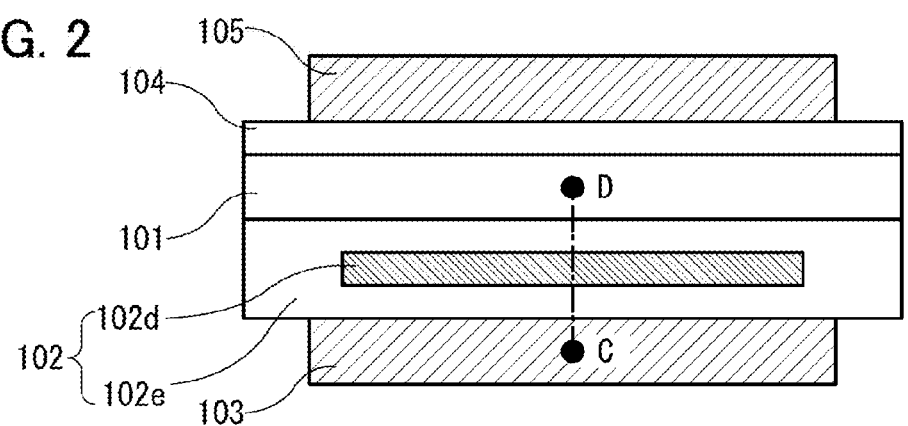
FIG. 2 illustrates an example of a semiconductor device of an embodiment.

The electron trap layer 102 may be, for example, a stack including an insulator 102a and an insulator 102b as illustrated in FIG. 1B. Alternatively, the electron trap layer 102 may be a stack including the insulator 102a, the insulator 102b, and an insulator 102c as illustrated in FIG. 1C. Alternatively, the electron trap layer 102 may be a stack including more insulators. Alternatively, as illustrated in FIG. 2, the electron trap layer 102 may include an insulator 102e and an electrically isolated conductor 102d in the insulator 102e. The insulator 102e may be composed of a plurality of insulators.

Figure 3A:
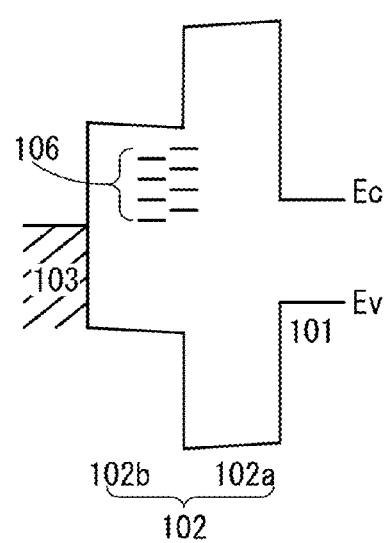
FIGS. 3A to 3D illustrate band diagram examples of a semiconductor device of an embodiment.

FIG. 3A illustrates a band diagram example of the semiconductor device illustrated in FIG. 1B, from Point A to Point B. In FIGS. 3A-3D, Ec denotes the conduction band minimum and Ev denotes the valence band maximum. In FIG. 3A, the potential of the gate electrode 103 is equal to that of a source electrode or a drain electrode (not shown).

In this example, the energy gap of the insulator 102a is larger than that of the insulator 102b. Furthermore, the electron affinity of the insulator 102a is smaller than that of the insulator 102b; however, one embodiment of the present invention is not limited thereto.

Figure 3B:
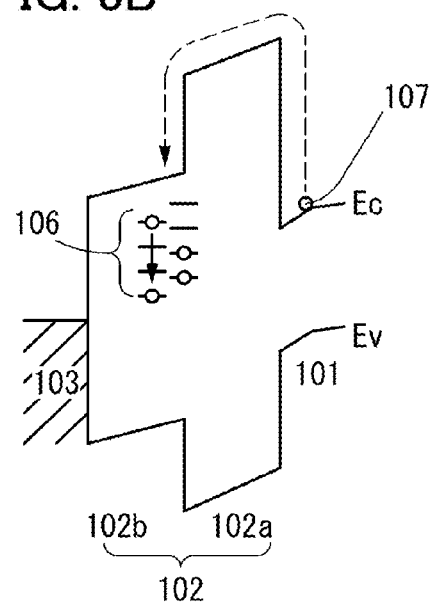

Electron trap states 106 exist at the interface between the insulators 102a and 102b and/or in the insulator 102b. FIG. 3B shows the state where the potential of the gate electrode 103 is higher than that of the source or drain electrode. The potential of the gate electrode 103 may be higher than that of the source or drain electrode by 1 V or more. The potential of the gate electrode 103 may be lower than the highest potential applied to the gate electrode 105 after this process. The potential may be typically less than 4 V.

At this time, the potential of the gate electrode 105 is preferably the same as the potential of the source or drain electrode. Electrons 107 that exist in the semiconductor 101 move toward the gate electrode 103 having a higher potential. Some of the electrons 107 moving from the semiconductor 101 toward the gate electrode 103 are trapped by the electron trap states 106.

There are some processes to enable the electrons 107 to go over the barrier of the insulator 102a to reach the insulator 102b. The first is a process by the tunnel effect. The thinner the insulator 102a is, the more prominent the tunnel effect is. However, in this case, the electrons trapped in the electron trap states 106 may flow out due to the tunnel effect.

Even when the insulator 102a is relatively thick, the tunnel effect (Fowler-Nordheim tunnel effect) can be obtained by application of an appropriate voltage to the gate electrode 103. In the case of the Fowler-Nordheim tunnel effect, a tunnel current greatly increases with an increase in the electric field between the gate electrode 103 and the semiconductor 101.

The second is the process that the electrons 107 hop from trap states to trap states in the energy gap such as defect states in the insulator 102a to reach the insulator 102b. This is a conduction mechanism called Poole-Frenkel conduction, in which as the absolute temperature is higher and trap states are shallower, the electric conductivity is higher.

The third is the process that the electrons 107 go over the barrier of the insulator 102a by thermal excitation. The distribution of electrons existing in the semiconductor 101 follows the Fermi-Dirac distribution; the proportion of electrons having high energy typically increases as the temperature rises. Assuming that the density of electrons having energy 3 eV higher than the Fermi level at 300 K (27° C.) is 1, for example, the density is $6 \times 10^{16}$ at 450 K (177° C.), $1.5 \times 10^{25}$ at 600 K (327° C.), and $1.6 \times 10^{30}$ at 750 K (477° C.).

The movement of the electrons 107 toward the gate electrode 103 by going over the barrier of the insulator 102a occurs by one of the above three processes or the combination of these processes. In particular, the second and the third processes indicate that current increases exponentially as the temperature is higher.

Also, the Fowler-Nordheim tunnel effect in the first process is more likely to occur as the density of electrons in a thin part (a high-energy portion) of a barrier layer of the insulator 102a is higher; thus, a higher temperature is better.

Note that in most cases, current flowing in the above processes is weak in particular when the potential of the gate electrode 103 is low (5 V or lower). However, by taking a long time for the process, the needed number of electrons can be trapped by the electron trap states 106. As a result, the electron trap layer 102 is negatively charged.

In other words, the potential of the gate electrode 103 is kept higher than that of the source or drain electrode at a high temperature (a temperature higher than the operating temperature or the storage temperature of the semiconductor device, or higher than or equal to 125° C. and lower than or equal to 450° C., typically higher than or equal to 150° C. and lower than or equal to 300° C.) for 5 milliseconds or longer and shorter than 10 seconds, and typically 3 seconds or longer. As a result, a necessary number of electrons moves from the semiconductor 101 toward the gate electrode 103 and some of them are trapped by the electron trap states 106. The temperature of the process for trapping electrons is referred to as process temperature below.

Here, the number of electrons trapped by the electron trap states 106 can be controlled by the potential of the gate electrode 103. When a certain number of electrons is trapped by the electron trap states 106, due to the electric charge, the electric field of the gate electrode 103 is blocked and a channel formed in the semiconductor 101 disappears.

The total number of electrons trapped by the electron trap states 106 increases linearly at first, and then, the rate of increase gradually decreases, and the total number of electrons converges at a certain value. The convergence value depends on the potential of the gate electrode 103. As the potential is higher, the number of trapped electrons is more likely to be large; however, it never exceeds the total number of electron trap states 106.

The electrons trapped by the electron trap states 106 are required not to transfer from the electron trap layer 102 to the other regions. For this, each thickness of the insulators 102a and 102b is preferably set at a thickness at which the tunnel effect is not a problem. For example, each physical thickness of the insulators 102a and 102b is preferably greater than 1 nm.

Typically, the thickness of the insulator 102a is greater than or equal to 10 nm and less than or equal to 20 nm, and the equivalent silicon oxide thickness of the insulator 102b is greater than or equal to 10 nm and less than or equal to 25 nm.

A reduction in the operation temperature or storage temperature of the semiconductor device can prevent electrons trapped by the electron trap states 106 from flowing outwardly. For example, the probability that electrons go over a 3 eV-barrier when the storage temperature of the semiconductor device is 120° C. is less than one hundred-thousandth of that when process temperature is 300° C.

It is also effective that the effective mass of a hole is extremely large or is substantially localized in the semiconductor 101. In this case, the injection of holes from the semiconductor 101 to the insulators 102a and 102b does not occur and consequently a phenomenon in which electrons trapped by the electron trap states 106 bond to holes and disappear does not occur.

A material showing Poole-Frenkel conduction may be used for the insulator 102b. The Poole-Frenkel conduction is, as described above, electron hopping conduction between defect states and the like in a material. A material including a large number of defect states or including deep defect states has low electric conductivity and consequently can hold electrons trapped by the electron trap states 106 for a long period.

Circuit design and/or material selection may be made so that no voltage at which electrons trapped in the insulator 102a and/or the insulator 102b are released is applied. For example, in a material whose effective mass of holes is extremely large or is substantially localized, such as an In—Ga—Zn-based oxide semiconductor, a channel is formed when the potential of the gate electrode 103 is higher than that of the source or drain electrode; however, when the potential of the gate electrode 103 is lower than that of the source or drain electrode, the material shows characteristics similar to an insulator. In this case, the electric field between the gate electrode 103 and the semiconductor 101 is extremely small and consequently electron conduction according to the Fowler-Nordheim tunnel effect or the Poole-Frenkel conduction is significantly decreased.

To hold electrons trapped by electron trap states inside the insulator 102b or at the interface with another insulator, it is effective that the electron trap layer 102 is formed using three insulators as illustrated in FIG. 1C, that the electron affinity of the insulator 102c is smaller than that of the insulator 102b, and that the energy gap of the insulator 102c is larger than that of the insulator 102b.

In this case, if the physical thickness of the insulator 102c is large enough, electrons trapped by the electron trap states 106 can be held even when the insulator 102b has a small thickness. As a material of the insulator 102c, the same material as or a material similar to that of the insulator 102a can be used. Alternatively, a material whose constituent elements are the same as those of the insulator 102b but number of electron trap states is small enough may be used. The number (density) of electron trap states depends on the formation method.

Figure 3C:
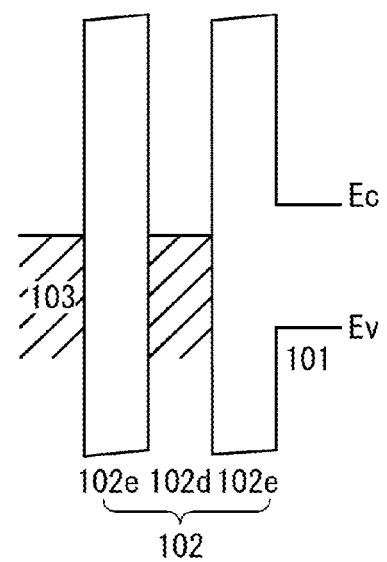

Note that when the electrically insulated conductor 102d is provided in the insulator 102e as illustrated in FIG. 2, electrons are trapped in the conductor 102d according to the above principle. The electron trap layer is formed using a conductor here, but may be formed using a semiconductor. In FIG. 3C, the potential of the gate electrode 103 is equal to that of the source or drain electrode.

Figure 3D:
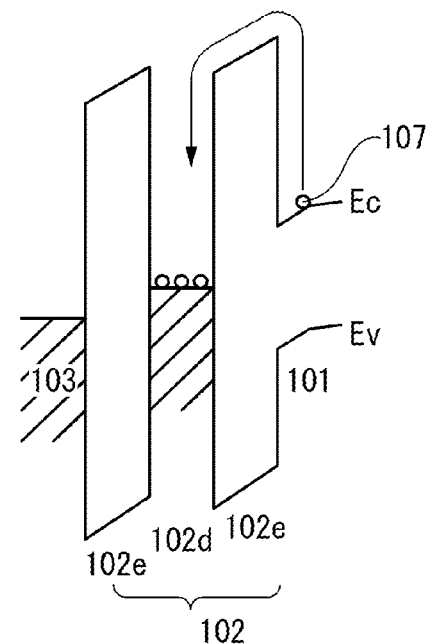

FIG. 3D shows the state where the potential of the gate electrode 103 is higher than the potential of the source or drain electrode. The electrons 107 that exist in the semiconductor 101 move toward the gate electrode 103 having a higher potential. Some of the electrons 107 moving from the semiconductor 101 toward the gate electrode 103 are trapped in the conductor 102d. In other words, in the semiconductor device illustrated in FIG. 2, the conductor 102d functions as the electron trap states 106 in the semiconductor device in FIG. 1B.

When the work function of the conductor 102d is large, an energy barrier to the insulator 102e is high and consequently the electrons trapped by the electron trap states 106 can be prevented from flowing outwardly.

In the above structure, each of the insulators 102a, 102b, and 102c may be composed of a plurality of insulators. A plurality of insulators containing the same constituting elements and formed by different formation methods may be used.

For example, when the insulators 102a and 102b are formed using insulators composed of the same constituting elements (e.g., hafnium oxide), the insulator 102a may be formed by a CVD method or an atomic layer deposition (ALD) method, and the insulator 102b may be formed by a sputtering method.

Note that any of various CVD methods can be used. Examples of the CVD methods include a thermal CVD method, an optical CVD method, a plasma CVD method, an MOCVD method, and a low pressure CVD (LPCVD) method. Thus, insulators may be formed by different CVD methods.

In general, an insulator formed by a sputtering method has more defects and stronger electron trapping properties than an insulator formed by a CVD method or an ALD method. From this reason, the insulator 102b may be formed by a sputtering method and the insulator 102c may be formed by a CVD method or an ALD method when the insulators 102b and 102c contain the same constituent elements.

When the insulator 102b is formed using a plurality of insulators containing the same constituent elements, one insulator may be formed by a sputtering method and another insulator may be formed by a CVD method or an ALD method.

Figure 4A:
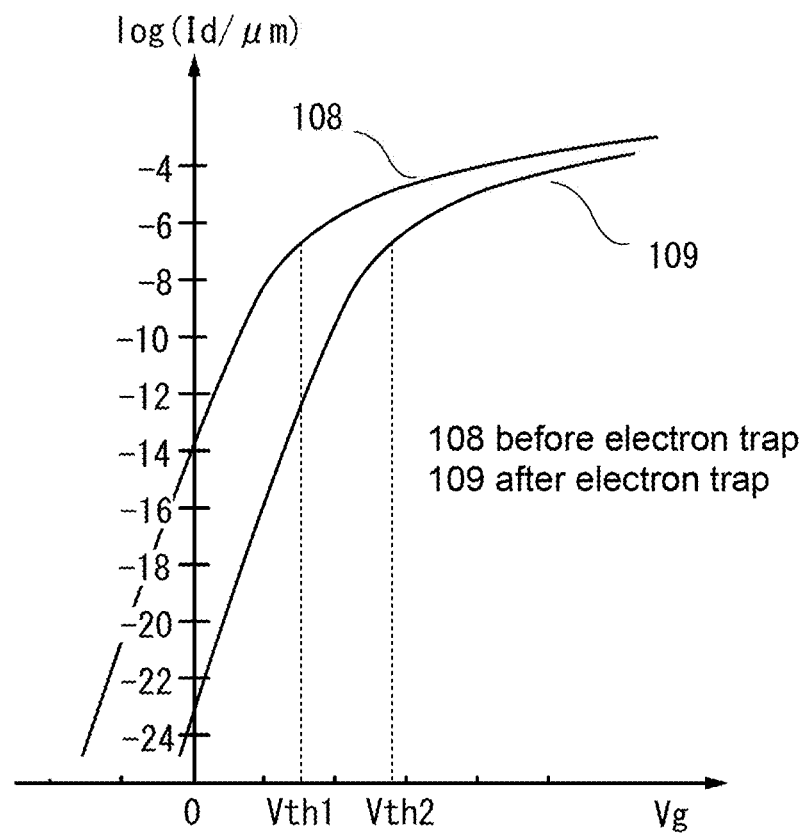
FIG. 4A schematically shows characteristics of a semiconductor device of an embodiment and FIG. 4B illustrates an example of a circuit in which the semiconductor device is used.

As described above, the threshold voltage of the semiconductor device is increased by the trap of electrons in the electron trap layer 102 as illustrated in FIG. 4A. In particular, when the semiconductor 101 is formed using a material with a large energy gap (wide energy gap semiconductor), a current between the source and the drain with the potentials of the gate electrodes 103 and 105 at 0 V can be significantly reduced.

For example, when the potentials of the gate electrodes 103 and 105 are 0 V, the current density (a current value per micrometer of a channel width) between the source and the drain of an In—Ga—Zn oxide semiconductor whose energy gap is 3.2 eV can be less than or equal to 1 zA/μm ($1 \times 10^{-21}$ A/μm), typically less than or equal to 1 yA/μm ($1 \times 10^{-24}$ A/μm).

FIG. 4A schematically shows dependence of current per micrometer of channel width (Id/μm) between the source and drain electrodes on the potential of the gate electrode 105 (Vg) at room temperature, before and after electron trap in the insulator 102. Note that each potential of the source electrode and the gate electrode 103 is 0 V and the potential of the drain electrode is +1 V. Although it is difficult to measure current smaller than 1 fA directly, it can be estimated from a value measured by another method, the subthreshold swing value (SS value), and the like.

As indicated by a curve 108, the threshold voltage of the semiconductor device is Vth1 at first. After electron trapping, the threshold voltage increases (shifts in the positive direction) to become Vth2. As a result, the current density at Vg=0 becomes 1 aA/μm ($1 \times 10^{-18}$ A/μm) or less, for example, greater than or equal to 1 yA/μm and less than or equal to 1 zA/μm.

Figure 4B:
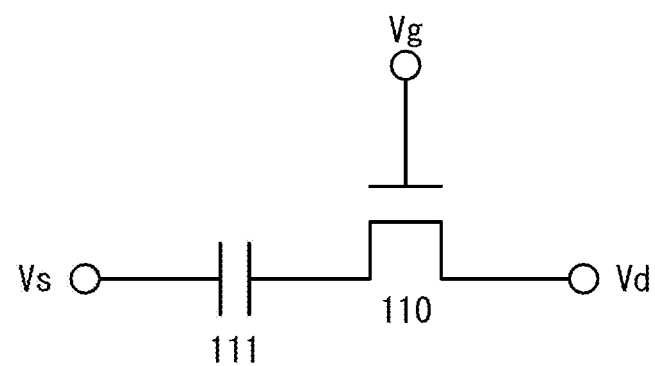

FIG. 4B illustrates a circuit in which charge stored in a capacitor 111 is controlled by a transistor 110. Leakage current between electrodes of the capacitor 111 is ignored. The capacitance of the capacitor 111 is 1 fF, the potential of the capacitor 111 on the transistor 110 side is +1 V, and the potential of Vd is 0 V.

When the transistor 110 has the Id-Vg characteristics denoted by the curve 108 in FIG. 4A and has a channel width of 0.1 μm, the current density between the source and the drain is approximately 1 fA with the potentials of the gate electrodes 103 and 105 at 0 V and the resistivity of the transistor 110 is approximately $1 \times 10^{15}$ Ω. Accordingly, the time constant of a circuit composed of the transistor 110 and the capacitor 111 is approximately one second. This means that most of the charge stored in the capacitor 111 is lost in approximately one second.

When the transistor 110 has the Id-Vg characteristics denoted by the curve 109 in FIG. 4A and has a channel width of 0.1 μm, and the potentials of the gate electrodes 103 and 105 are 0 V, the current density between the source and the drain is approximately 1 yA and the resistance of the transistor 110 is approximately $1 \times 10^{24}$ Ω. Accordingly, the time constant of the circuit composed of the transistor 110 and the capacitor 111 is approximately $1 \times 10^9$ seconds (=approximately 31 years). This means that one-third of the charge stored in the capacitor 111 is left after 10 years.

From this, charge can be held for 10 years in a simple circuit composed of a transistor and a capacitor. This can be applied to various kinds of memory devices.

Embodiment 2

In this embodiment, a structure of a transistor of one embodiment of the present invention is described with reference to drawings.

Figure 5A:
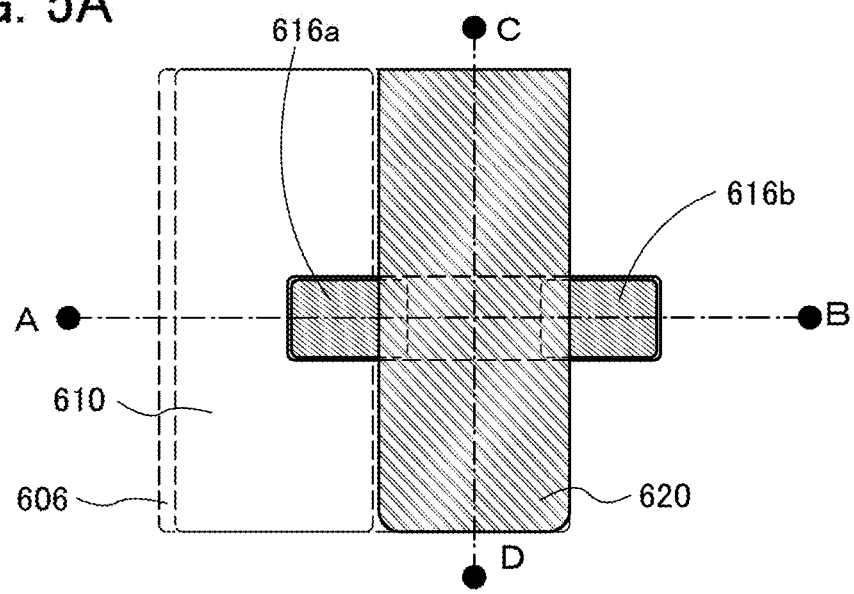
FIGS. 5A to 5C are a top view and cross-sectional views of a transistor according to one embodiment of the present invention.
Figure 5B:
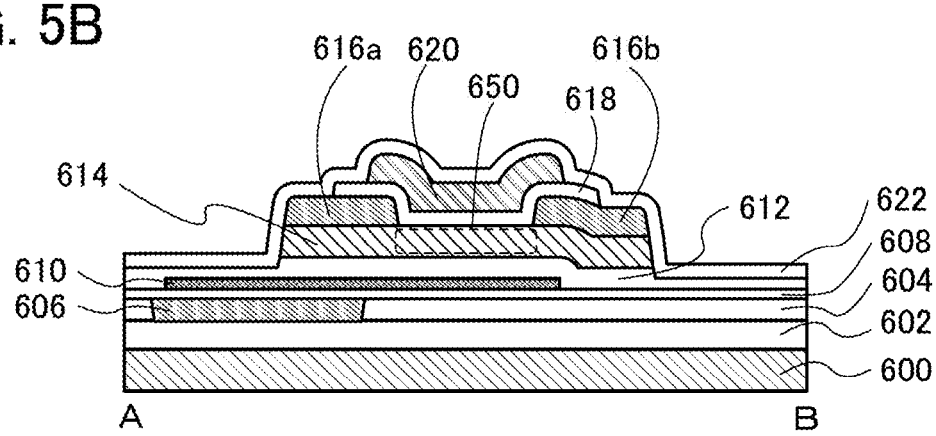
Figure 5C:
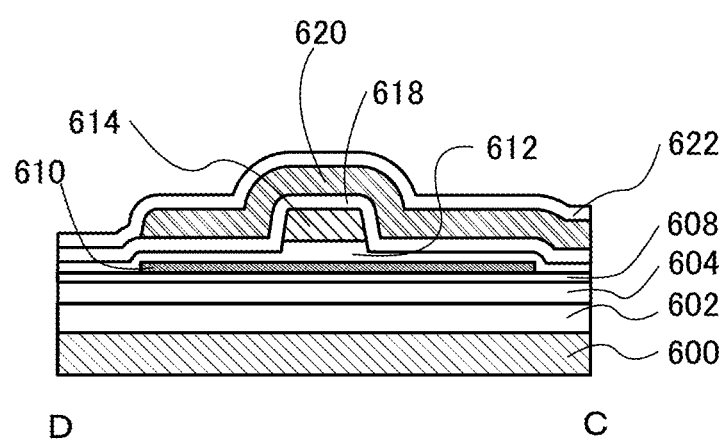

FIGS. 5A to 5C are a top view and cross-sectional views that illustrate a transistor of one embodiment of the present invention. FIG. 5A is the top view. FIG. 5B illustrates a cross section taken along the dashed-dotted line A-B in FIG. 5A. FIG. 5C illustrates a cross section taken along the dashed-dotted line C-D in FIG. 5A. Note that for simplification of the drawing, some components are not illustrated in the top view of FIG. 5A. In some cases, the direction of the dashed-dotted line A-B is referred to as a channel length direction, and the direction of the dashed-dotted line C-D is referred to as a channel width direction.

The transistor illustrated in FIGS. 5A to 5C includes an insulator 602 over a substrate 600; an insulator 604 over the insulator 602; a gate electrode 606 embedded in the insulator 604; an insulator 608 over the insulator 604 and the gate electrode 606; an electron trap layer 610 over the insulator 608; an insulator 612 over the insulator 608 and the electron trap layer 610; an oxide semiconductor 614 over the insulator 612; a source electrode 616a and a drain electrode 616b over the oxide semiconductor 614; a gate insulator 618 over the oxide semiconductor 614, the source electrode 616a, and the drain electrode 616b; a gate electrode 620 that is over and in contact with the top surface of the gate insulator 618 and faces the top and side surfaces of the oxide semiconductor 614; and an insulator 622 over the insulator 612, the source electrode 616a, the drain electrode 616b, and the gate electrode 620.

The oxide semiconductor 614 includes a channel formation region 650. The channel formation region 650 overlaps with the electron trap layer 610 with the insulator 612 interposed therebetween. The gate electrode 606 overlaps with the electron trap layer 610 with the insulator 608 interposed therebetween and does not overlap with the channel formation region 650.

As described in the operation principle of Embodiment 1, a voltage is applied to the gate electrode 606, and electrons are injected into the electron trap layer 610; accordingly, the threshold voltage of the transistor is controlled. The voltage application to the gate electrode 606 does not cause deterioration of the channel formation region 650 and the gate insulator 618 that overlaps with the channel formation region 650.

If the gate electrode 606 overlaps with the channel formation region 650, the voltage application to the gate electrode 606 causes the Fowler-Nordheim tunnel effect. A tunnel current that occurs by the Fowler-Nordheim tunnel effect greatly increases when the electric field between the gate electrode 606 and the channel formation region 650 is high. The tunnel current may cause an increase of defects in the channel formation region 650 and an increase of electron traps in the channel formation region 650. Furthermore, electron traps may increase because of an increase of defects also in the gate insulator 618 that overlaps with the channel formation region 650. These electron traps may lead to the instability and low reliability of the transistor characteristics.

Since the gate electrode 606 does not overlap with the channel formation region 650 as illustrated in FIG. 5B, one embodiment of the present invention can prevent the above-described problem. The details are described below.

The gate electrode 606 overlaps with the electron trap layer 610, and thus electrons can be injected to the electron trap layer 610 by voltage application to the gate electrode 606. The electron trap layer 610 overlaps with the channel formation region 650, and thus the threshold voltage of the transistor can be controlled by the number of electrons injected to the electron trap layer 610. In this way, the threshold voltage of the transistor can be controlled, while the above-described problem is not caused because the gate electrode 606 does not overlap with the channel formation region 650.

In one embodiment of the present invention, the threshold voltage of the transistor can be controlled by the electron trap layer 610 formed using a conductor or a semiconductor in which electrons trapped by the electron trap layer 610 can move in the electron trap layer 610 and at the interface between the electron trap layer 610 and the insulator 608. The conductor can be formed using tantalum, tungsten, titanium, molybdenum, aluminum, copper, a molybdenum-tungsten alloy, or the like. Alternatively, the conductor can be a multilayer film selected as appropriate from tantalum nitride, tungsten nitride, titanium nitride, or the like that allows less oxygen to pass therethrough. The semiconductor can be formed using polycrystalline silicon, microcrystalline silicon, amorphous silicon, an oxide semiconductor, or the like. For example, the semiconductor may be formed using the same oxide semiconductor as the oxide semiconductor 614 in this transistor. It is preferable to use an oxide semiconductor for the electron trap layer 610 because excess oxygen can be prevented from diffusing from the insulator 612 to the electron trap layer 610 in the case where the insulator 612 contains excess oxygen.

Figure 6A:
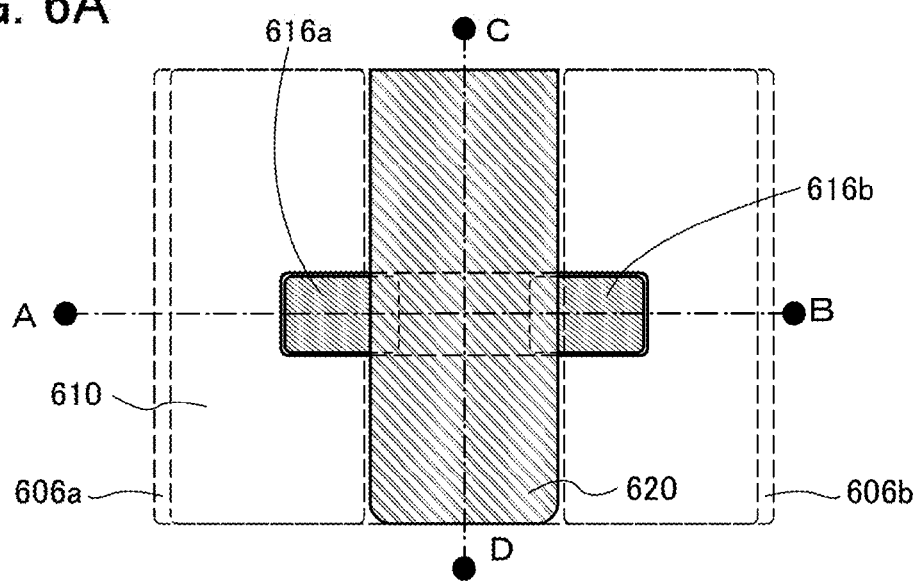
FIGS. 6A to 6C are a top view and cross-sectional views of a transistor according to one embodiment of the present invention.
Figure 6B:
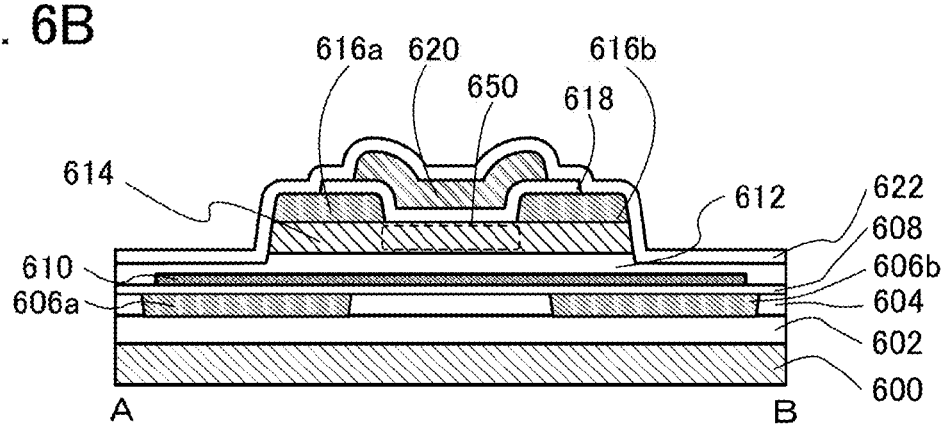
Figure 6C:
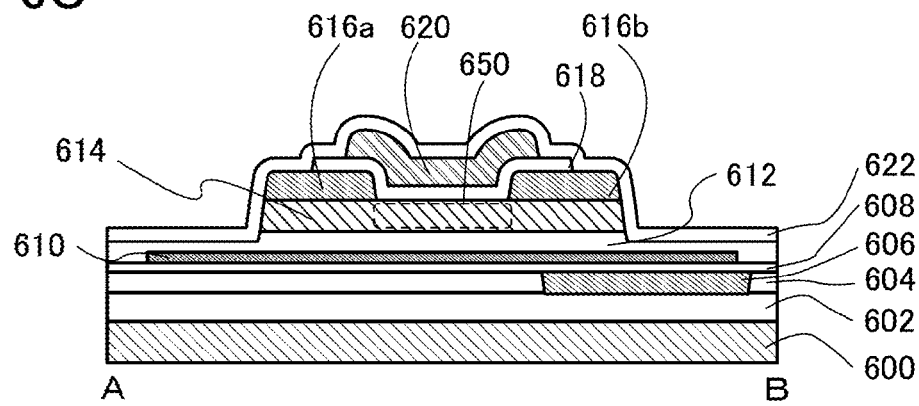

As illustrated in FIGS. 6A and 6B, the electron trap layer 610 may extend to a region overlapping with a drain electrode 616b. Alternatively, a gate electrode 606b may also be provided in a region where the drain electrode 616b overlaps with the electron trap layer 610. Alternatively, as illustrated in FIG. 6C, the gate electrode 606 may be provided only in the region where the drain electrode 616b overlaps with the electron trap layer 610.

Figure 7A:
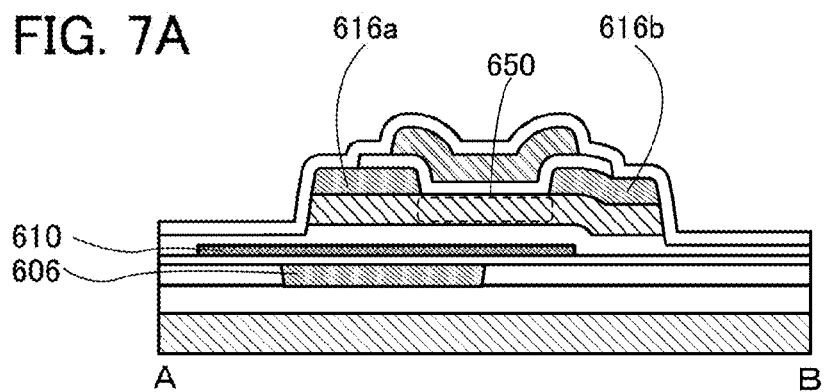
FIGS. 7A to 7C are cross-sectional views of a transistor according to one embodiment of the present invention.
Figure 7B:
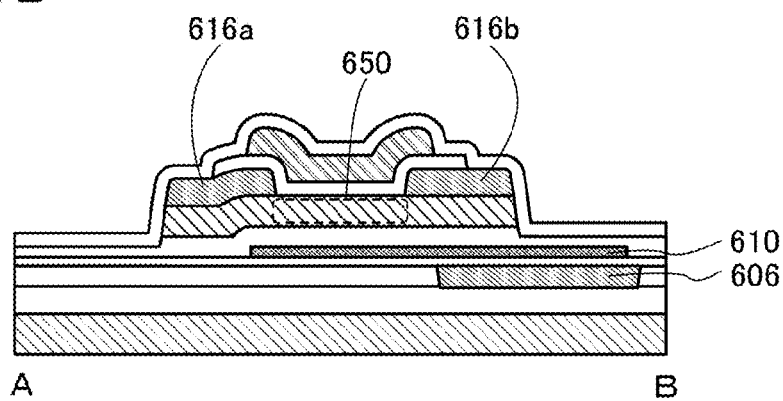
Figure 7C:
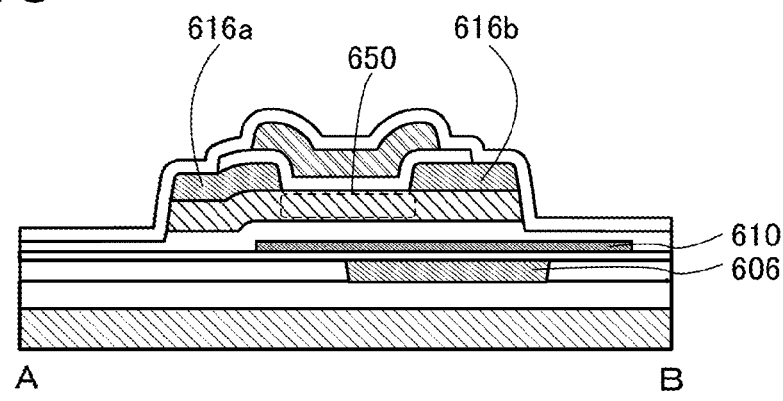

Alternatively, a region in which the gate electrode 606 and the channel formation region 650 do not overlap with each other may be approximately half the channel formation region 650 as illustrated in FIGS. 7A and 7C.

The gate electrode 606 and the electron trap layer 610 overlap with the source electrode 616a in FIGS. 5A to 5C, but may overlap with the drain electrode 616b as illustrated in FIGS. 7B and 7C.

Figure 8A:
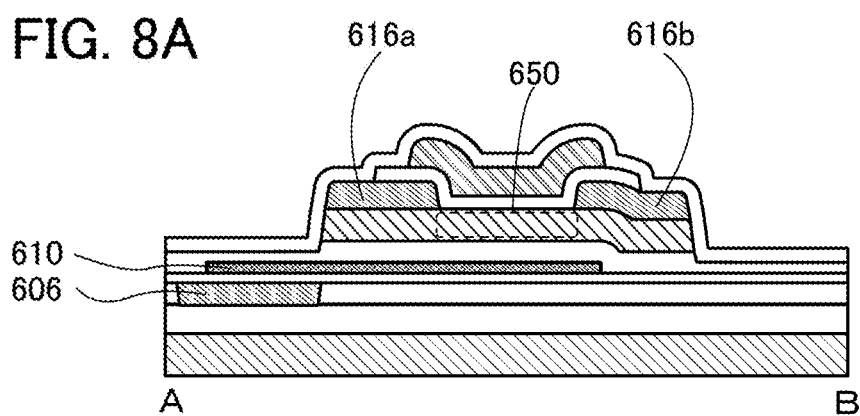
FIGS. 8A and 8B are cross-sectional views of a transistor according to one embodiment of the present invention.
Figure 8B:
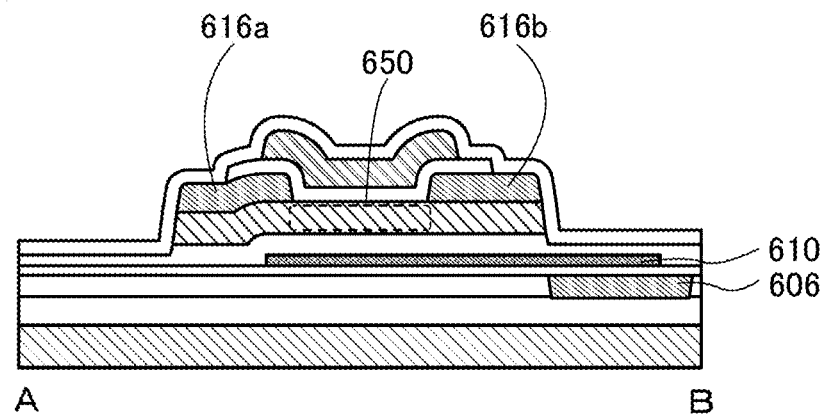

Alternatively, the gate electrode 606 does not necessarily overlap with the source electrode 616a and the drain electrode 616b as illustrated in FIGS. 8A and 8B.

The following describes a transistor in which the oxide semiconductor 614 has a different structure. For other components, refer to the above description.

Figure 9A:
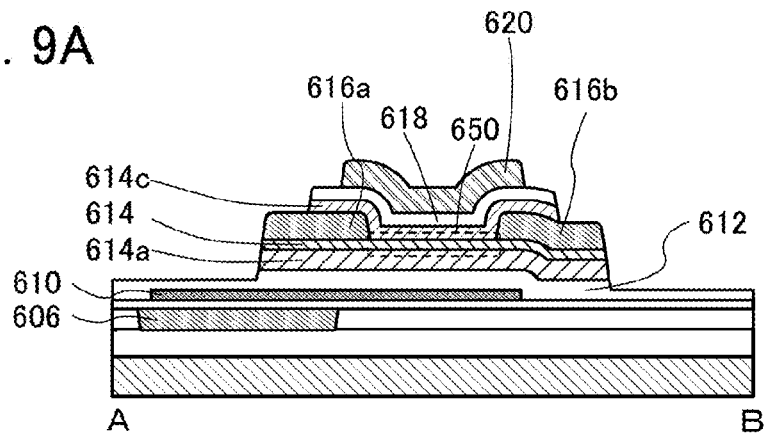
FIGS. 9A to 9C are cross-sectional views and a band diagram of a transistor according to one embodiment of the present invention.

Like FIG. 5B, FIG. 9A illustrates a cross section of a transistor in a channel length direction. Like FIG. 5C, FIG. 9B illustrates a cross section of the transistor in a channel width direction.

Figure 9B:
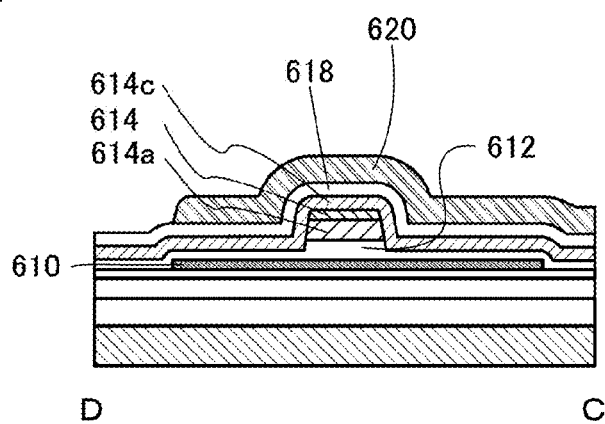

In the transistor structure in FIGS. 9A and 9B, an oxide semiconductor 614a is provided between the insulator 612 and the oxide semiconductor 614. Furthermore, an oxide semiconductor 614c is provided between the insulator 612 and the gate insulator 618, between the source electrode 616a and the gate insulator 618, between the drain electrode 616b and the gate insulator 618, between the oxide semiconductor 614a and the gate insulator 618, and between the oxide semiconductor 614 and the gate insulator 618.

The oxide semiconductor 614 is, for example, an oxide semiconductor containing indium. For example, the oxide semiconductor 614 including indium has high carrier mobility (electron mobility). The oxide semiconductor 614 preferably contains an element M. The element M is preferably aluminum, gallium, tin, or the like. Other elements that can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element whose bonding energy with oxygen is higher than that of indium, for example. The element M is an element that can increase the energy gap of the oxide semiconductor, for example. Furthermore, the oxide semiconductor 614 preferably contains zinc. The oxide semiconductor containing zinc may be easily crystallized.

Note that the oxide semiconductor 614 is not limited to the oxide semiconductor containing indium. The oxide semiconductor 614 may be, for example, an oxide semiconductor that does not contain indium and contains zinc, an oxide semiconductor that does not contain indium and contains gallium, or an oxide semiconductor that does not contain indium and contains tin, e.g., a zinc tin oxide or a gallium tin oxide.

The oxide semiconductor 614 is formed using, for example, an oxide with a wide energy gap. The energy gap of the oxide semiconductor 614 is, for example, 2.5 eV or larger and 4.2 eV or smaller, preferably 2.8 eV or larger and 3.8 eV or smaller, more preferably 3 eV or larger and 3.5 eV or smaller.

For example, the oxide semiconductors 614a and 614c include one or more elements other than oxygen included in the oxide semiconductor 614. Since the oxide semiconductors 614a and 614c include one or more elements other than oxygen included in the oxide semiconductor 614, a defect state is less likely to be formed at the interface between the oxide semiconductors 614a and 614 and the interface between the oxide semiconductors 614 and 614c.

The oxide semiconductors 614a, 614, and 614c preferably include at least indium. In the case where the oxide semiconductor 614a is an In-M-Zn oxide and the total proportion of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case where the oxide semiconductor 614 is an In-M-Zn oxide and the total proportion of In and M is assumed to be 100 atomic %, the proportions of In and M are preferably set to be greater than 25 atomic % and less than 75 atomic %, respectively, more preferably greater than 34 atomic % and less than 66 atomic %, respectively. In the case where the oxide semiconductor 614c is an In-M-Zn oxide and the total proportion of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the oxide semiconductor 614c may be an oxide that is the same type as that of the oxide semiconductor 614a. Note that indium is not necessarily contained in the oxide semiconductor 614a and/or 614c in some cases. For example, the oxide semiconductor 614a and/or 614c may be gallium oxide. Note that the atomic ratios of the elements included in the oxide semiconductors 614a, 614, and 614c are not necessarily simple ratios of integers.

As the oxide semiconductor 614, an oxide having an electron affinity higher than those of the oxide semiconductors 614a and 614c is used. For example, as the oxide semiconductor 614, an oxide having an electron affinity higher than those of the oxide semiconductors 614a and 614c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy gap between the vacuum level and the bottom of the conduction band.

An indium gallium oxide has a small electron affinity and a high oxygen-blocking property. Therefore, the oxide semiconductor 614c preferably includes an indium gallium oxide. The gallium atomic ratio [Ga/(In+Ga)] is, for example, higher than or equal to 70%, preferably higher than or equal to 80%, more preferably higher than or equal to 90%.

In that case, when a gate voltage is applied, a channel is formed in the oxide semiconductor 614 having the highest electron affinity in the oxide semiconductors 614a, 614, and 614c.

Figure 9C:

A mixed region of the oxide semiconductors 614a and 614 may exist between the oxide semiconductors 614a and 614. Furthermore, a mixed region of the oxide semiconductors 614 and 614c may exist between the oxide semiconductors 614 and 614c. The mixed region has a low density of defect states. For that reason, the stack including the oxide semiconductors 614a, 614, and 614c has a band structure where energy is changed continuously at each interface and in the vicinity of the interface (continuous junction) as shown in FIG. 9C. The interfaces between the oxide semiconductors 614a, 614, and 614c may be difficult to define.

At this time, electrons move mainly in the oxide semiconductor 614, not in the oxide semiconductors 614a and 614c. As described above, when the density of defect states at the interface between the oxide semiconductors 614a and 614 and the density of defect states at the interface between the oxide semiconductors 614 and 614c are decreased, electron movement in the oxide semiconductor 614 is less likely to be inhibited and the on-sate current of the transistor can be increased.

As factors of inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in a channel formation region is large.

To increase the on-state current of the transistor, for example, root mean square (RMS) roughness with a measurement area of 1 µm×1 µm of a top surface or a bottom surface of the oxide semiconductor 614 (a formation surface; here, the oxide semiconductor 614a) is less than 1 nm, preferably less than 0.6 nm, more preferably less than 0.5 nm, still more preferably less than 0.4 nm. The average surface roughness (also referred to as Ra) with the measurement area of 1 µm×1 µm is less than 1 nm, preferably less than 0.6 nm, more preferably less than 0.5 nm, still more preferably less than 0.4 nm. The maximum difference (P-V) with the measurement area of 1 µm×1 µm is less than 10 nm, preferably less than 9 nm, more preferably less than 8 nm, still more preferably less than 7 nm. RMS roughness, Ra, and P-V can be measured using a scanning probe microscope SPA-500 manufactured by SII Nano Technology Inc.

The electron movement is also inhibited, for example, in the case where the density of defect states is high in a region where a channel is formed.

For example, in the case where the oxide semiconductor 614 contains oxygen vacancies (also denoted by $V_O$), donor levels are formed by entry of hydrogen into sites of oxygen vacancies in some cases. A state in which hydrogen enters sites of oxygen vacancies are denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the oxide semiconductor 614, the on-state current of the transistor can be increased in some cases.

Furthermore, in the case where the density of defect states is high in a region where a channel is formed, electrical characteristics of the transistor vary in some cases. For example, in the case where the defect states serve as carrier generation sources, the threshold voltage of the transistor might vary.

To decrease oxygen vacancies in the oxide semiconductor 614, for example, there is a method in which excess oxygen in the insulator 612 is moved to the oxide semiconductor 614 through the oxide semiconductor 614a. In this case, the oxide semiconductor 614a is preferably a layer having an oxygen-transmitting property (a layer through which oxygen passes or is transmitted).

Moreover, the thickness of the oxide semiconductor 614c is preferably as small as possible to increase the on-state current of the transistor. The thickness of the oxide semiconductor 614c is less than 10 nm, preferably less than or equal to 5 nm, more preferably less than or equal to 3 nm, for example. Meanwhile, the oxide semiconductor 614c has a function of blocking entry of elements other than oxygen (such as hydrogen and silicon) included in the adjacent insulator into the oxide semiconductor 614 where a channel is formed. Thus, the oxide semiconductor 614c preferably has a certain thickness. The oxide semiconductor 614c has a region with a thickness of greater than or equal to 0.3 nm, preferably greater than or equal to 1 nm, more preferably greater than or equal to 2 nm, for example. The oxide semiconductor 614c preferably has an oxygen blocking property to suppress outward diffusion of oxygen released from the insulator 612 and the like.

To improve reliability, preferably, the thickness of the oxide semiconductor 614a is large and the thickness of the oxide semiconductor 614c is small. The oxide semiconductor 614a has a region with a thickness of greater than or equal to 10 nm, preferably greater than or equal to 20 nm, more preferably greater than or equal to 40 nm, still more preferably greater than or equal to 60 nm, for example. An increase in thickness of the oxide semiconductor 614a can increase the distance from the oxide semiconductor 614 where a channel is formed to the interface between the adjacent insulator and the oxide semiconductor 614a. Since the productivity of the semiconductor device might be decreased, the oxide semiconductor 614a has a region with a thickness of, for example, less than or equal to 200 nm, preferably less than or equal to 120 nm, more preferably less than or equal to 80 nm.

For example, a region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $2\times10^{18}$ atoms/cm$^3$ is provided between the oxide semiconductors 614 and 614a. A region with a silicon concentration measured by SIMS of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $2\times10^{18}$ atoms/cm$^3$ is provided between the oxide semiconductors 614 and 614c.

It is preferable to reduce the hydrogen concentration in the oxide semiconductors 614a and 614c in order to reduce the hydrogen concentration in the oxide semiconductor 614. The oxide semiconductors 614a and 614c each have a region in which the concentration of hydrogen measured by SIMS is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$. It is preferable to reduce the nitrogen concentration in the oxide semiconductors 614a and 614c in order to reduce the nitrogen concentration in the oxide semiconductor 614. The oxide semiconductors 614a and 614c include a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$.

The above three-layer structure is an example. For example, a two-layer structure of the oxide semiconductors 614a and 614 or a two-layer structure of the oxide semiconductors 614 and 614c may be employed. Alternatively, a four-layer structure in which any one of the semiconductors described as examples of the oxide semiconductors 614a, 614, and 614c is provided under or over the oxide semiconductor 614 or under or over the oxide semiconductor 614c may be employed. An n-layer structure (n is an integer of 5 or more) in which any one of the semiconductors described as examples of the oxide semiconductors 614a, 614, and 614c is provided at two or more of the following positions: over the oxide semiconductor 614a, under the oxide semiconductor 614a, over the oxide semiconductor 614c, and under the oxide semiconductor 614c.

Figure 10A:
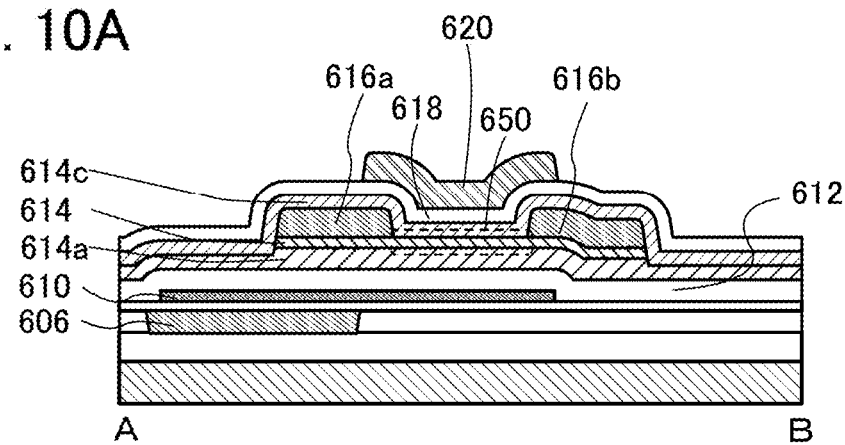
FIGS. 10A and 10B are cross-sectional views of a transistor according to one embodiment of the present invention.
Figure 10B:
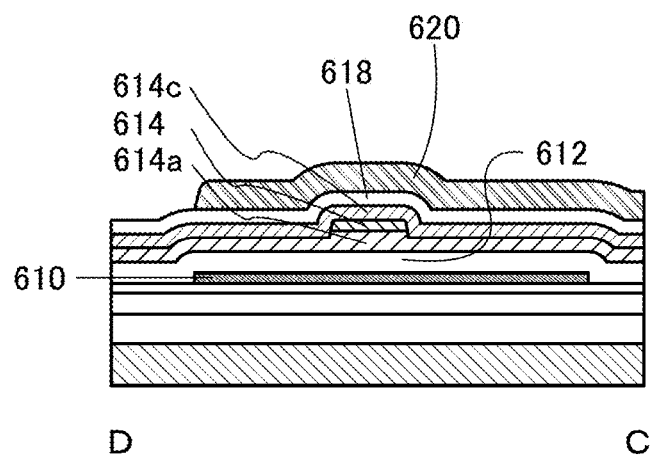

A transistor structure different from that in FIGS. 9A and 9B is described here with reference to FIGS. 10A and 10B. For the same components as those in FIGS. 9A to 9C, refer to the above description.

The transistor structure in FIGS. 10A and 10B differs from that in FIGS. 9A and 9B in that the insulator 612 is not reduced in thickness by etching as illustrated in FIGS. 10A and 10B. The oxide semiconductor 614a remains also in a region that does not overlap with the oxide semiconductor 614, so that a reduction in thickness of the insulator 612 can be prevented. If the insulator 612 is reduced in thickness, problems such as electrostatic breakdown or electron traps may occur when electrons are injected to the electron trap layer 610 by voltage application to the gate electrode 606. One embodiment of the present invention prevents a reduction in thickness of the insulator 612 and thus can prevent the problems. After the gate electrode 620 is formed, although not illustrated, an unnecessary portion of the remaining oxide semiconductor 614a is removed together with the gate insulator 618 and the oxide semiconductor 614c. Accordingly, the transistor in FIGS. 10A and 10B can acquire similar characteristics to those of the transistor, which includes the three-layer oxide semiconductors, in FIGS. 9A and 9B.

A transistor structure different from that in FIGS. 5A to 5C is described below with reference to FIGS. 11A to 11C. For the same components as those in FIGS. 5A to 5C, refer to the above description.

Figure 11A:
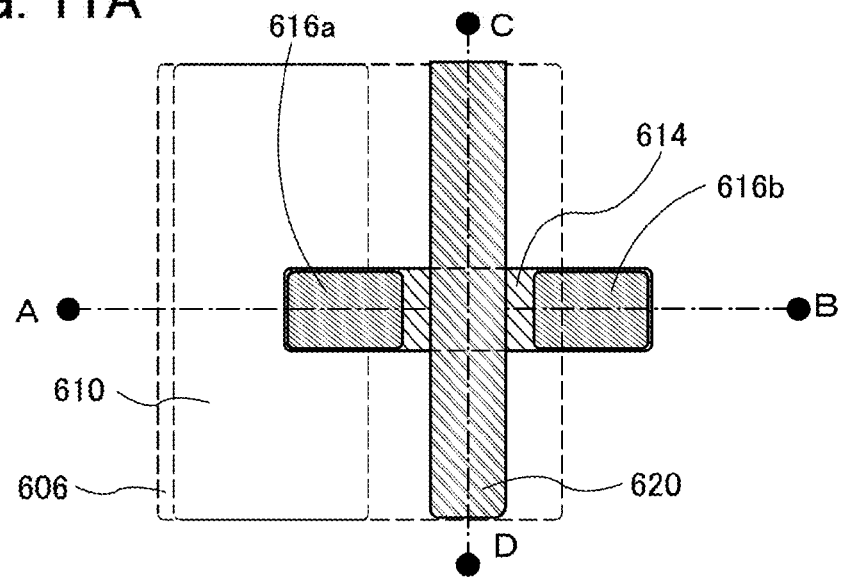
FIGS. 11A to 11C are a top view and cross-sectional views of a transistor according to one embodiment of the present invention.

FIG. 11A is the top view. FIG. 11B illustrates a cross section taken along the dashed-dotted line A-B in FIG. 11A. FIG. 11C illustrates a cross section taken along the dashed-dotted line C-D in FIG. 11A. Note that for simplification of the drawing, some components are not illustrated in the top view of FIG. 11A. In some cases, the direction of the dashed-dotted line A-B is referred to as a channel length direction, and the direction of the dashed-dotted line C-D is referred to as a channel width direction.

Figure 11B:
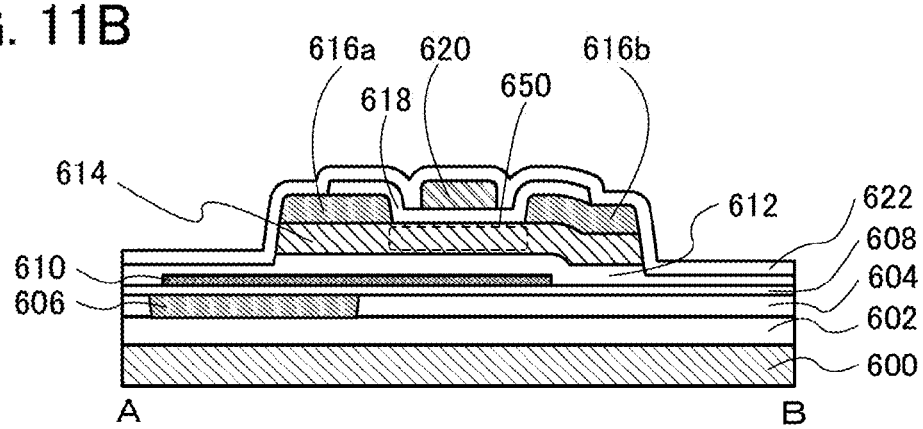
Figure 11C:
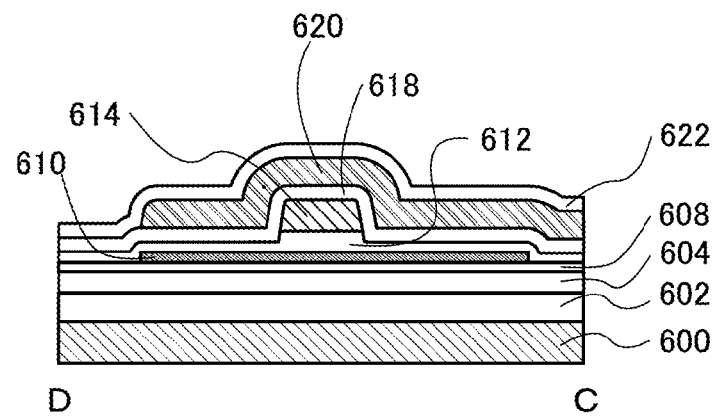

The transistor structure in FIGS. 11A and 11B differs from that in FIGS. 5A to 5C in that the gate electrode 620 does not overlap with the source electrode 616a or the drain electrode 616b as illustrated in FIGS. 11A and 11B.

Since the gate electrode 620 does not overlap with the source electrode 616a or the drain electrode 616b, parasitic capacitance is not generated between the gate electrode 620 and the source electrode 616a or between the gate electrode 620 and the drain electrode 616b, which is favorable for high-speed operation. In addition, current leakage is not generated between the gate electrode 620 and the source electrode 616a and between the gate electrode 620 and the drain electrode 616b.

Figure 12A:
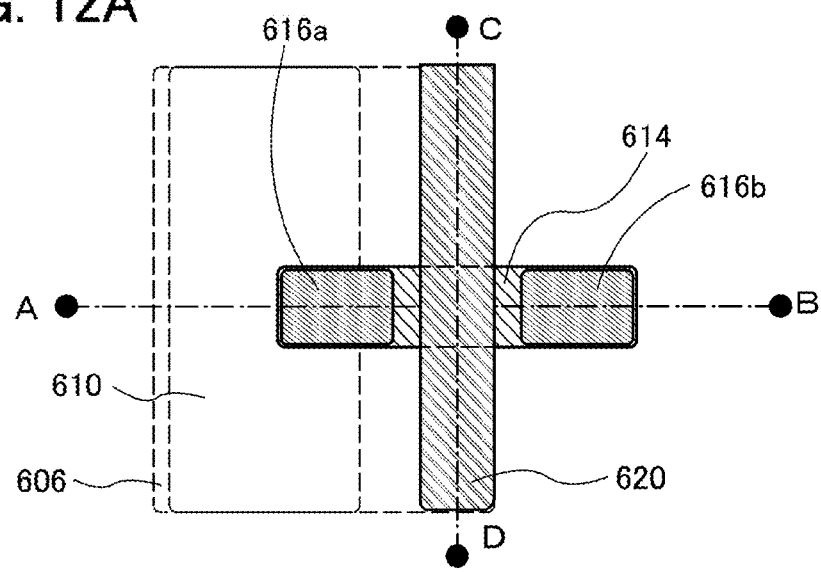
FIGS. 12A to 12C are a top view and cross-sectional views of a transistor according to one embodiment of the present invention.
Figure 12B:
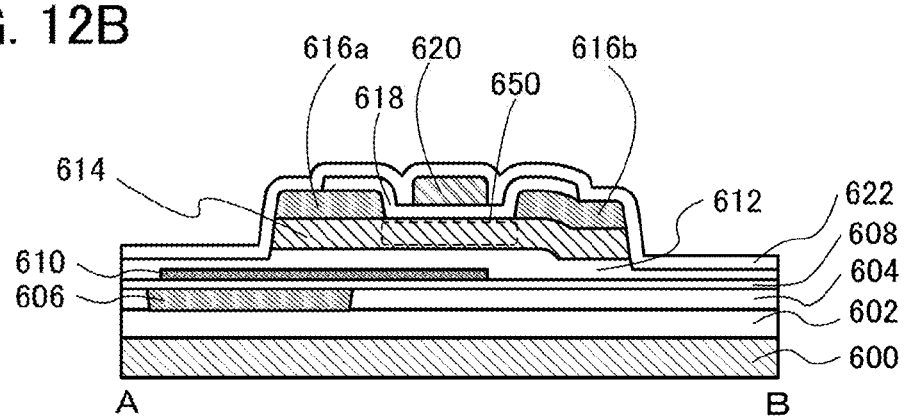
Figure 12C:
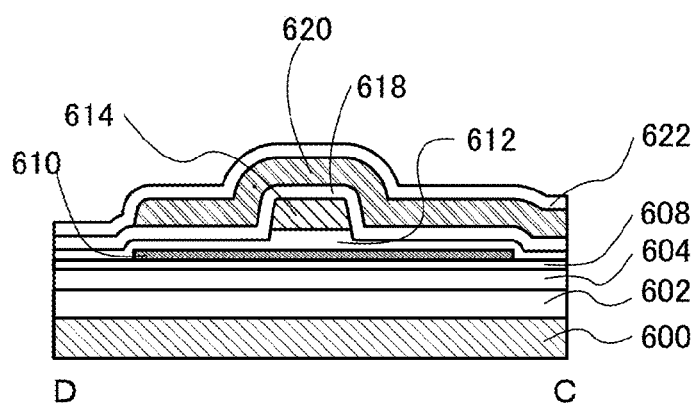

A transistor that is different from the transistor in FIGS. 11A to 11C in the placement of the electron trap layer 610 is described below with reference to FIGS. 12A to 12C. FIG. 12A is the top view. FIG. 12B illustrates a cross section taken along the dashed-dotted line A-B in FIG. 12A. FIG. 12C illustrates a cross section taken along the dashed-dotted line C-D in FIG. 12A. Note that for simplification of the drawing, some components are not illustrated in the top view of FIG. 12A. In some cases, the direction of the dashed-dotted line A-B is referred to as a channel length direction, and the direction of the dashed-dotted line C-D is referred to as a channel width direction.

The transistor in FIGS. 12A and 12B is the same as the transistor in FIGS. 11A and 11B in that the electron trap layer 610 overlaps with the gate electrode 620, but is different from the transistor in FIGS. 11A and 11B in that an end of the gate electrode 620 is aligned with an end of the electron trap layer 610, as illustrated in FIGS. 12A and 12B.

In the transistor in FIGS. 12A and 12B, like the transistor in FIGS. 11A and 11B, the gate electrode 620 does not overlap with the source electrode 616a or the drain electrode 616b, and thus parasitic capacitance is not generated between the gate electrode 620 and the source electrode 616a or between the gate electrode 620 and the drain electrode 616b, which is favorable for high-speed operation. In addition, this structure can also prevent current leakage between the gate electrode 620 and the source electrode 616a and between the gate electrode 620 and the drain electrode 616b.

Figure 13A:
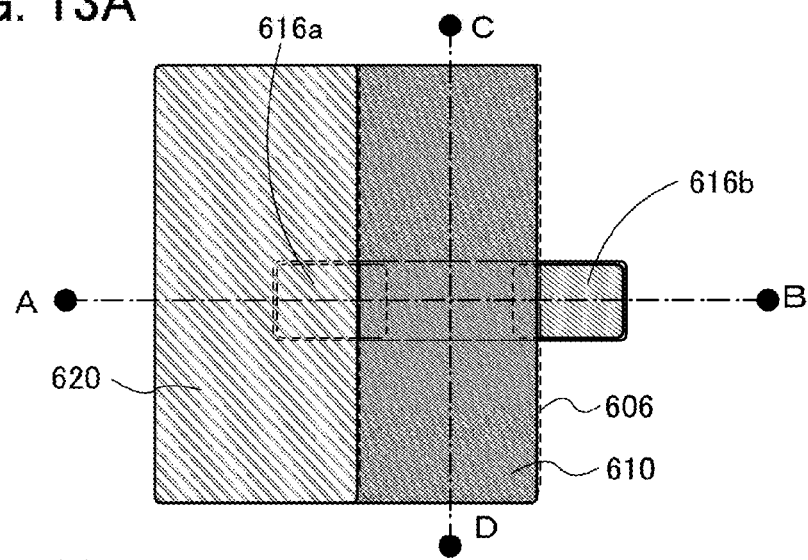
FIGS. 13A to 13C are a top view and cross-sectional views of a transistor according to one embodiment of the present invention.
Figure 13B:
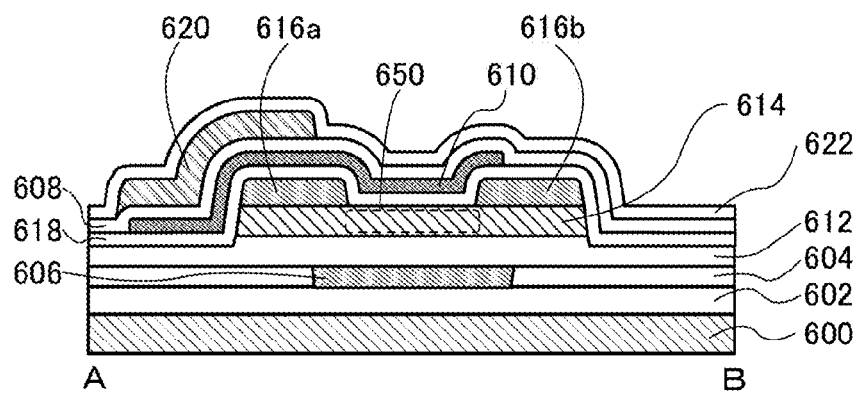
Figure 13C:
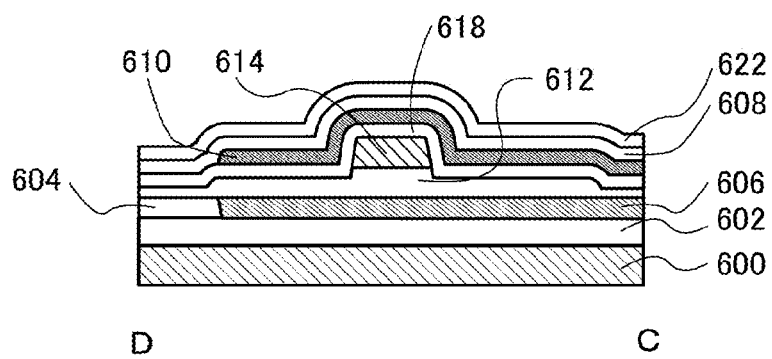

A structure of a transistor having a different structure from that in FIGS. 5A to 5C is described below with reference to FIGS. 13A to 13C. FIG. 13A is the top view. FIG. 13B illustrates a cross section taken along the dashed-dotted line A-B in FIG. 13A. FIG. 13C illustrates a cross section taken along the dashed-dotted line C-D in FIG. 13A. Note that for simplification of the drawing, some components are not illustrated in the top view of FIG. 13A. In some cases, the direction of the dashed-dotted line A-B is referred to as a channel length direction, and the direction of the dashed-dotted line C-D is referred to as a channel width direction.

The transistor in FIGS. 13A to 13C includes the insulator 602 over the substrate 600; the insulator 604 over the insulator 602; the gate electrode 606 embedded in the insulator 604; the insulator 612 over the insulator 604 and the gate electrode 606; the oxide semiconductor 614 over the insulator 612; the source electrode 616a and the drain electrode 616b over the oxide semiconductor 614; the gate insulator 618 over the insulator 612, the oxide semiconductor 614, the source electrode 616a, and the drain electrode 616b; the electron trap layer 610 over the gate insulator 618; the insulator 608 over the electron trap layer 610 and the gate insulator 618; the gate electrode 620 over the insulator 608; and the insulator 622 over the gate electrode 620 and the insulator 608.

The oxide semiconductor 614 includes a channel formation region 650. The channel formation region 650 overlaps with the electron trap layer 610 with the gate insulator 618 interposed therebetween. The gate electrode 620 overlaps with the electron trap layer 610 with the insulator 608 interposed therebetween and does not overlap with the channel formation region 650.

The transistor in FIGS. 13A to 13C differs from the transistor in FIGS. 5A to 5C in that to inject electrons into the electron trap layer 610, a voltage is applied to the gate electrode 620. Electrons are injected into the electron trap layer 610 by voltage application to the gate electrode 620, and the threshold voltage of the transistor is controlled accordingly. The voltage application to the gate electrode 620 does not cause deterioration of the channel formation region 650 and the gate insulator 618 that overlaps with the channel formation region 650.

For the operation principle of this transistor, refer to the description of the transistor in Embodiment 1 and FIGS. 5A to 5C.

This embodiment describes one embodiment of the present invention. Other embodiments each describe another embodiment of the present invention. Note that one embodiment of the present invention is not limited to them. That is, various embodiments of the invention are described in this embodiment and the other embodiments, and one embodiment of the present invention is not limited to a particular embodiment. For example, an example in which a channel formation region of a transistor includes an oxide semiconductor, an example in which a transistor includes an oxide semiconductor such as the oxide semiconductor 614, and the like are described as one embodiment of the present invention; however, one embodiment of the present invention is not limited to these examples. Various transistors of embodiments of the present invention may include various semiconductors. Alternatively, various transistors of embodiments of the present invention may include, for example, at least one of silicon, germanium, silicon germanium, silicon carbide, gallium arsenide, aluminum gallium arsenide, indium phosphide, gallium nitride, and an organic semiconductor. As another example, various transistors of embodiments of the present invention do not necessarily include an oxide semiconductor.

This embodiment can be combined with any of the other embodiments in this specification as appropriate.

Embodiment 3

This embodiment describes a method for forming the transistor in FIGS. 5A to 5C, which is described in Embodiment 2, with reference to FIGS. 14A to 14C and FIGS. 15A to 15C.

A cross section taken along the dashed-dotted line A-B in FIG. 5A is illustrated in the left side of each of FIGS. 14A to 14C and FIGS. 15A to 15C. A cross section taken along the dashed-dotted line C-D in FIG. 5A is illustrated in the right side of each of FIGS. 14A to 14C and FIGS. 15A to 15C.

The insulator 602 is formed over the substrate 600. As the substrate 600, a single material semiconductor substrate of silicon, germanium, or the like or a compound semiconductor substrate of silicon carbide, silicon germanium, gallium arsenide, indium phosphide, zinc oxide, gallium oxide, or the like can be used, for example. Alternatively, an insulator substrate made of quartz, glass, or the like may be used. For the insulator 602, a silicon oxide film, a silicon oxynitride film, a silicon nitride oxide film, a silicon nitride film, an aluminum oxide film, an aluminum nitride film, a hafnium oxide film, or the like can be used. Examples of the film formation method include a thermal oxidation method, a CVD method, a sputtering method, an ALD method, a plasma oxidation method, and a plasma nitridation method.

The insulator 604 is formed over the insulator 602. An opening is formed in a part of the insulator 604. The gate electrode 606 is embedded in the opening (see FIG. 14A). To form the opening in the insulator 604, a resist mask is formed by a photolithography method and an unnecessary portion of the insulator is removed by dry etching. The insulator 604 can be formed using a film and a film formation method that are similar to those used to form the insulator 602 described above. The gate electrode 606 can be formed by a sputtering method, a CVD method, an MBE method, a PLD method, an ALD method, a plating method, or the like. The gate electrode 606 can be formed using tantalum, tungsten, titanium, molybdenum, aluminum, copper, a molybdenum-tungsten alloy, or the like. Alternatively, the gate electrode 606 can be a multilayer film selected as appropriate from tantalum nitride, tungsten nitride, titanium nitride, and the like. The gate electrode 606 may be embedded in the opening by a chemical mechanical polishing (CMP).

The insulator 608 is formed over the gate electrode 606 and the insulator 604. The insulator 608 can be formed using a film and a film formation method that are similar to those used to form the insulator 602 described above. Next, a conductor or a semiconductor to be the electron trap layer 610 is formed over the insulator 608. A resist mask is formed over the conductor or the semiconductor to be the electron trap layer 610 by a photolithography method to overlap with the gate electrode 606. An unnecessary portion of the conductor or the semiconductor is removed by dry etching to form the electron trap layer 610. Then, the insulator 612 is formed over the electron trap layer 610 and the insulator 608 (see FIG. 14B).

The electron trap layer 610 can be formed using a conductor or a semiconductor. The conductor is formed by a sputtering method, a CVD method, an MBE method, a PLD method, an ALD method, or the like. The conductor can be formed using tantalum, tungsten, titanium, molybdenum, aluminum, copper, a molybdenum-tungsten alloy, or the like. Alternatively, the conductor can be a multilayer film selected as appropriate from tantalum nitride, tungsten nitride, titanium nitride, or the like that allows less oxygen to pass therethrough. The semiconductor is formed by a sputtering method, a CVD method, an MBE method, a PLD method, an ALD method, or the like. The semiconductor can be formed using polycrystalline silicon, microcrystalline silicon, amorphous silicon, an oxide semiconductor, or the like.

The insulator 612 can be formed using a film and a film formation method that are similar to those used to form the insulator 602 described above. Alternatively, the insulator 612 may be formed using an insulator containing excess oxygen.

Figure 14A:
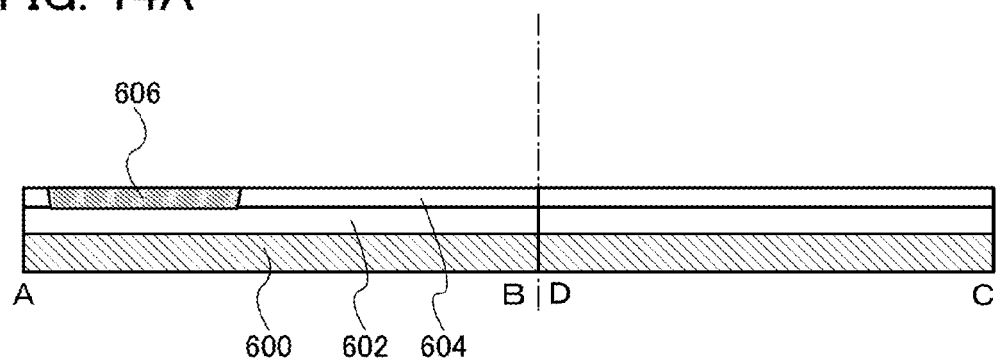
FIGS. 14A to 14C illustrate a method for manufacturing a transistor according to one embodiment of the present invention.
Figure 14B:
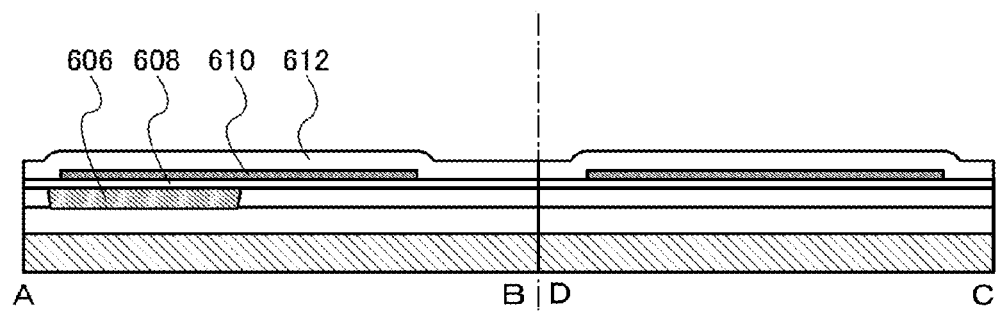
Figure 14C:
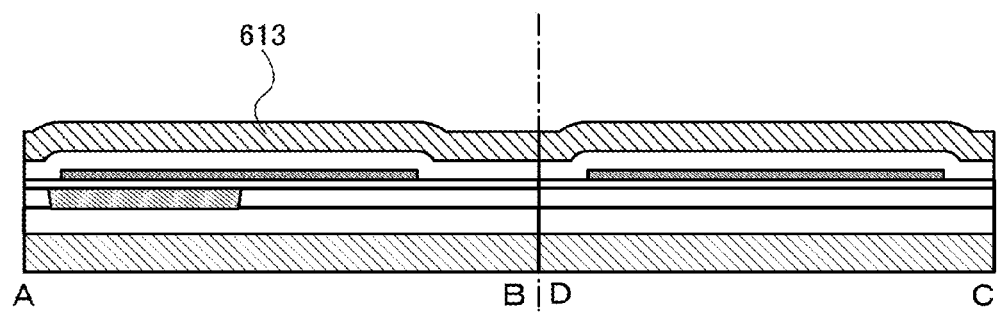

An oxide semiconductor 613 is formed over the insulator 612 and then is subjected to heat treatment (see FIG. 14C). The oxide semiconductor 613 is formed by a sputtering method, a CVD method, an MBE method, a PLD method, an ALD method, or the like. The heat treatment may be performed at a temperature higher than or equal to 250° C. and lower than or equal to 650° C., preferably higher than or equal to 300° C. and lower than or equal to 500° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The heat treatment can increase the crystallinity of the oxide semiconductor 613 or remove impurities such as hydrogen or water, for example.

A conductor is formed over the oxide semiconductor 613. A resist pattern is formed over a region to be a channel formation region in the oxide semiconductor 613 by a photolithography method. A conductor is removed by dry etching to form a conductor 615 (see FIG. 15A). The conductor 615 can be formed using a film and a film formation method that are similar to those used to form the gate electrode 606 described above.

A resist pattern is formed over the conductor 615 and the oxide semiconductor 613 by a photolithography method. An unnecessary portion of the oxide semiconductor 613 is removed by dry etching to form the island shape oxide semiconductor 614. At this step, the source electrode 616a and the drain electrode 616b are formed (see FIG. 15B).

The gate insulator 618 is formed over the insulator 612, the source electrode 616a, the drain electrode 616b, and the oxide semiconductor 614. The gate insulator 618 can be formed using a film and a film formation method that are similar to those used to form the insulator 602 described above.

The gate electrode 620 is formed over the gate insulator 618. The gate electrode 620 can be formed using a film and a film formation method that are similar to those used to form the gate electrode 606 described above. To form the gate electrode 620, a conductor to be the gate electrode 620 is formed over the gate insulator 618. A resist mask is formed over the conductor by a photolithography method, and then an unnecessary portion of the conductor is removed by dry etching. Next, a resist mask is formed over the gate electrode 620 and the gate insulator 618 by a photolithography method, and an unnecessary portion of the gate insulator 618 is removed by dry etching. The gate insulator 618 is not necessarily removed.

Figure 15A:
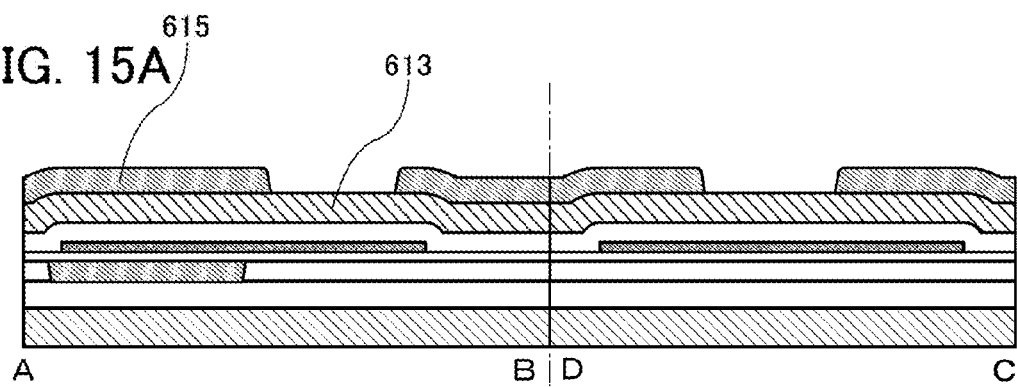
FIGS. 15A to 15C illustrate a method for manufacturing a transistor according to one embodiment of the present invention.
Figure 15B:
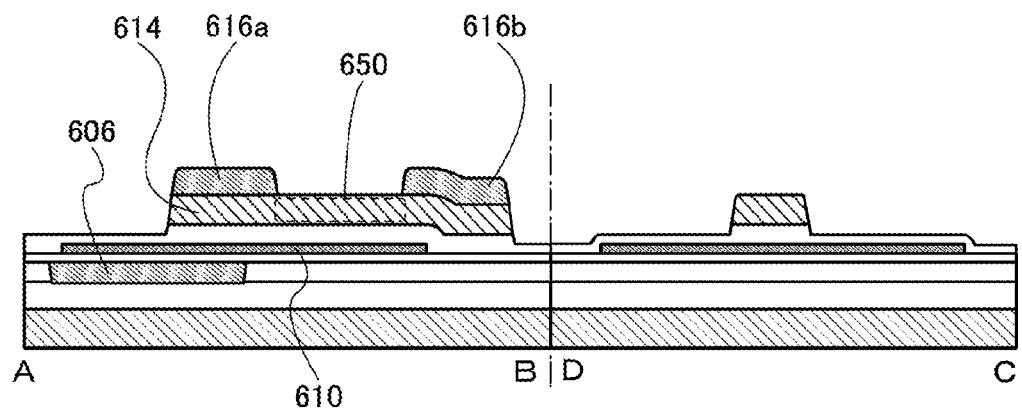
Figure 15C:
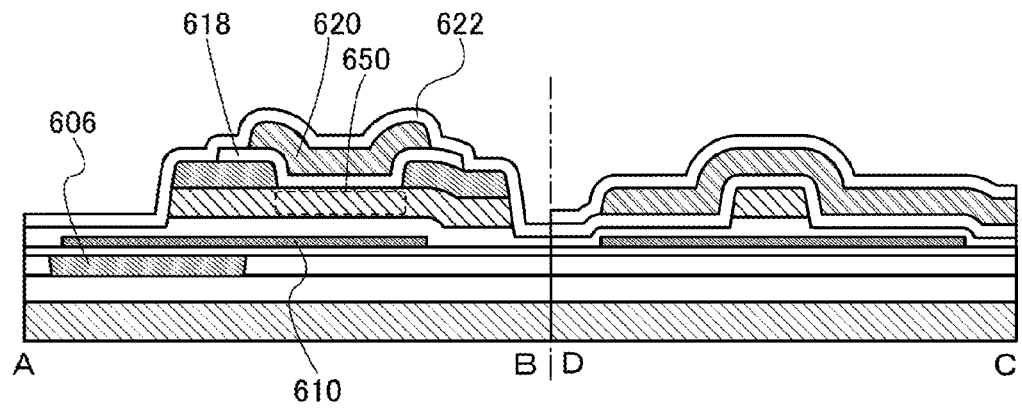

The insulator 622 is formed over the insulator 612, the source electrode 616a, the drain electrode 616b, the gate insulator 618, and the gate electrode 620 (see FIG. 15C). The insulator 622 can be formed using a film and a film formation method that are similar to those used to form the insulator 602 described above. It is particularly preferable that the insulator 622 be formed using an aluminum oxide film or the like that allows less hydrogen or oxygen to pass therethrough.

The transistor of Embodiment 1 can be manufactured through the above manufacturing steps.

Embodiment 4

A structure of an oxide semiconductor is described in this embodiment.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, it is difficult to clearly observe a boundary between pellets, that is, a grain boundary. Thus, in the CAAC-OS, a reduction in electron mobility due to the grain boundary is less likely to occur.

Figure 16A:
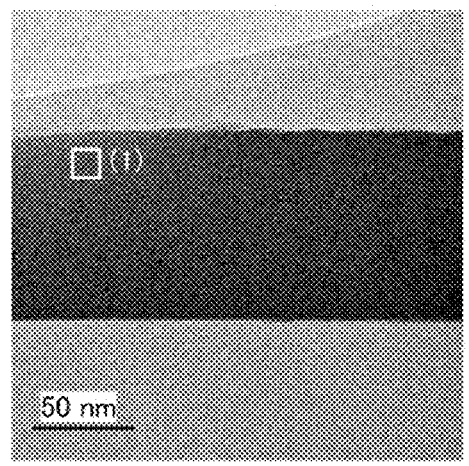
FIGS. 16A to 16D are Cs-corrected high-resolution TEM images of a cross section of a CAAC-OS and a cross-sectional schematic view of the CAAC-OS.

A CAAC-OS observed with TEM is described below. FIG. 16A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 16B:
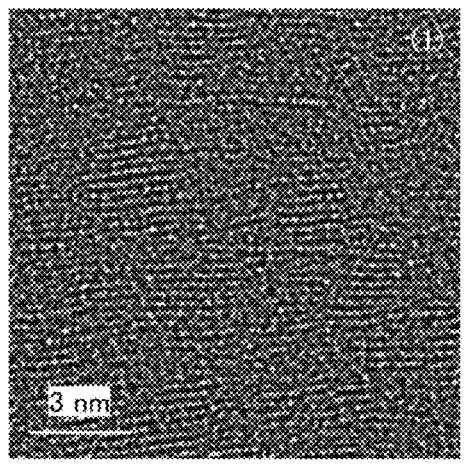

FIG. 16B is an enlarged Cs-corrected high-resolution TEM image of a region (1) in FIG. 16A. FIG. 16B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 16C:
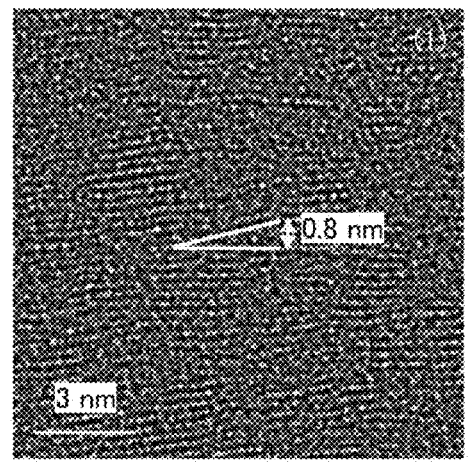

As shown in FIG. 16B, the CAAC-OS has a characteristic atomic arrangement. The characteristic atomic arrangement is denoted by an auxiliary line in FIG. 16C. FIGS. 16B and 16C prove that the size of a pellet is approximately 1 nm to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 16D:
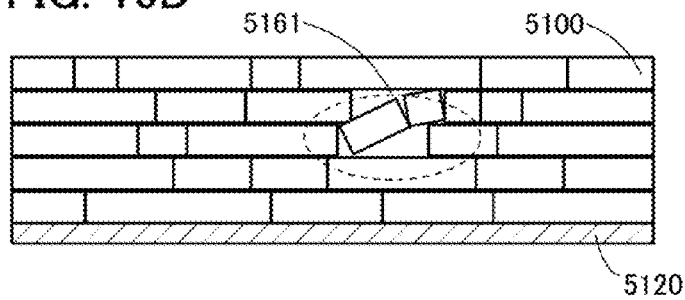

Here, according to the Cs-corrected high-resolution TEM images, the schematic arrangement of pellets 5100 of a CAAC-OS over a substrate 5120 is illustrated by such a structure in which bricks or blocks are stacked (see FIG. 16D). The part in which the pellets are tilted as observed in FIG. 16C corresponds to a region 5161 shown in FIG. 16D.

Figure 17A:
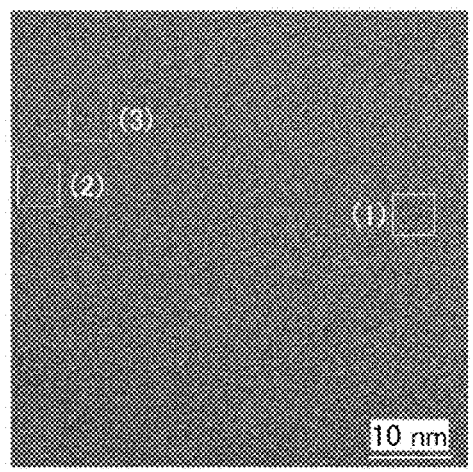
FIGS. 17A to 17D are Cs-corrected high-resolution TEM images of a plane of a CAAC-OS.
Figure 17B:
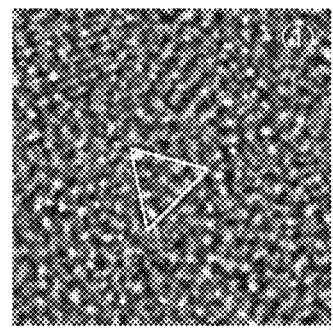
Figure 17C:
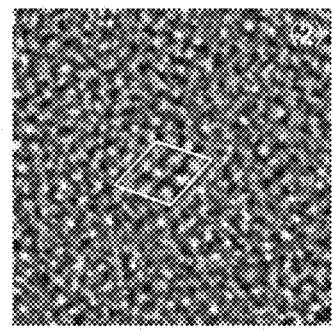
Figure 17D:
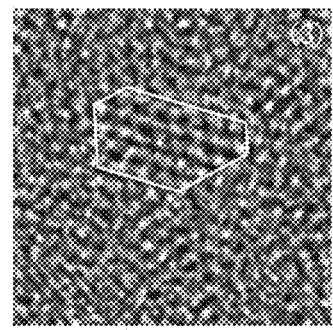

FIG. 17A shows a Cs-corrected high-resolution TEM image of a plane of the CAAC-OS observed from a direction substantially perpendicular to the sample surface. FIGS. 17B, 17C, and 17D are enlarged Cs-corrected high-resolution TEM images of regions (1), (2), and (3) in FIG. 17A, respectively. FIGS. 17B, 17C, and 17D indicate that metal atoms are arranged in a triangular, quadrangular, or hexagonal configuration in a pellet. However, there is no regularity of arrangement of metal atoms between different pellets.

Figure 18A:
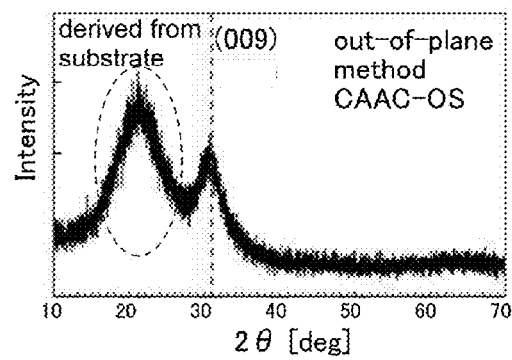
FIGS. 18A to 18C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 18A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 18B:
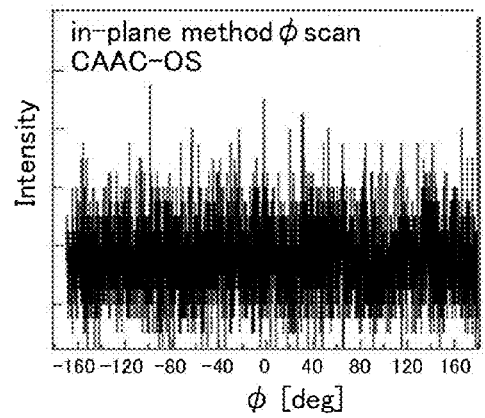
Figure 18C:
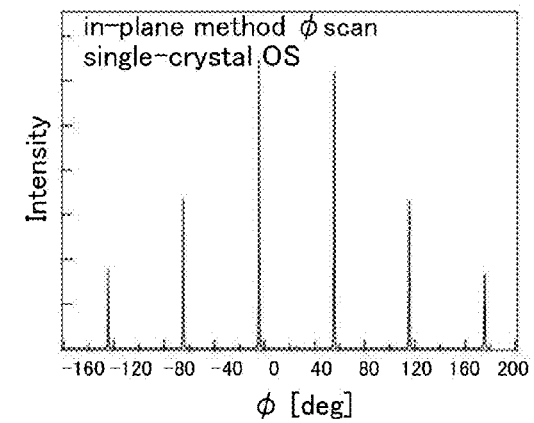

On the other hand, in structural analysis of the CAAC-OS by an in-plane method in which an X-ray beam is incident on a sample in a direction substantially perpendicular to the c-axis, a peak appears when $2\theta$ is around 56°. This peak is attributed to the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 18B, a peak is not clearly observed. In contrast, in the case of a single crystal oxide semiconductor of $InGaZnO_4$, when $\phi$ scan is performed with $2\theta$ fixed at around 56°, as shown in FIG. 18C, six peaks that are derived from crystal planes equivalent to the (110) plane are observed. Accordingly, the structural analysis using XRD shows that the directions of a-axes and b-axes are irregularly oriented in the CAAC-OS.

Figure 19A:
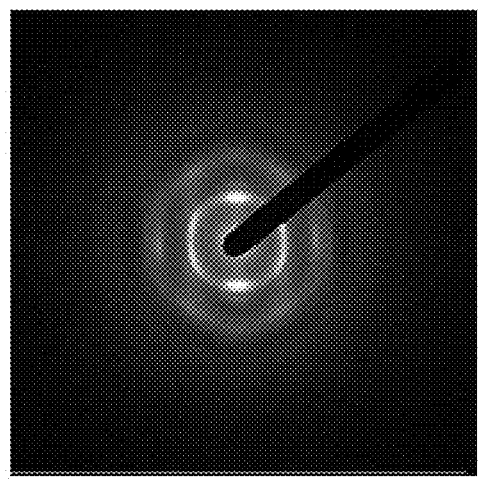
FIGS. 19A and 19B show electron diffraction patterns of a CAAC-OS.
Figure 19B:
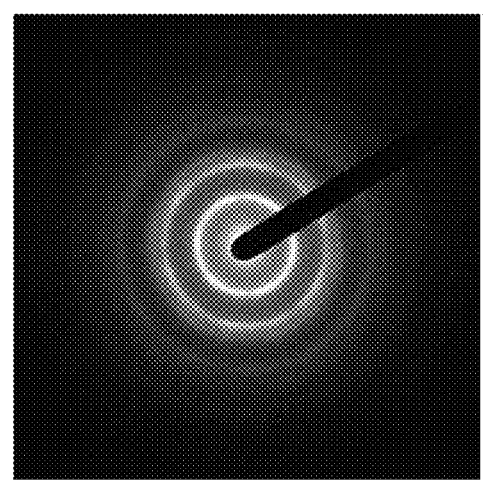

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 19A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 19B shows a diffraction pattern obtained in such a manner that an electron beam with a probe diameter of 300 nm is incident on the same sample in a direction perpendicular to the sample surface. As shown in FIG. 19B, a ring-like diffraction pattern is observed. Thus, the electron diffraction also indicates that the a-axes and b-axes of the pellets included in the CAAC-OS do not have regular alignment. The first ring in FIG. 19B is considered to be derived from the (010) plane, the (100) plane, and the like of the $InGaZnO_4$ crystal. The second ring in FIG. 19B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which it is difficult to observe a crystal part clearly in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, it is difficult to observe a grain boundary clearly in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak that shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

An a-like OS has a structure between those of the nc-OS and the amorphous oxide semiconductor.

In a high-resolution TEM image of the a-like OS, a void may be observed. Furthermore, in the high-resolution TEM image, there are a region where a crystal part is clearly observed and a region in which it is difficult to observe a crystal part.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

FIG. 20 shows change in the average size of crystal parts (at 22 points to 45 points) in each sample. Note that the crystal part size corresponds to the length of a lattice fringe. FIG. 20 indicates that the crystal part size in the a-like OS increases with an increase in the cumulative electron dose. Specifically, as shown by (1) in FIG. 20, a crystal part of approximately 1.2 nm (also referred to as an initial nucleus) at the start of TEM observation grows to a size of approximately 2.6 nm at a cumulative electron dose of $4.2\times10^8$ $e^-/nm^2$. In contrast, the crystal part size in the nc-OS and the CAAC-OS shows little change from the start of electron irradiation to a cumulative electron dose of $4.2\times10^8$ $e^-/nm^2$. Specifically, as shown by (2) and (3) in FIG. 20, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be stacked films including two or more of an amorphous oxide semiconductor, an a-like OS, an nc-OS, and a CAAC-OS, for example.

Embodiment 5

This embodiment describes an example of a semiconductor device using the transistor described in Embodiment 1.

Figure 21A:
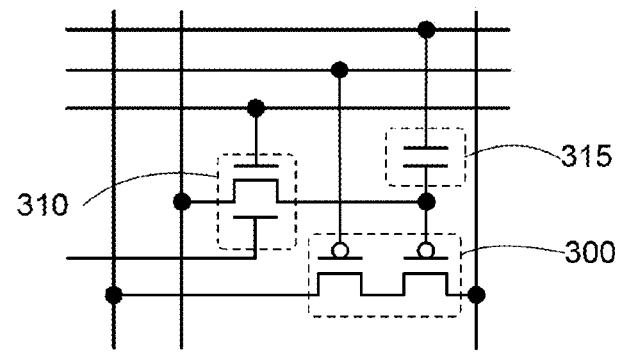
FIGS. 21A and 21B are a circuit diagram and a cross-sectional view of a semiconductor device according to one embodiment of the present invention.
Figure 21B:
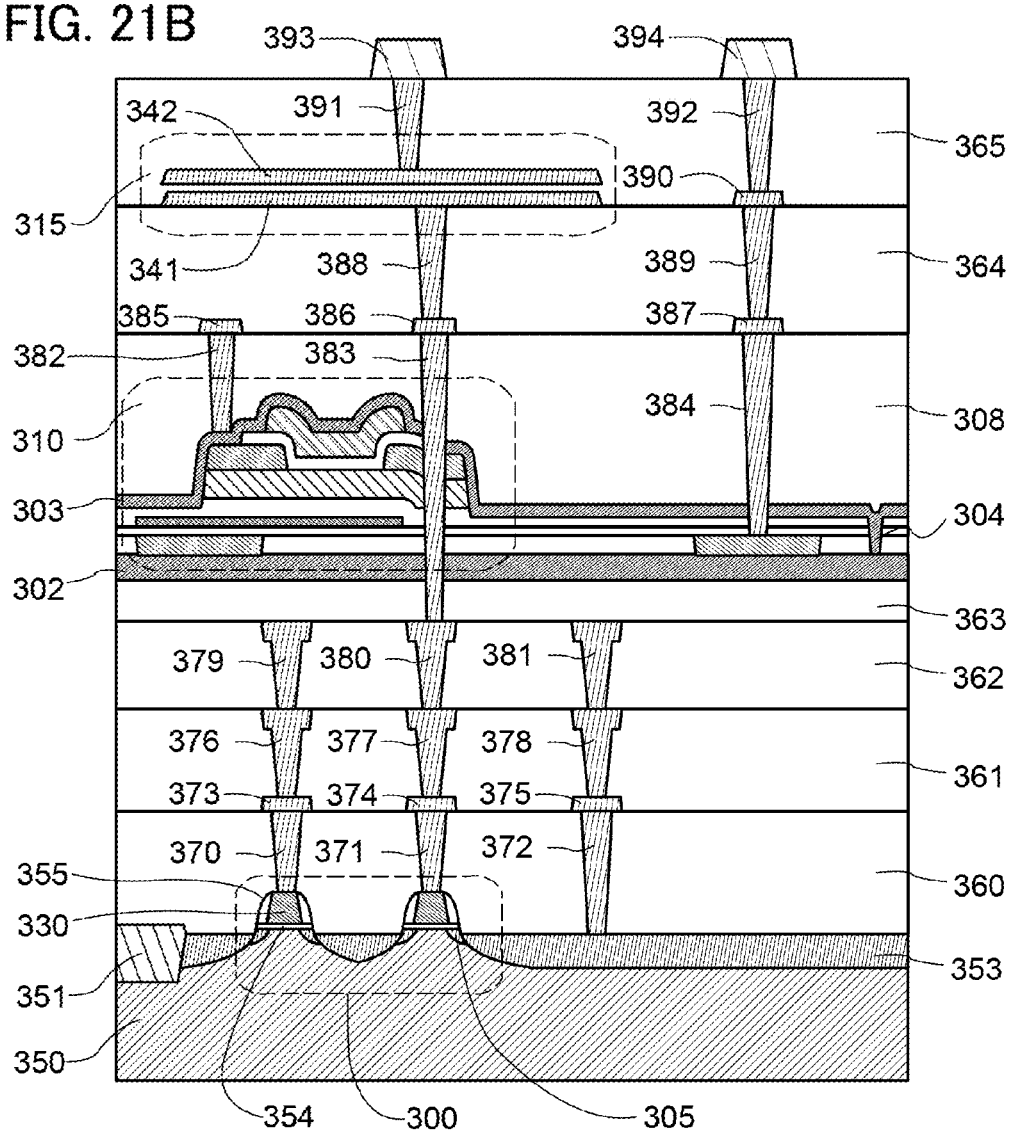

FIG. 21A illustrates a circuit example of a memory device. FIG. 21B is a cross-sectional view of the memory device.

As the substrate 350, a single crystal semiconductor substrate or a polycrystalline semiconductor substrate made of silicon, silicon carbide, or the like; a compound semiconductor substrate made of silicon germanium and the like; a silicon-on-insulator (SOI) substrate; or the like can be used.

A transistor 300 is formed over the substrate 350. The transistor 300 can be a planar transistor including a sidewall 355 as illustrated in FIG. 21B. The transistor is subjected to element isolation by forming a shallow trench isolation (STI) 351. Alternatively, the transistor 300 may be a fin transistor. Alternatively, the transistor 300 may be either a p-channel transistor or an n-channel transistor. Alternatively, both of them may be used.

Although a channel formation region of the transistor 300 includes a single crystal silicon in this embodiment, a single crystal silicon is not necessarily used for the channel formation region. For example, an oxide semiconductor may be used for the channel formation region. Furthermore, as an insulator 354 having a function as a gate insulator, silicon oxide obtained by thermally oxidizing a single crystal silicon can be used. Alternatively, a silicon oxide film, a silicon oxynitride film, a silicon nitride oxide film, a silicon nitride film, an aluminum oxide film, an aluminum nitride film, a hafnium oxide film, or the like can be used. Examples of the film formation method include a thermal oxidation method, a CVD method, a sputtering method, an ALD method, a plasma oxidation method, and a plasma nitridation method. Alternatively, stacked films selected as appropriate from any of the above films may be used.

An insulator 360 is formed over the transistor 300, the STI 351, and a diffusion layer 353, and CMP is performed to planarize a surface of the insulator 360. For the insulator 360, a silicon oxide film, a silicon oxynitride film, a silicon nitride oxide film, a silicon nitride film, an aluminum oxide film, an aluminum nitride film, a hafnium oxide film, or the like can be used. Examples of the film formation method include a thermal oxidation method, a CVD method, a sputtering method, an ALD method, a plasma oxidation method, and a plasma nitridation method. For the planarization, other treatment may be employed instead of CMP, and CMP may be combined with etching (dry etching or wet etching), plasma treatment, or the like.

Contact holes that reach the top surfaces of the gate electrodes 330 of the transistor 300 and a contact hole that reaches the top surface of the diffusion layer 353 are formed in the insulator 360, a conductor is embedded in the contact holes, and CMP is performed until the top surface of the insulator 360 is exposed, so that a plug 370, a plug 371, and a plug 372 are formed. The plugs 370, 371, and 372 can be formed using tantalum, tungsten, titanium, molybdenum, aluminum, copper, a molybdenum-tungsten alloy, tantalum nitride, tungsten nitride, or titanium nitride, for example. Alternatively, stacked films selected as appropriate from the above films may be formed. Examples of the film formation method include a sputtering method, a CVD method, an ALD method, and a plating method. The stacked films may be formed by using two or more methods selected from the film formation methods.

Next, a conductor is formed over the insulator 360, and a wiring layer 373, a wiring layer 374, and a wiring layer 375 are formed. The wiring layers 373, 374, and 375 can be formed using a film and a film formation method that are similar to those used to form the plugs 370, 371, and 372 described above.

An insulator 361 is formed over the insulator 360 and the wiring layers 373, 374, and 375, and CMP is performed to planarize a surface of the insulator 361. The insulator 361 can be formed using a film and a film formation method that are similar to those used to form the insulator 360 described above.

Respective contact holes that reach the top surfaces of the wiring layers 373, 374, and 375 and grooves are formed in the insulator 361, and a conductor is embedded in the contact holes and the grooves. Then, CMP is performed until the top surface of the insulator 361 is exposed, so that a wiring layer 376, a wiring layer 377, and a wiring layer 378 that also serve as plugs are formed. The wiring layers 376, 377, and 378 can be formed using a film and a film formation method that are similar to those used to form the plugs 370, 371, and 372 described above.

An insulator 362 is formed over the insulator 361 and the wiring layers 376, 377, and 378, and a wiring layer 379, a wiring layer 380, and a wiring layer 381 that also serve as plugs are formed by a method similar to that used to form the insulator 361. The insulator 362 can be formed using a film and a film formation method that are similar to those used to form the insulator 360 described above. The wiring layers 379, 380, and 381 can be formed using a film and a film formation method that are similar to those used to form the plugs 370, 371, and 372 described above. The wiring layers that also serve as plugs can be formed by repeating the aforementioned method as necessary, so that a highly integrated semiconductor device can be manufactured.

An insulator 363 is formed over the insulator 362 and the wiring layers 379, 380, and 381 with the use of a film and a film formation method that are similar to those used to form the insulator 360 described above. It is preferable that the insulator 363 hardly allow hydrogen to pass therethrough. Note that the insulator 363 is not necessarily formed.

Next, the insulator 302 is formed over the insulator 363. The insulator 302 can be formed using a film and a film formation method that are similar to those used to form the insulator 360 described above. It is preferable that the insulator 302 hardly allow oxygen to pass therethrough. For example, aluminum oxide may be used for the insulator 302.

Then, a transistor 310 is formed by the method described in Embodiment 3. Next, the insulator 303 is deposited over the transistor 310. The insulator 303 can be formed using a film and a film formation method that are similar to those used to form the insulator 360 described above. It is preferable that the insulator 303 hardly allow oxygen to pass therethrough. For example, aluminum oxide may be used for the insulator 303.

Hydrogen in an insulator provided in the vicinity of the channel formation region of the transistor 300 terminates dangling bonds of silicon, and the reliability of the transistor 300 can be improved accordingly. In contrast, hydrogen in the insulator provided in the vicinity of the transistor 310 and the like becomes a factor generating a carrier in the oxide semiconductor. This hydrogen may reduce the reliability of the transistor 310. Thus, in the case where the transistor using an oxide semiconductor is provided over the transistor using a silicon-based semiconductor, it is preferable that the insulator 302 that blocks hydrogen be provided between the transistors. The hydrogen is confined below the insulator 302, and the reliability of the transistor 300 can be improved accordingly. In addition, hydrogen diffusion from under to over the insulator 302 can be prevented, and the reliability of the transistor 300 can be improved accordingly. It is preferable to form the insulator 303 over the transistor 310 because oxygen can be prevented from diffusing in the oxide semiconductor. It is more preferable that the transistor 310 be enclosed by the insulators 302 and 303 for sealing while a contact hole 304 connects the insulators 302 and 303 as illustrated in FIG. 21B.

Next, the insulator 308 is formed, and a plug 382, a plug 383, and a plug 384 are formed. A wiring layer 385, a wiring layer 386, and a wiring layer 387 are formed over the plug 382, the plug 383, and the plug 384, respectively. The plugs 382, 383, and 384 and the wiring layers 385, 386, and 387 can be formed using a film and a film formation method that are similar to those used to form the plugs 370, 371, and 372. It is preferable that the plugs 382, 383, and 384 and the wiring layers 385, 386, and 387 hardly allow hydrogen to pass therethrough. For example, the plugs 382, 383, and 384 and the wiring layers 385, 386, and 387 may have a two-layer structure in which a tungsten layer is formed over a titanium nitride layer.

Then, an insulator 364 is formed over the insulator 308 and the wiring layers 385, 386, and 387, and CMP is performed to planarize a surface of the insulator 364. The insulator 364 can be formed using a film and a film formation method that are similar to those used to form the insulator 360 described above.

Contact holes that reach the top surfaces of the wiring layers 386 and 387 are formed in the insulator 364, and a conductor is embedded in the contact holes. Then, CMP is performed until the top surface of the insulator 364 is exposed, so that a plug 388 and a plug 389 are formed. The plugs 388 and 389 can be formed using a film and a film formation method that are similar to those used to form the plugs 370, 371, and 372 described above.

Then, a conductor is formed over the insulator 364, and one electrode 341 of a capacitor 315 and a wiring layer 390 are formed. The electrode 341 and the wiring layer 390 can be formed using a film and a film formation method that are similar to those used to form the plugs 370, 371, and 372 described above. Next, the capacitor 315 is formed such that the other electrode 342 overlaps with the one electrode 341 with an insulator interposed therebetween. After that, an insulator 365 is formed, and CMP is performed to planarize a surface of the insulator 365. The insulator 365 can be formed using a film and a film formation method that are similar to those used to form the insulator 360 described above.

A contact hole that reaches the top surface of the other electrode 342 of the capacitor 315 and a contact hole that reaches the top surface of the wiring layer 390 are formed in the insulator 365, and a conductor is embedded in the contact holes. Then, CMP is performed until the top surface of the insulator 365 is exposed, so that a plug 391 and a plug 392 are formed. The plugs 391 and 392 can be formed using a film and a film formation method that are similar to those used to form the plugs 370, 371, and 372 described above.

Next, a conductor is formed over the insulator 365, and a wiring layer 393 and a wiring layer 394 are formed. The wiring layers 393 and 394 can be formed using a film and a film formation method that are similar to those used to form the plugs 370, 371, and 372 described above.

Figure 22:
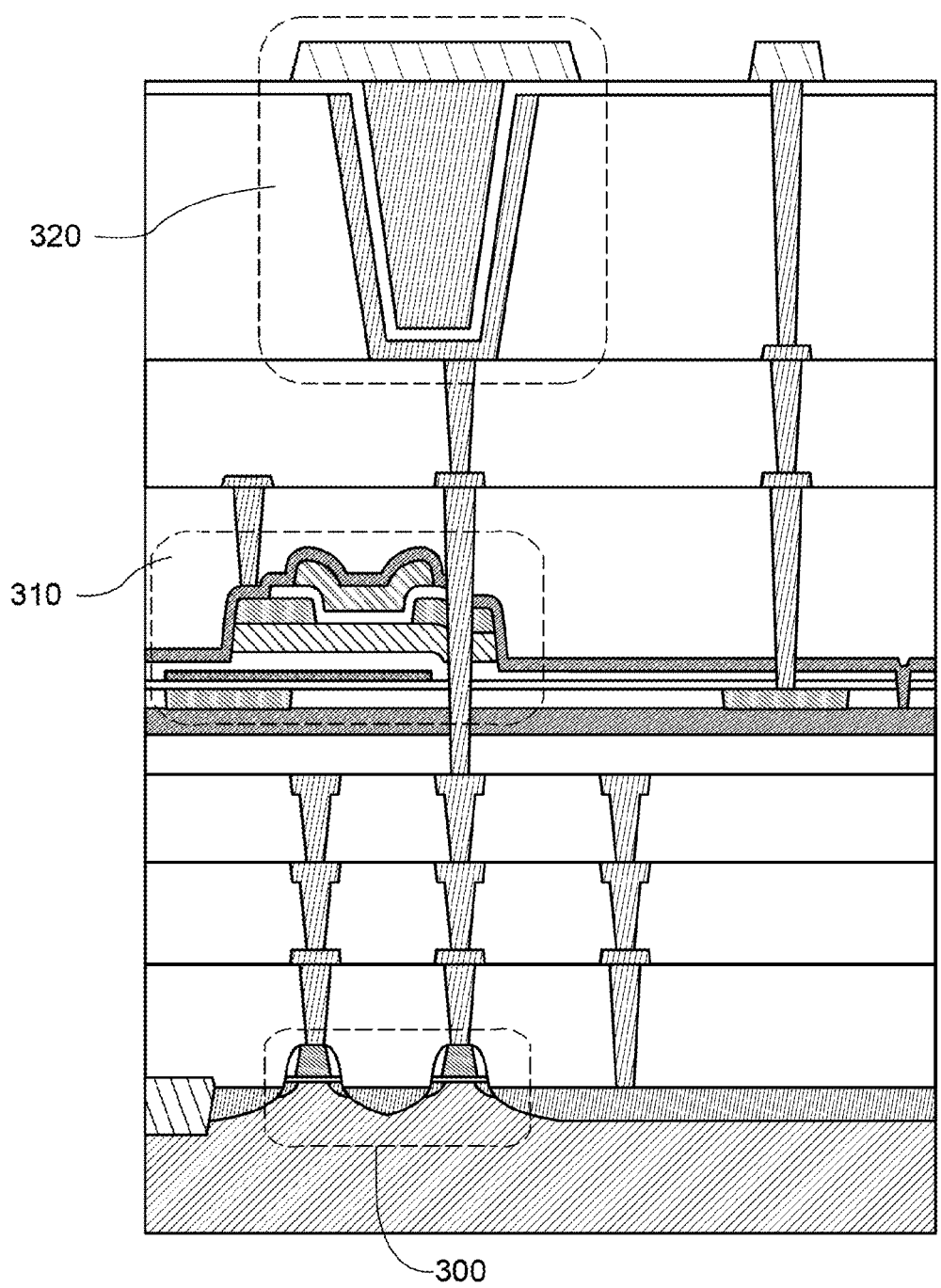
FIG. 22 is a cross-sectional view of a semiconductor device according to one embodiment of the present invention.

A cylinder capacitor 320 illustrated in FIG. 22 may be used instead of the planar capacitor 315 in FIG. 21B. The cylinder capacitor 320 is preferred to the planar capacitor 315 because it can be formed in a smaller area.

Through the above steps, the semiconductor device in one embodiment of the present invention can be manufactured.

At least part of this embodiment can be implemented in combination with any of the other embodiments described in this specification as appropriate.

Embodiment 6

<Imaging Device>

An imaging device of one embodiment of the present invention is described below.

Figure 23A:
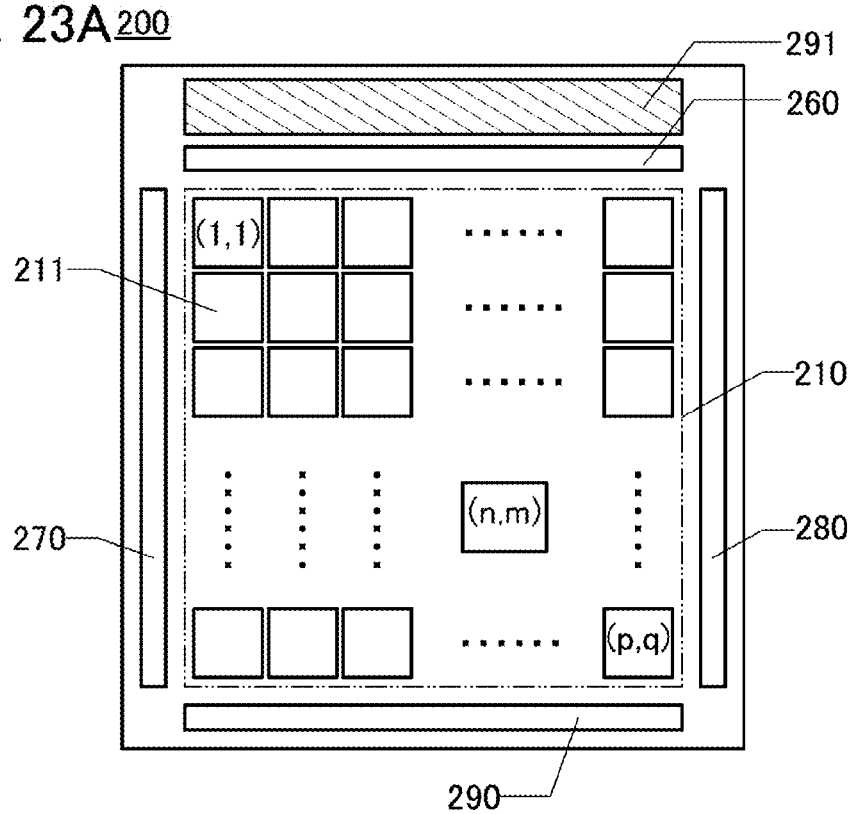
FIGS. 23A and 23B are top views of a semiconductor device according to one embodiment of the present invention.

FIG. 23A is a top view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix of p rows and q columns (p and q are each an integer of 2 or more). The peripheral circuits 260, 270, 280, and 290 are each connected to a plurality of pixels 211 and each have a function of supplying a signal for driving the plurality of pixels 211. In this specification and the like, in some cases, "a peripheral circuit" or "a driver circuit" indicate all of the peripheral circuits 260, 270, 280, and 290. For example, the peripheral circuit 260 can be regarded as part of the peripheral circuit.

In addition, the imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be provided over a substrate where the pixel portion 210 is formed. Part or the whole of the peripheral circuit may be mounted using a semiconductor device such as an IC. Note that as the peripheral circuit, one or more of the peripheral circuits 260, 270, 280, and 290 may be omitted.

Figure 23B:
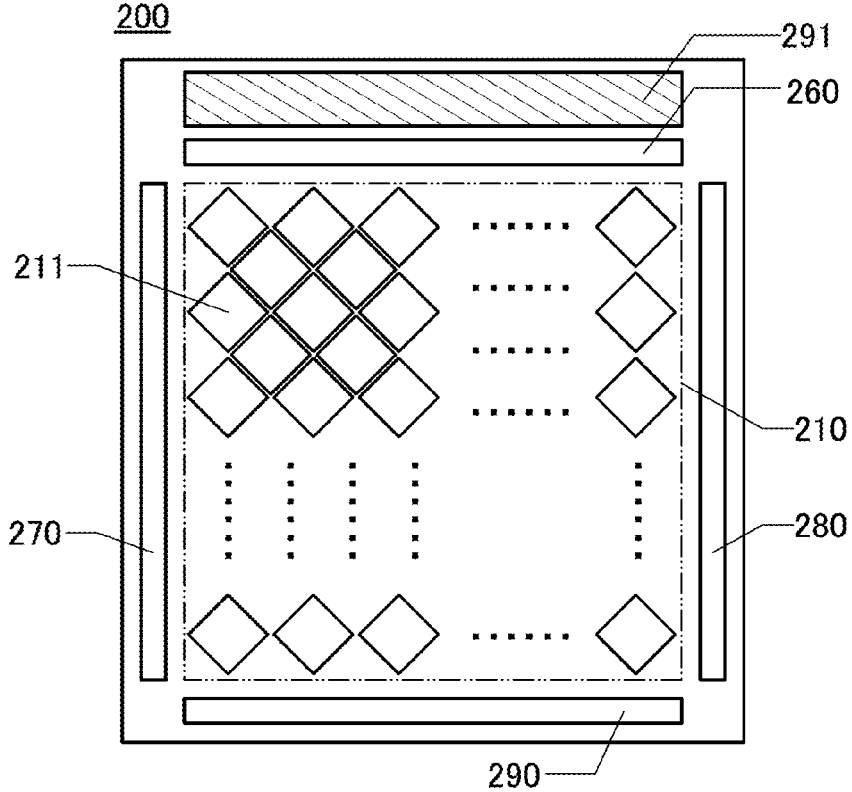

As illustrated in FIG. 23B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example 1 of Pixel>

The pixel 211 included in the imaging device 200 is formed with a plurality of subpixels 212, and each subpixel 212 is combined with a filter that transmits light with a specific wavelength band (color filter), whereby data for achieving color image display can be obtained.

Figure 24A:
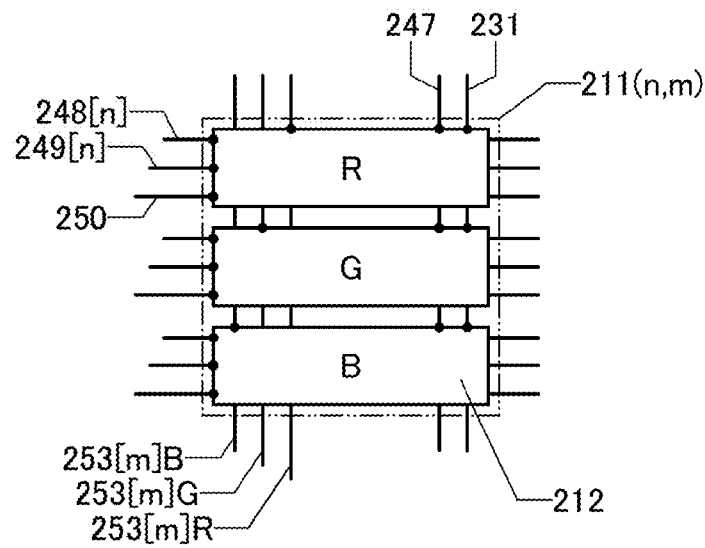
FIGS. 24A and 24B are a top view and a block diagram of a semiconductor device according to one embodiment of the present invention.

FIG. 24A is a top view showing an example of the pixel 211 with which a color image is obtained. The pixel 211 illustrated in FIG. 24A includes a subpixel 212 provided with a color filter that transmits light with a red (R) wavelength band (also referred to as a subpixel 212R), a subpixel 212 provided with a color filter that transmits light with a green (G) wavelength band (also referred to as a subpixel 212G), and a subpixel 212 provided with a color filter that transmits light with a blue (B) wavelength band (also referred to as a subpixel 212B). The subpixel 212 can function as a photosensor.

The subpixel 212 (the subpixels 212R, 212G, and 212B) is electrically connected to a wiring 231, a wiring 247, a wiring 248, a wiring 249, and a wiring 250. In addition, the subpixels 212R, 212G, and 212B are connected to respective wirings 253 that are independent from one another. In this specification and the like, for example, the wiring 248 and the wiring 249 that are connected to the pixel 211 in the n-th row are referred to as a wiring 248[n] and a wiring 249[n], respectively. For example, the wiring 253 connected to the pixel 211 in the m-th column is referred to as a wiring 253[m]. Note that in FIG. 24A, the wirings 253 connected to the subpixels 212R, 212G, and 212B in the pixel 211 in the m-th column are referred to as a wiring 253[m]R, a wiring 253[m]G, and a wiring 253[m]B, respectively. The subpixels 212 are electrically connected to the peripheral circuit through the above wirings.

Figure 24B:
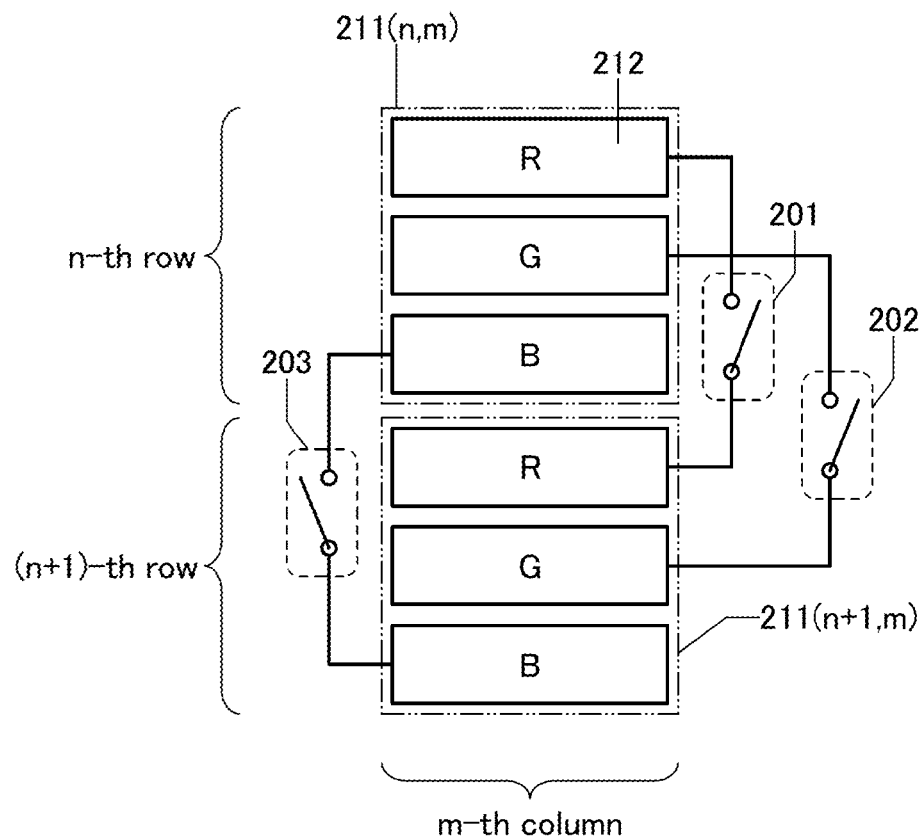

The imaging device 200 has a structure in which the subpixel 212 is electrically connected to the subpixel 212 in an adjacent pixel 211 that is provided with a color filter that transmits light with the same wavelength band as the subpixel 212, via a switch. FIG. 24B shows a connection example of the subpixels 212: the subpixel 212 in the pixel 211 arranged in an n-th (n is an integer greater than or equal to 1 and less than or equal to p) row and an m-th (m is an integer greater than or equal to 1 and less than or equal to q) column and the subpixel 212 in the adjacent pixel 211 arranged in an (n+1)-th row and the m-th column. In FIG. 24B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

The pixel 211 including the subpixel 212 provided with a color filter that transmits yellow (Y) light may be provided, in addition to the subpixels 212 provided with the color filters that transmits red (R), green (G), and blue (B) light. The pixel 211 including the subpixel 212 provided with a color filter that transmits blue (B) light may be provided, in addition to the subpixels 212 provided with the color filters that transmits cyan (C), yellow (Y), and magenta (M) light. When the subpixels 212 that sense light with four different wavelength bands are provided in one pixel 211, the reproducibility of colors of an obtained image can be increased.

For example, in FIG. 24A, in regard to the subpixel 212 that senses a red wavelength band, the subpixel 212 that senses a green wavelength band, and the subpixel 212 that senses a blue wavelength band, the pixel number ratio (or the light receiving area ratio) thereof is not necessarily 1:1:1. For example, the Bayer arrangement in which the pixel number ratio (the light receiving area ratio) is set at red: green:blue=1:2:1 may be employed. Alternatively, the pixel number ratio (the light receiving area ratio) is set at red: green:blue=1:6:1.

Although the number of subpixels 212 provided in the pixel 211 may be one, two or more subpixels are preferably provided. For example, when two or more subpixels 212 that sense the same wavelength band are provided, the redundancy is increased, and the reliability of the imaging device 200 can be increased.

When an infrared (IR) filter that transmits infrared light and absorbs or reflects visible light is used as the filter, the imaging device 200 that senses infrared light can be provided.

Furthermore, when a neutral density (ND) filter (dark filter) is used, output saturation that occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with reference to cross-sectional views in FIGS. 25A and 25B. With the lens 255, the photoelectric conversion element can receive incident light efficiently. Specifically, as illustrated in FIG. 25A, light 256 enters a photoelectric conversion element 220 through the lens 255, the filter 254 (a filter 254R, a filter 254G, and a filter 254B), a pixel circuit 230, and the like that are provided in the pixel 211.

However, part of the light 256 indicated by arrows might be blocked by some wirings 257 as indicated by a region surrounded with dashed-dotted lines. Thus, a preferable structure is that the lens 255 and the filter 254 are provided on the photoelectric conversion element 220 side so that the photoelectric conversion element 220 can efficiently receive the light 256 as illustrated in FIG. 25B. When the light 256 enters the photoelectric conversion element 220 from the photoelectric conversion element 220 side, the imaging device 200 with high sensitivity can be provided.

Figure 25A:
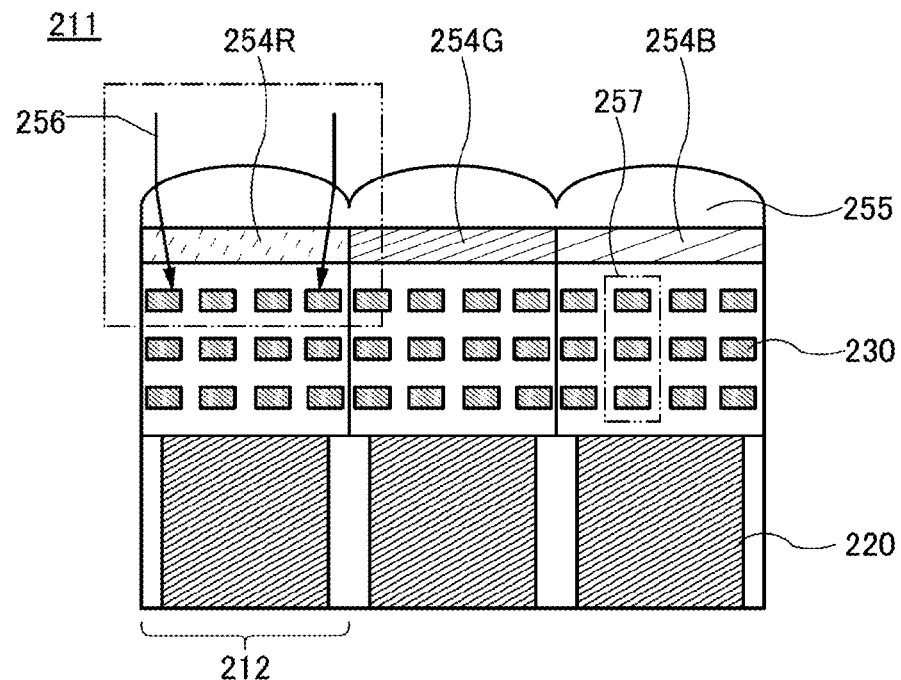
FIGS. 25A and 25B are cross-sectional views each illustrating a semiconductor device according to one embodiment of the present invention.
Figure 25B:
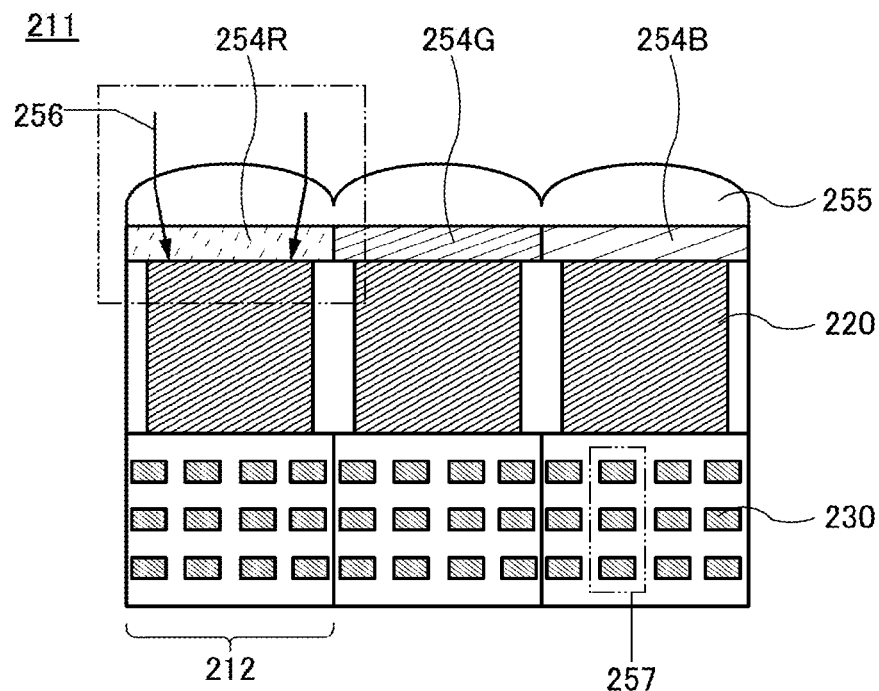

As the photoelectric conversion element 220 illustrated in FIGS. 25A and 25B, a photoelectric conversion element in which a p-n junction or a p-i-n junction is formed may be used.

The photoelectric conversion element 220 may be formed using a substance that has a function of absorbing a radiation and generating electric charge. Examples of the substance that has a function of absorbing a radiation and generating electric charge include selenium, lead iodide, mercury iodide, gallium arsenide, cadmium telluride, and a cadmium-zinc alloy.

For example, when selenium is used for the photoelectric conversion element 220, the photoelectric conversion element 220 can have an absorption coefficient of light in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 25A and 25B.

<Configuration Example 2 of Pixel>

An example of a pixel including a transistor using silicon and a transistor using an oxide semiconductor according to one embodiment of the present invention is described below.

Figure 26:
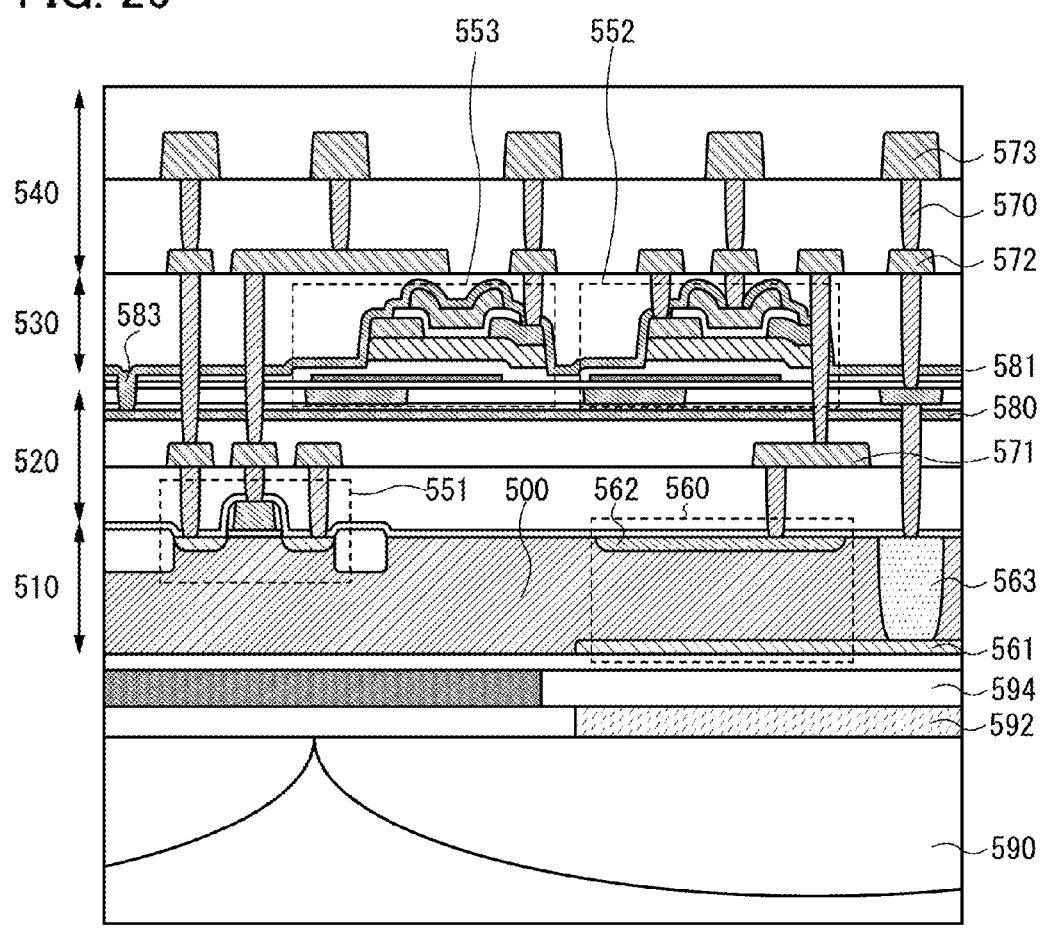
FIG. 26 is a cross-sectional view illustrating a semiconductor device according to one embodiment of the present invention.
Figure 27:
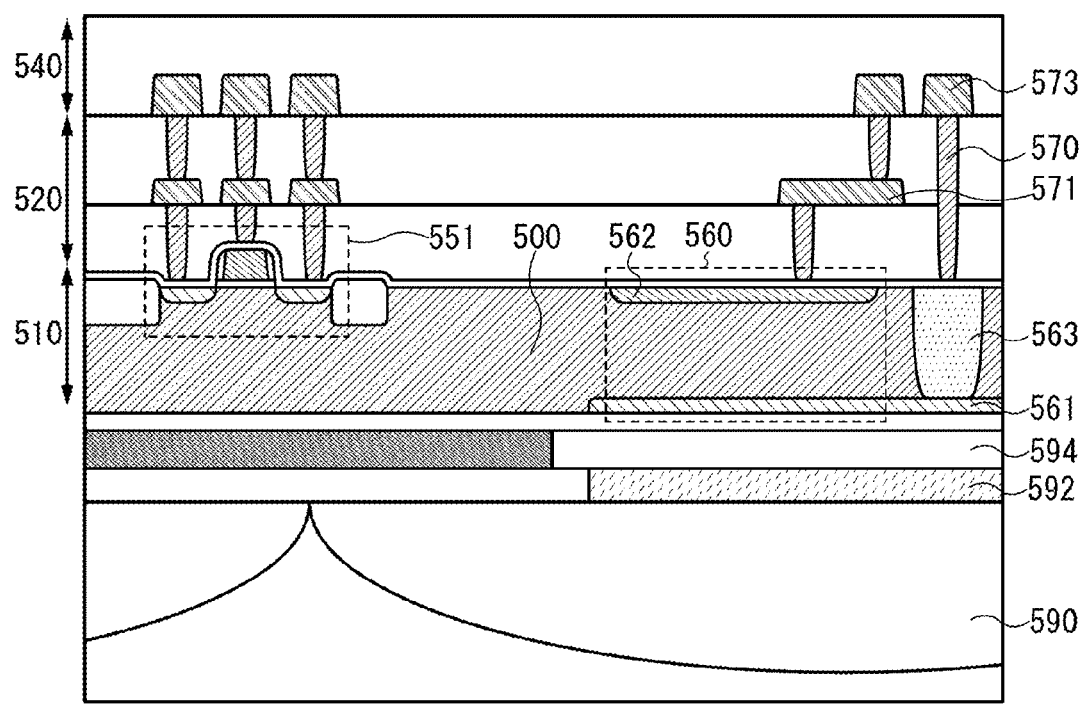
FIG. 27 is a cross-sectional view illustrating a semiconductor device according to one embodiment of the present invention.

FIG. 26 and FIG. 27 are each a cross-sectional view of an element included in an imaging device. The imaging device illustrated in FIG. 26 includes a transistor 551 including silicon on a silicon substrate 500, transistors 552 and 553 that include an oxide semiconductor and are stacked over the transistor 551, a photodiode 560 provided in the silicon substrate 500, a microlens array layer 590, a color filter layer 592, and a light-blocking layer 594. The transistors and a cathode 562 of the photodiode 560 are electrically connected to various plugs 570 and various wirings 571. An anode 561 of the photodiode 560 is electrically connected to the plug 570 through a low-resistance region 563.

The imaging device includes a layer 510 including the transistor 551 provided on the silicon substrate 500 and the photodiode 560 provided in the silicon substrate 500, a layer 520 that is in contact with the layer 510 and includes the wirings 571, a layer 530 that is in contact with the layer 520 and includes the transistors 552 and 553, and a layer 540 that is in contact with the layer 530 and includes a wiring 572 and a wiring 573.

In the example of cross-sectional view in FIG. 26, a light-receiving surface of the photodiode 560 is provided on the side opposite to a surface of the silicon substrate 500 where the transistor 551 is formed. With this structure, a light path can be secured without an influence of the transistors and the wirings. Thus, a pixel with a high aperture ratio can be formed. Note that the light-receiving surface of the photodiode 560 can be the same as the surface where the transistor 551 is formed.

In the case where a pixel is formed with the use of transistors including an oxide semiconductor, the layer 530 may include the transistors. Alternatively, the layer 510 may be omitted, and the pixel may include only transistors including an oxide semiconductor.

In the case where a pixel is formed with the use of a transistor including silicon, the layer 530 may be omitted. An example of a cross-sectional view in which the layer 530 is not provided is shown in FIG. 27.

Note that the silicon substrate 500 may be an SOI substrate. Furthermore, the silicon substrate 500 can be replaced with a substrate made of germanium, silicon germanium, silicon carbide, gallium arsenide, aluminum gallium arsenide, indium phosphide, gallium nitride, or an organic semiconductor.

Here, an insulator 580 is provided between the layer 510 including the transistor 551 and the photodiode 560 and the layer 530 including the transistors 552 and 553. However, there is no limitation on the position of the insulator 580.

Hydrogen in an insulator provided in the vicinity of a channel formation region of the transistor 551 terminates dangling bonds of silicon; accordingly, the reliability of the transistor 551 can be improved. In contrast, hydrogen in the insulator provided in the vicinity of the transistor 552, the transistor 553, and the like becomes a factor that generates a carrier in the oxide semiconductor. Thus, the hydrogen might cause a reduction of the reliability of the transistor 552, the transistor 553, and the like. Therefore, in the case where the transistor using an oxide semiconductor is provided over the transistor using a silicon-based semiconductor, it is preferable that the insulator 580 having a function of blocking hydrogen be provided between the transistors. When the hydrogen is confined below the insulator 580, the reliability of the transistor 551 can be improved. In addition, the hydrogen can be prevented from diffusing from a part below the insulator 580 to a part above the insulator 580; thus, the reliability of the transistor 552, the transistor 553, and the like can be increased. It is preferable to form the insulator 581 over the transistors 552 and 553 because oxygen diffusion can be prevented in the oxide semiconductor. It is more preferable that the transistors 552 and 553 be enclosed by the insulators 580 and 581 for sealing and a contact hole 583 electrically connect the insulators 580 and 581 as illustrated in FIG. 26.

For the insulator 580, the description of the insulator 363 is referred to, for example.

In the cross-sectional view in FIG. 26, the photodiode 560 in the layer 510 and the transistors in the layer 530 can be formed so as to overlap each other. Thus, the degree of integration of pixels can be increased. In other words, the resolution of the imaging device can be increased.

As illustrated in FIG. 28A1 and FIG. 28B1, part or the whole of the imaging device can be bent. FIG. 28A1 illustrates the state in which the imaging device is bent in the direction of a dashed-dotted line X1-X2. FIG. 28A2 is a cross-sectional view taken along dashed-dotted line X1-X2 in FIG. 28A1. FIG. 28A3 is a cross-sectional view taken along dashed-dotted line Y1-Y2 in FIG. 28A1.

FIG. 28B1 illustrates the state where the imaging device is bent in the direction of a dashed-dotted line X3-X4 and the direction of a dashed-dotted line Y3-Y4. FIG. 28B2 is a cross-sectional view taken along dashed-dotted line X3-X4 in FIG. 28B1. FIG. 28B3 is a cross-sectional view taken along dashed-dotted line Y3-Y4 in FIG. 28B1.

The bent imaging device enables the curvature of field and astigmatism to be reduced. Thus, the optical design of lens and the like, which is used in combination with the imaging device, can be facilitated. For example, the number of lens used for aberration correction can be reduced; accordingly, a reduction in the size or weight of electronic devices using the imaging device, and the like, can be achieved. In addition, the quality of a captured image can be improved.

Embodiment 7

A display device of one embodiment of the present invention is described below with reference to FIGS. 29A to 29C and FIGS. 30A and 30B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 29A:
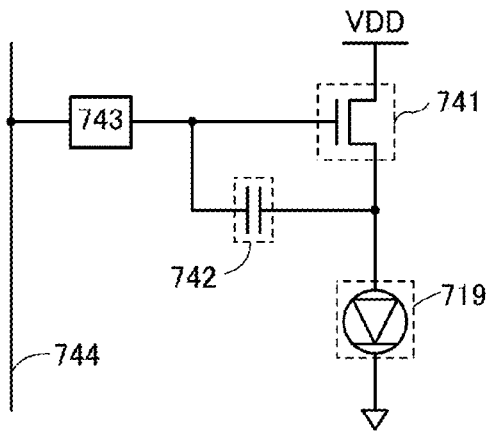
FIGS. 29A to 29C are a circuit diagram, a top view, and a cross-sectional view illustrating a semiconductor device according to one embodiment of the present invention.
Figure 29B:
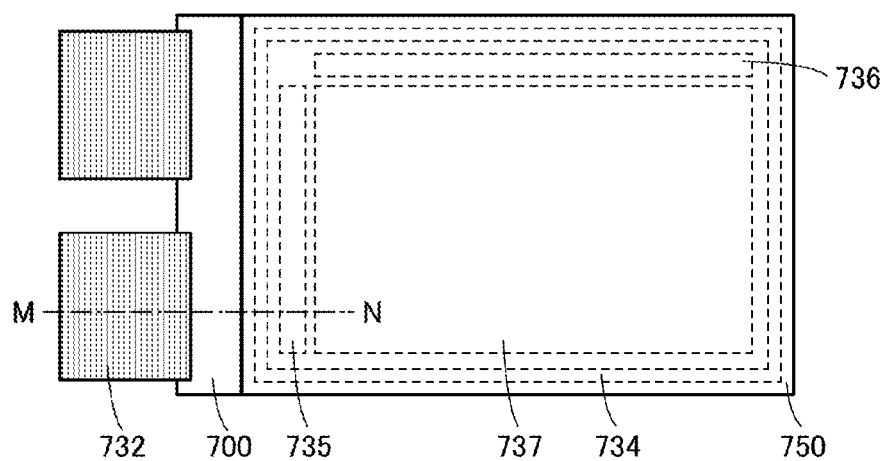
Figure 29C:
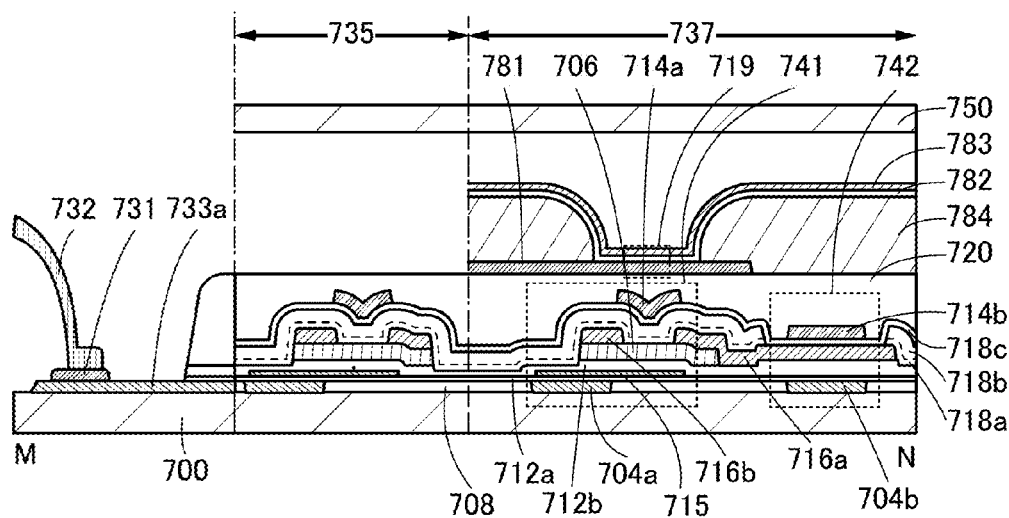

FIGS. 29A to 29C illustrate an example of an EL display device of one embodiment of the present invention. FIG. 29A is a circuit diagram of a pixel in an EL display device. FIG. 29B is a top view showing the whole of the EL display device. FIG. 29C is a cross-sectional view taken along part of dashed-dotted line M-N in FIG. 29B.

FIG. 29A illustrates an example of a circuit diagram of a pixel used in an EL display device.

Note that in this specification and the like, it may be possible for those skilled in the art to constitute one embodiment of the invention even when portions to which all the terminals of an active element (e.g., a transistor or a diode), a passive element (e.g., a capacitor or a resistor), and the like are connected are not specified. In other words, one embodiment of the invention is clear even when connection portions are not specified. Furthermore, in the case where a connection portion is disclosed in this specification and the like, it can be determined that one embodiment of the invention in which a connection portion is not specified is disclosed in this specification and the like, in some cases. In particular, in the case where the number of portions to which the terminal is connected may be more than one, it is not necessary to specify the portions to which the terminal is connected. Therefore, it may be possible to constitute one embodiment of the invention by specifying only portions to which some of terminals of an active element (e.g., a transistor or a diode), a passive element (e.g., a capacitor or a resistor), and the like are connected.

Note that in this specification and the like, it may be possible for those skilled in the art to specify the invention when at least the connection portion of a circuit is specified. Alternatively, it may be possible for those skilled in the art to specify the invention when at least a function of a circuit is specified. In other words, when a function of a circuit is specified, one embodiment of the present invention is clear, and it can be determined that the embodiment is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 29A includes a switching element 743, a transistor 741, a capacitor 742, and a light-emitting element 719.

Note that FIG. 29A and the like each illustrate an example of a circuit configuration; therefore, a transistor can be provided additionally. In contrast, for each node in FIG. 29A and the like, it is possible that an additional transistor, switch, passive element, or the like not be provided.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 29B is a top view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 29C is a cross-sectional view of the EL display device taken along part of dashed-dotted line M-N in FIG. 29B.

FIG. 29C illustrates a structure of the transistor 741 including an insulator 708 over the substrate 700; a conductor 704a embedded in the insulator 708; an insulator 712a over the insulator 708 and the conductor 704a; an electron trap layer 715 over the insulator 712a; an insulator 712b over the insulator 712a and the electron trap layer 715; a semiconductor 706 that is over the insulator 712b and overlaps with the conductor 704a; a conductor 716a and a conductor 716b in contact with the semiconductor 706; an insulator 718a over the semiconductor 706, the conductor 716a, and the conductor 716b; an insulator 718b over the insulator 718a; an insulator 718c over the insulator 718b; an insulator 718c over the insulator 718b; and a conductor 714a that is over the insulator 718c and overlaps with the semiconductor 706. Note that the structure of the transistor 741 is just an example; the transistor 741 may have a structure different from that illustrated in FIG. 29C.

In the transistor 741 illustrated in FIG. 29C, the conductor 704a serves as a gate electrode, the electron trap layer 715 serves as a layer that traps an electron, the insulator 712a and the insulator 712b serve as a gate insulator, the conductor 716a serves as a source electrode, the conductor 716b serves as a drain electrode, the insulator 718a, the insulator 718b, and the insulator 718c serve as a gate insulator, and the conductor 714a serves as a gate electrode. Note that in some cases, the electrical characteristics of the semiconductor 706 change if light enters the semiconductor 706.

To prevent this, it is preferable that one or more of the conductors 704a, 716a, 716b, and 714a have a light-blocking property.

Note that the interface between the insulators 718a and 718b is indicated by a broken line. This means that the boundary between them is not clear in some cases. For example, in the case where the insulators 718a and 718b are formed using insulators of the same kind, the insulators 718a and 718b are not distinguished from each other in some cases depending on an observation method.

FIG. 29C illustrates a structure of the capacitor 742 including the insulator 708 over the substrate 700; a conductor 704b embedded in the insulator 708; the insulator 712a over the insulator 708 and the conductor 704b; the insulator 712b over the insulator 712a; the conductor 716a that is over the insulator 712b and overlaps with the conductor 704b; the insulator 718a over the conductor 716a; the insulator 718b over the insulator 718a; the insulator 718c over the insulator 718b; and a conductor 714b that is over the insulator 718c and overlaps with the conductor 716a. In this structure, part of the insulator 718a and part of the insulator 718b are removed in a region where the conductor 716a and the conductor 714b overlap with each other.

In the capacitor 742, each of the conductor 704b and the conductor 714b serves as one electrode, and the conductor 716a serves as the other electrode.

Thus, the capacitor 742 can be formed using a film of the transistor 741. The conductors 704a and 704b are preferably conductors of the same kind, in which case the conductors 704a and 704b can be formed through the same step. Furthermore, the conductors 714a and 714b are preferably conductors of the same kind, in which case the conductors 714a and 714b can be formed through the same step.

The capacitor 742 illustrated in FIG. 29C has a large capacitance per unit area occupied by the capacitor. Therefore, the EL display device illustrated in FIG. 29C has high display quality. Note that although the capacitor 742 illustrated in FIG. 29C has the structure in which the part of the insulator 718a and the part of the insulator 718b are removed to reduce the thickness of the region where the conductor 716a and the conductor 714b overlap with each other, the structure of the capacitor of one embodiment of the present invention is not limited to the structure. For example, a structure in which a part of the insulator 718c is removed to reduce the thickness of the region where the conductor 716a and the conductor 714b overlap with each other may be used.

An insulator 720 is provided over the transistor 741 and the capacitor 742. Here, the insulator 720 may have an opening reaching the conductor 716a that serves as the source electrode of the transistor 741. A conductor 781 is provided over the insulator 720. The conductor 781 may be electrically connected to the transistor 741 through the opening in the insulator 720.

A partition wall 784 having an opening reaching the conductor 781 is provided over the conductor 781. A light-emitting layer 782 in contact with the conductor 781 through the opening formed in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719.

So far, examples of the EL display device are described. Next, an example of a liquid crystal display device is described.

Figure 30A:
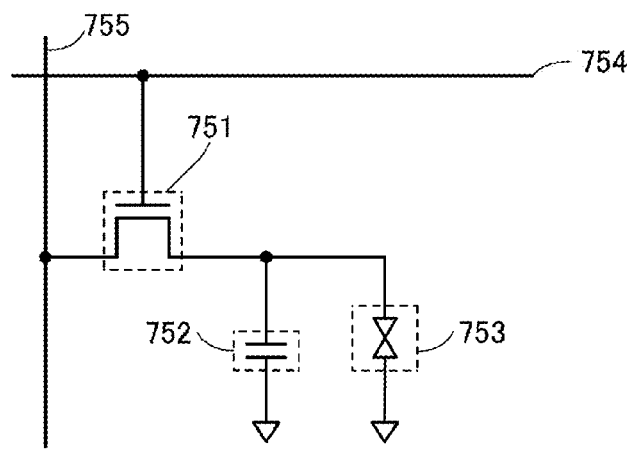
FIGS. 30A and 30B are a circuit diagram and a cross-sectional view illustrating a semiconductor device according to one embodiment of the present invention.

FIG. 30A is a circuit diagram illustrating a configuration example of a pixel of a liquid crystal display device. A pixel shown in FIGS. 30A and 30B includes a transistor 751, a capacitor 752, and an element (liquid crystal element) 753 in which a space between a pair of electrodes is filled with liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may differ from that supplied to the other electrode of the liquid crystal element 753.

Figure 30B:
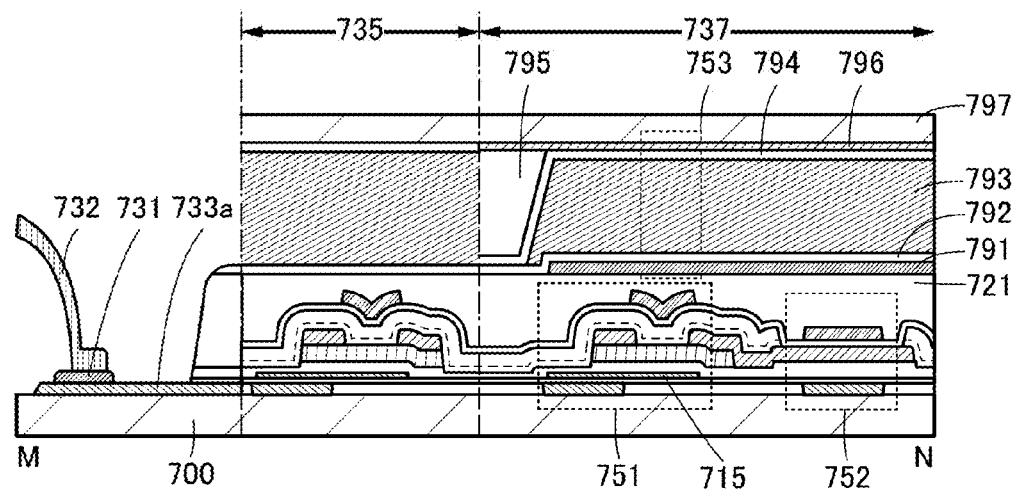

Note that the description of the liquid crystal display device is made on the assumption that the top view of the liquid crystal display device is similar to that of the EL display device. FIG. 30B is a cross-sectional view of the liquid crystal display device taken along dashed-dotted line M-N in FIG. 29B. In FIG. 30B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 30B corresponds to, but is not limited to, the structure of the capacitor 742 in FIG. 29C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Owing to the above-described structure, a display device including a capacitor occupying a small area, a display device with high display quality, or a high-resolution display device can be provided.

For example, in this specification and the like, a display element, a display device that is a device including a display element, a light-emitting element, and a light-emitting device that is a device including a light-emitting element can employ various modes or can include various elements. For example, the display element, the display device, the light-emitting element, or the light-emitting device includes at least one of an EL element (e.g., an EL element including organic and inorganic materials, an organic EL element, or an inorganic EL element), an LED (e.g., an LED for white, red, green, blue, or the like), a transistor (a transistor that emits light depending on a current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device having electronic ink, Electronic Liquid Powder (registered trademark), or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductor included in the LED can also be formed by a sputtering method.

Embodiment 8

In this embodiment, an RF tag that includes the transistor described in the above embodiment or the memory device described in the above embodiment is described with reference to FIG. 31.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF device is required to have extremely high reliability in order to be used for this purpose.

A configuration of the RF tag is described with reference to FIG. 31. FIG. 31 is a block diagram illustrating a configuration example of an RF tag.

Figure 31:
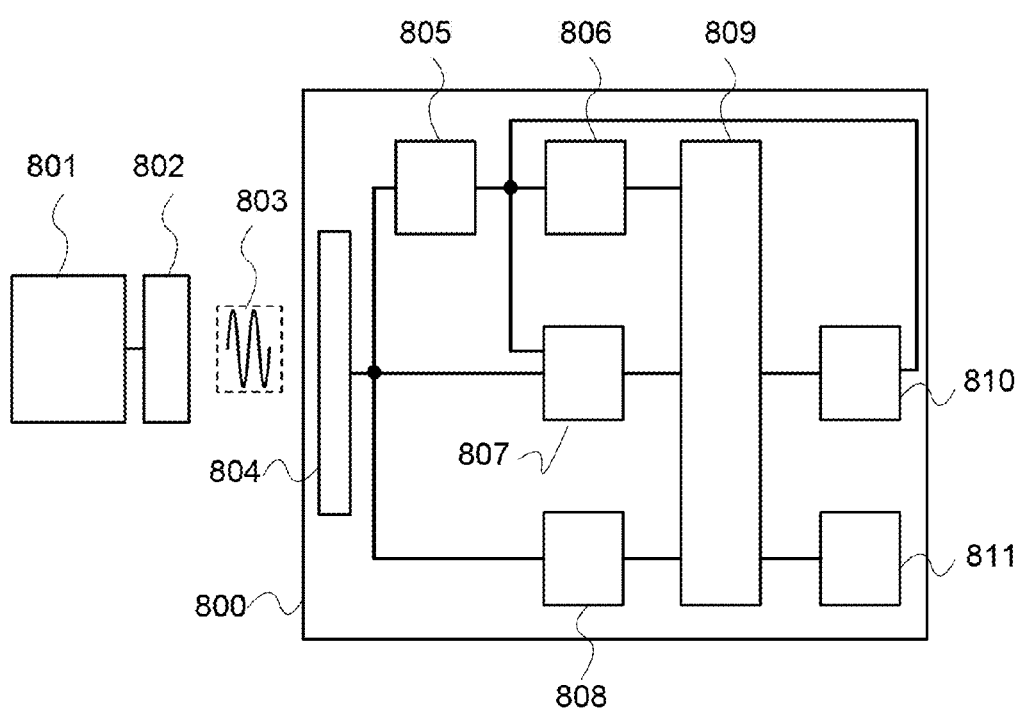
FIG. 31 is a configuration example of an RF tag according to one embodiment of the present invention.

As shown in FIG. 31, an RF tag 800 includes an antenna 804 that receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material that enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, a configuration of each circuit is described. The antenna 804 exchanges the radio signal 803 with the antenna 802 that is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power that is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. The modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. The ROM 811 stores an identification number (ID) or the like and outputs it in accordance with processing.

Note that the decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RF tag. In addition, the memory circuit of one embodiment of the present invention needs power (voltage) needed for data writing significantly lower than that needed in a conventional nonvolatile memory; thus, it is possible to prevent a difference between the maximum communication range in data reading and that in data writing. Furthermore, it is possible to suppress malfunction or incorrect writing that is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers only to good products to be shipped. Thus, the identification numbers of the shipped products are in series and customer management corresponding to the shipped products is easily performed.

At least part of this embodiment can be implemented in combination with any of the other embodiments described in this specification as appropriate.

Embodiment 9

In this embodiment, a CPU in which at least the transistor described in any of the above embodiments can be used and the memory device described in the above embodiment is included is described.

Figure 32:
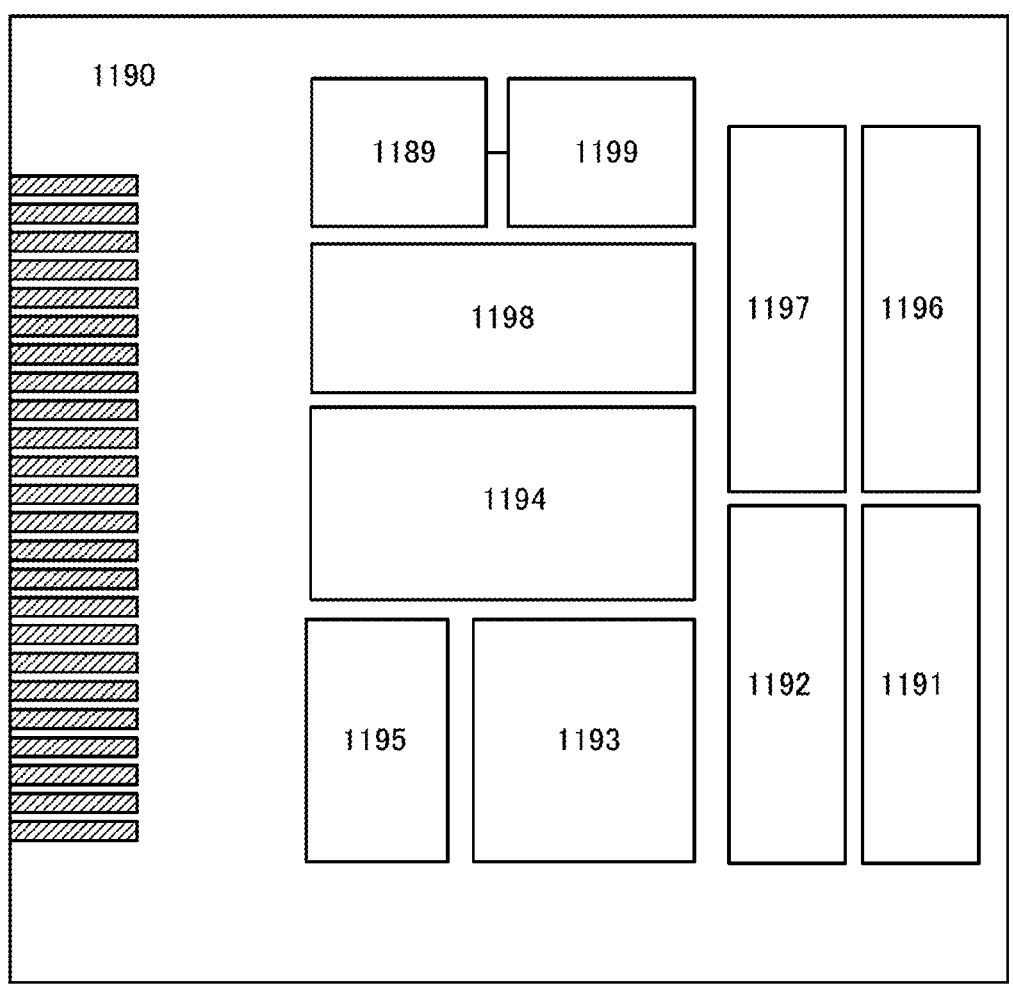
FIG. 32 is a block diagram of a semiconductor device according to one embodiment of the present invention.

FIG. 32 is a block diagram illustrating a configuration example of a CPU at least partly including any of the transistors described in the above embodiments as a component.

The CPU illustrated in FIG. 32 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM UF) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 32 is just an example in which the configuration is simplified, and an actual CPU may have a variety of configurations depending on the application. For example, the CPU may have the following configuration: a structure including the CPU illustrated in FIG. 32 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 32, a memory cell is provided in the register 1196. For the memory cell of the register 1196, any of the transistors described in the above embodiments can be used.

In the CPU illustrated in FIG. 32, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 33:
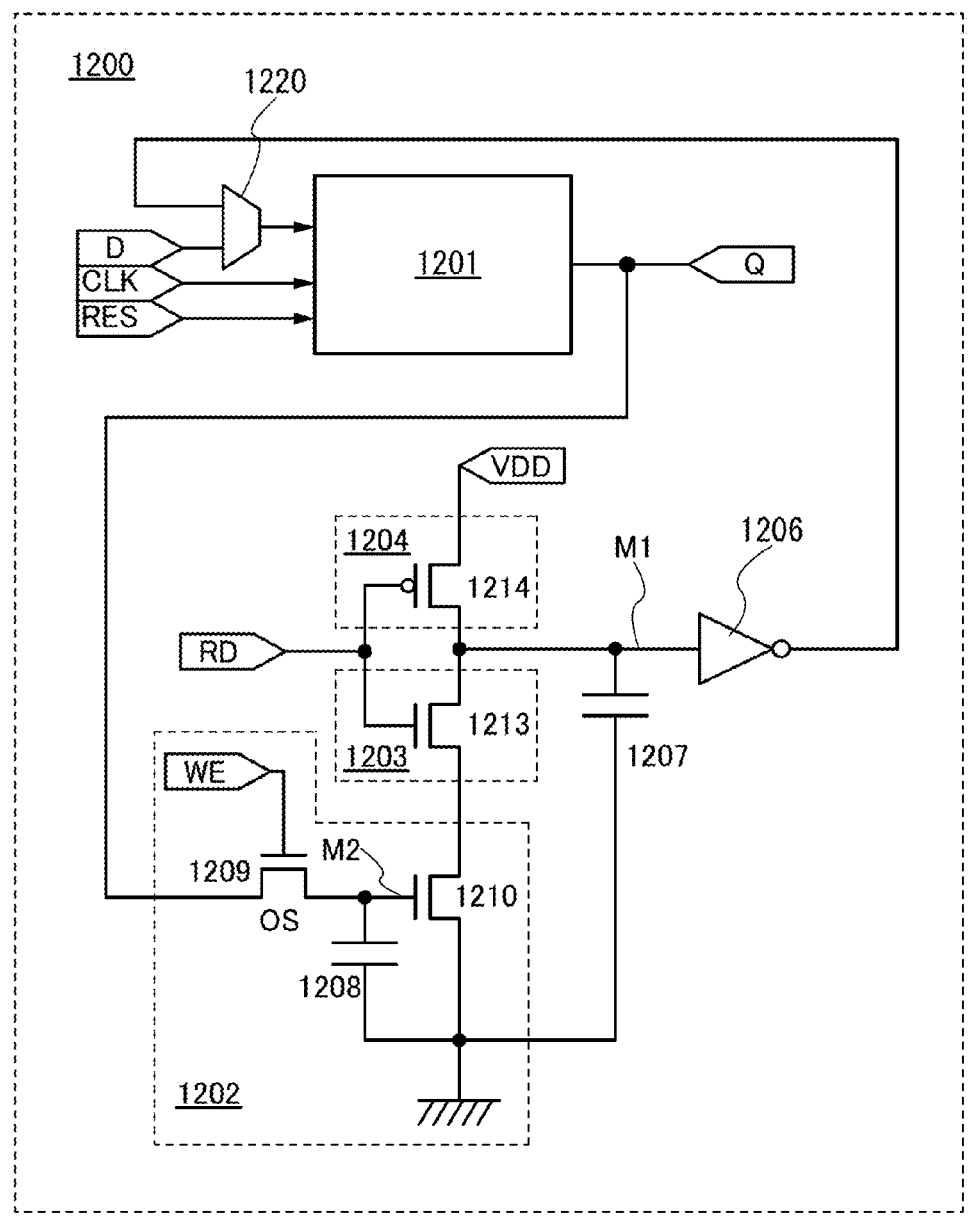
FIG. 33 is a circuit diagram illustrating a memory device according to one embodiment of the present invention.

FIG. 33 is an example of a circuit diagram of a memory circuit that can be used as the register 1196. A memory circuit 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory circuit 1200 may further include another element such as a diode, a resistor, or an inductor, as needed.

Here, the memory device described in the above embodiment can be used as the circuit 1202. When supply of a power supply voltage to the memory circuit 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first and second terminals of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first and second terminals of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring that can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the wiring that can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switches 1203 and 1204, a conduction state or a non-conduction state between the first and second terminals is selected by the control signal RD that differs from the control signal WE. When one of the switches is in the conduction state between the first and second terminals, the other of the switches is in the non-conduction state between the first and second terminals.

A signal corresponding to data retained in the circuit 1201 is input to the other of the source and the drain of the transistor 1209. FIG. 33 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 33, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 33, the transistors included in the memory circuit 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor can be used for all the transistors in the memory circuit 1200. Further alternatively, in the memory circuit 1200, a transistor in which a channel is formed in an oxide semiconductor can be included besides the transistor 1209, and a transistor in which a channel is formed in a layer formed using a semiconductor other than an oxide semiconductor or in the substrate 1190 can be used for the rest of the transistors.

As the circuit 1201 in FIG. 33, for example, a flip-flop circuit can be used. As the logic element 1206, for example, an inverter or a clocked inverter can be used.

In a period during which the memory circuit 1200 is not supplied with the power supply voltage, the semiconductor device of one embodiment of the present invention can retain data stored in the circuit 1201 by the capacitor 1208 that is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory circuit 1200. The memory circuit 1200 can accordingly retain the stored content (data) also in a period during which the supply of the power supply voltage is stopped.

Since the above-described memory circuit performs precharge operation with the switches 1203 and 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory circuit 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory circuit 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory circuit 1200 is used in a CPU in this embodiment, the memory circuit 1200 can also be used in an LSI such as a digital signal processor (DSP), a custom LSI, or a programmable logic device (PLD), and an RF tag.

At least part of this embodiment can be implemented in combination with any of the other embodiments described in this specification as appropriate.

Embodiment 10

In this embodiment, a structure example of a display panel of one embodiment of the present invention is described.
[Structure Example]

Figure 34A:
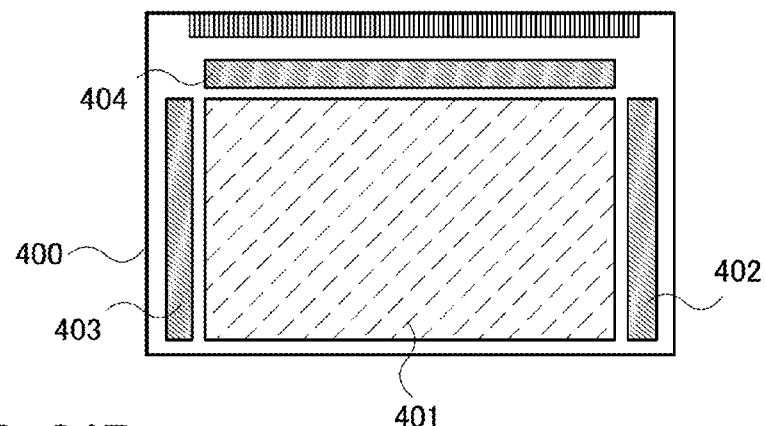
FIGS. 34A to 34C are a top view and circuit diagrams each illustrating a display device according to one embodiment of the present invention.
Figure 34B:
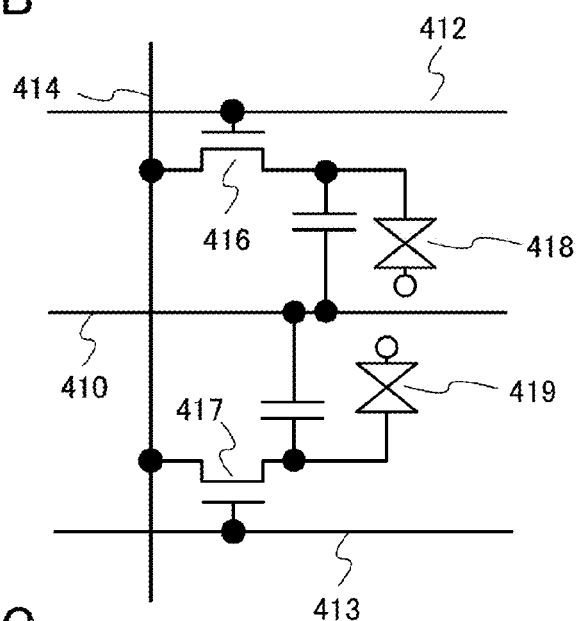
Figure 34C:
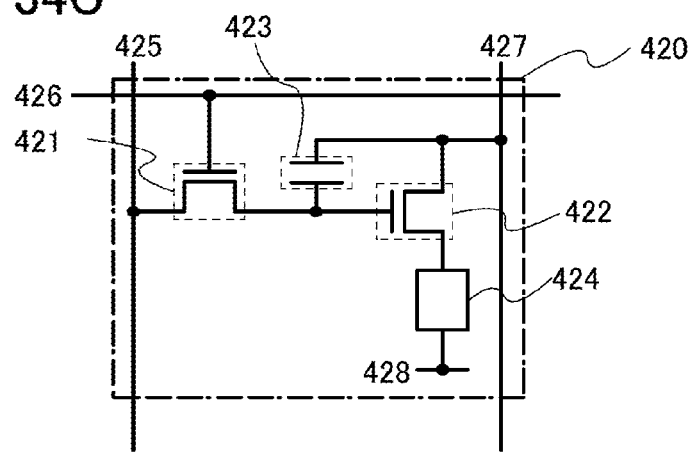

FIG. 34A is a top view of the display panel of one embodiment of the present invention. FIG. 34B is a circuit diagram illustrating a pixel circuit that can be used in the case where a liquid crystal element is used in a pixel in the display panel of one embodiment of the present invention. FIG. 34C is a circuit diagram illustrating a pixel circuit that can be used in the case where an organic EL element is used in a pixel in the display panel of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 34A illustrates an example of a block diagram of an active matrix display device. A pixel portion 401, a first scan line driver circuit 402, a second scan line driver circuit 403, and a signal line driver circuit 404 are formed over a substrate 400 of the display device. In the pixel portion 401, a plurality of signal lines extended from the signal line driver circuit 404 are arranged and a plurality of scan lines extended from the first scan line driver circuit 402 and the second scan line driver circuit 403 are arranged. Note that pixels that include display elements are provided in a matrix in respective regions where the scan lines and the signal lines intersect with each other. The substrate 400 of the display device is connected to a timing control circuit (also referred to as a controller or a controller IC) through a connection portion such as a flexible printed circuit (FPC).

In FIG. 34A, the first scan line driver circuit 402, the second scan line driver circuit 403, and the signal line driver circuit 404 are formed over the substrate 400 where the pixel portion 401 is formed. Accordingly, the number of components that are provided outside, such as a driver circuit, can be reduced, so that a reduction in cost can be achieved. Furthermore, if the driver circuit is provided outside the substrate 400, wirings would need to be extended and the number of wiring connections would increase. When the driver circuit is provided over the substrate 400, the number of wiring connections can be reduced. Consequently, an improvement in reliability or yield can be achieved.
[Liquid Crystal Panel]

FIG. 34B illustrates an example of a circuit configuration of the pixel. Here, a pixel circuit that can be used in a pixel of a VA liquid crystal display panel is illustrated.

This pixel circuit can be used in a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 412 of a transistor 416 and a gate wiring 413 of a transistor 417 are separated so that different gate signals can be supplied thereto. In contrast, a source or drain electrode 414 that functions as a data line is shared by the transistors 416 and 417. The transistor described in any of the above embodiments can be used as appropriate as each of the transistors 416 and 417. Thus, a highly reliable liquid crystal display panel can be provided.

A first pixel electrode is electrically connected to the transistor 416 and a second pixel electrode is electrically connected to the transistor 417. The first pixel electrode and the second pixel electrode are separated. Shapes of the first pixel electrode and the second pixel electrode are not limited. For example, the first pixel electrode may have a V-like shape.

A gate electrode of the transistor 416 is connected to the gate wiring 412, and a gate electrode of the transistor 417 is connected to the gate wiring 413. When different gate signals are supplied to the gate wirings 412 and 413, operation timings of the transistors 416 and 417 can be varied. As a result, alignment of liquid crystals can be controlled.

Furthermore, a storage capacitor may be formed using a capacitor wiring 410, a gate insulator functioning as a dielectric, and a capacitor electrode electrically connected to the first pixel electrode or the second pixel electrode.

The pixel structure is a multi-domain structure in which a first liquid crystal element 418 and a second liquid crystal element 419 are provided in one pixel. The first liquid crystal element 418 includes the first pixel electrode, a counter electrode, and a liquid crystal layer therebetween. The second liquid crystal element 419 includes the second pixel electrode, a counter electrode, and a liquid crystal layer therebetween.

Note that a pixel circuit of the present invention is not limited to that shown in FIG. 34B. For example, a switch, a resistor, a capacitor, a transistor, a sensor, a logic circuit, or the like may be added to the pixel circuit illustrated in FIG. 34B.
[Organic EL Panel]

FIG. 34C illustrates another example of a circuit configuration of the pixel. Here, a pixel structure of a display panel including an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 34C illustrates an example of a pixel circuit that can be used. Here, one pixel includes two n-channel transistors. Note that a metal oxide film of one embodiment of the present invention can be used for channel formation regions of the n-channel transistors. Furthermore, digital time grayscale driving can be employed for the pixel circuit.

The configuration of the pixel circuit that can be used and the operation of a pixel employing digital time grayscale driving are described.

A pixel 420 includes a switching transistor 421, a driver transistor 422, a light-emitting element 424, and a capacitor 423. A gate electrode of the switching transistor 421 is connected to a scan line 426, a first electrode (one of a source electrode and a drain electrode) of the switching transistor 421 is connected to a signal line 425, and a second electrode (the other of the source electrode and the drain electrode) of the switching transistor 421 is connected to a gate electrode of the driver transistor 422. The gate electrode of the driver transistor 422 is connected to a power supply line 427 through the capacitor 423, a first electrode of the driver transistor 422 is connected to the power supply line 427, and a second electrode of the driver transistor 422 is connected to a first electrode (a pixel electrode) of the light-emitting element 424. A second electrode of the light-emitting element 424 corresponds to a common electrode 428. The common electrode 428 is electrically connected to a common potential line formed over the same substrate as the common electrode 428.

As the switching transistor 421 and the driver transistor 422, the transistor described in any of the above embodiments can be used as appropriate. In this manner, a highly reliable organic EL display panel can be provided.

The potential of the second electrode (the common electrode 428) of the light-emitting element 424 is set to be a low power supply potential. Note that the low power supply potential is lower than a high power supply potential supplied to the power supply line 427. For example, the low power supply potential can be GND, 0 V, or the like. The high power supply potential and the low power supply potential are set to be higher than or equal to the forward threshold voltage of the light-emitting element 424, and the difference between the potentials is applied to the light-emitting element 424, whereby current is supplied to the light-emitting element 424, leading to light emission. The forward voltage of the light-emitting element 424 refers to a voltage at which a desired luminance is obtained, and includes at least a forward threshold voltage.

Note that gate capacitance of the driver transistor 422 may be used as a substitute for the capacitor 423, so that the capacitor 423 can be omitted. The gate capacitance of the driver transistor 422 may be formed between the channel formation region and the gate electrode.

Next, a signal input to the driver transistor 422 is described. In the case of a voltage-input voltage driving method, a video signal for sufficiently turning on or off the driver transistor 422 is input to the driver transistor 422. In order for the driver transistor 422 to operate in a linear region, voltage higher than the voltage of the power supply line 427 is applied to the gate electrode of the driver transistor 422. Note that voltage higher than or equal to voltage that is the sum of power supply line voltage and the threshold voltage Vth of the driver transistor 422 is applied to the signal line 425.

In the case of performing analog grayscale driving, a voltage higher than or equal to a voltage that is the sum of the forward voltage of the light-emitting element 424 and the threshold voltage Vth of the driver transistor 422 is applied to the gate electrode of the driver transistor 422. A video signal by which the driver transistor 422 is operated in a saturation region is input, so that current is supplied to the light-emitting element 424. In order for the driver transistor 422 to operate in a saturation region, the potential of the power supply line 427 is set higher than the gate potential of the driver transistor 422. When an analog video signal is used, it is possible to supply current to the light-emitting element 424 in accordance with the video signal and perform analog grayscale driving.

Note that the configuration of the pixel circuit of the present invention is not limited to that shown in FIG. 34C. For example, a switch, a resistor, a capacitor, a sensor, a transistor, a logic circuit, or the like may be added to the pixel circuit illustrated in FIG. 34C.

In the case where the transistor shown in any of the above embodiments is used for any of the circuits shown in FIGS. 34A to 34C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

At least part of this embodiment can be implemented in combination with any of the other embodiments described in this specification as appropriate.

Embodiment 11

The semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 35A to 35F illustrate specific examples of these electronic devices.

Figure 35A:
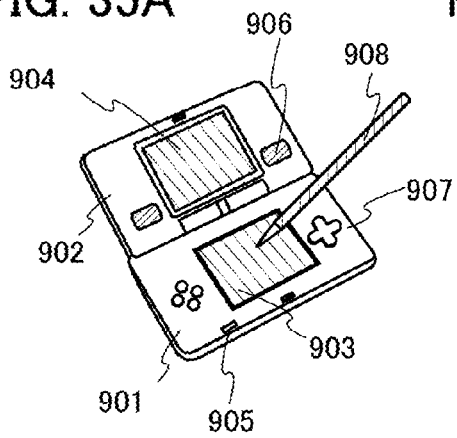
FIGS. 35A to 35F illustrate examples of electronic devices according to one embodiment of the present invention.

FIG. 35A illustrates a portable game machine, which includes a housing 901, a housing 902, a display portion 903, a display portion 904, a microphone 905, a speaker 906, an operation key 907, a stylus 908, and the like. Although the portable game machine in FIG. 35A has the two display portions 903 and 904, the number of display portions included in a portable game machine is not limited to this.

Figure 35B:
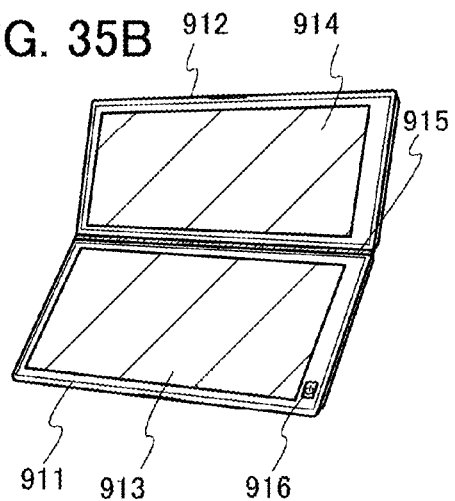

FIG. 35B illustrates a portable data terminal, which includes a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. Images displayed on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 35C:
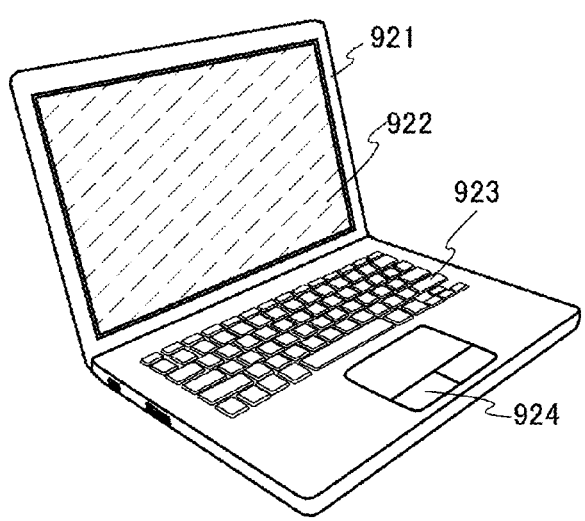

FIG. 35C illustrates a laptop personal computer, which includes a housing 921, a display portion 922, a keyboard 923, a pointing device 924, and the like.

Figure 35D:
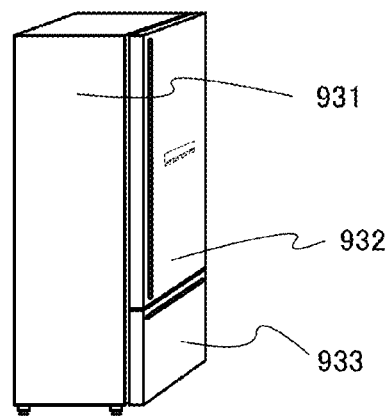

FIG. 35D illustrates an electric refrigerator-freezer, which includes a housing 931, a refrigerator door 932, a freezer door 933, and the like.

Figure 35E:
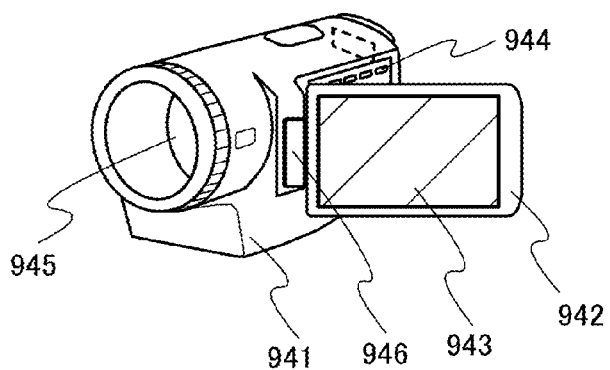

FIG. 35E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 35F:
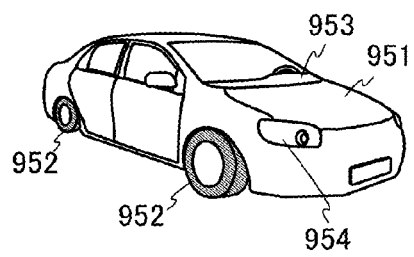
Figure 36A:
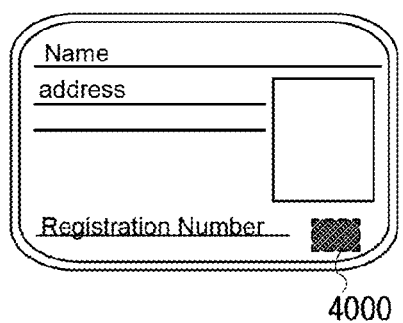
FIGS. 36A to 36F illustrate application examples of an RF tag according to one embodiment of the present invention.
Figure 36B:
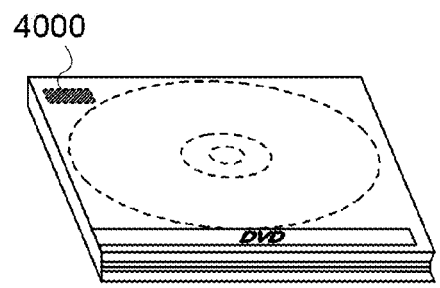
Figure 36C:
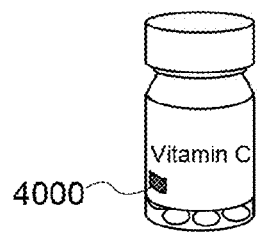
Figure 36D:
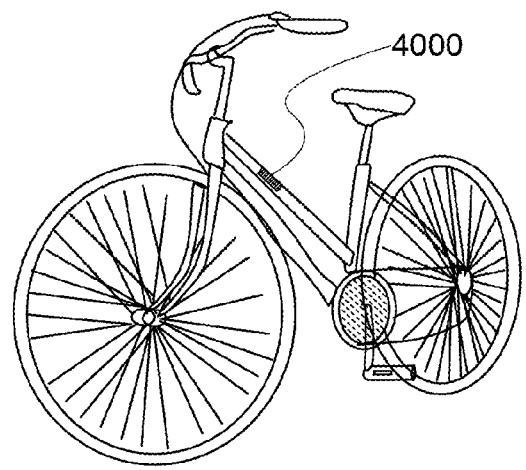
Figure 36E:
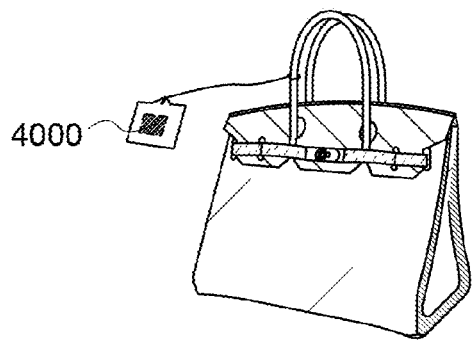
Figure 36F:
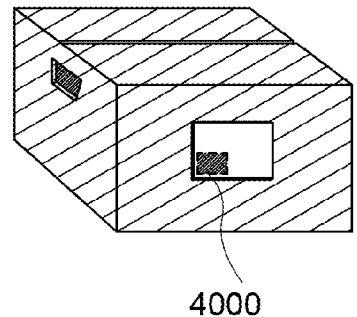

FIG. 35F illustrates a car that includes a car body 951, wheels 952, a dashboard 953, lights 954, and the like.

At least part of this embodiment can be implemented in combination with any of the other embodiments described in this specification as appropriate.

Embodiment 12

In this embodiment, application examples of an RF tag of one embodiment of the present invention are described with reference to FIGS. 36A to 36F. The RF tag is widely used and can be provided for, for example, products such as bills, coins, securities, bearer bonds, documents (e.g., driver's licenses or resident's cards, see FIG. 36A), recording media (e.g., DVDs or video tapes, see FIG. 36B), packaging containers (e.g., wrapping paper or bottles, see FIG. 36C), vehicles (e.g., bicycles, see FIG. 36D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 36E and 36F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be retained for an extremely long period even in the state where power is not supplied; thus, the RF tag can be preferably used for application in which data is not frequently written or read.

At least part of this embodiment can be implemented in combination with any of the other embodiments described in this specification as appropriate.

This application is based on Japanese Patent Application serial No. 2014-236313 filed with Japan Patent Office on Nov. 21, 2014, the entire contents of which are hereby incorporated by reference.

What is claimed is:

1. A semiconductor device comprising:
   a first conductor;
   a second conductor;
   a first insulator;
   a second insulator;
   a third insulator;
   a semiconductor; and
   an electron trap layer,
   wherein the semiconductor comprises a channel formation region,
   wherein the electron trap layer overlaps with the channel formation region with the second insulator interposed between the electron trap layer and the channel formation region,
   wherein the first conductor overlaps with the channel formation region with the first insulator interposed between the first conductor and the channel formation region,
   wherein the second conductor overlaps with the electron trap layer with the third insulator interposed between the second conductor and the electron trap layer, and
   wherein the second conductor does not overlap with the channel formation region.

2. The semiconductor device according to claim 1, wherein the electron trap layer comprises a conductor or a semiconductor.

3. A semiconductor device comprising:
   a first conductor;
   a second conductor;
   a third conductor;
   a fourth conductor;
   a first insulator;
   a second insulator;
   a third insulator;
   a semiconductor; and
   an electron trap layer,
   wherein the semiconductor comprises a first region in contact with the third conductor, a second region in contact with the fourth conductor, and a third region between the first region and the second region,
   wherein the electron trap layer overlaps with the third region with the second insulator interposed between the electron trap layer and the third region,
   wherein the first conductor overlaps with the third region with the first insulator interposed between the first conductor and the third region,
   wherein the second conductor overlaps with the electron trap layer with the third insulator interposed between the second conductor and the electron trap layer, and
   wherein the second conductor does not overlap with the third region.

4. The semiconductor device according to claim 3, wherein the electron trap layer comprises a conductor or a semiconductor.

5. A semiconductor device comprising:
a first conductor;
a second conductor;
a third conductor;
a fourth conductor;
a first insulator;
a second insulator;
a third insulator;
a semiconductor; and
an electron trap layer,
wherein the semiconductor comprises a first region in contact with the third conductor, a second region in contact with the fourth conductor, and a third region between the first region and the second region,
wherein the electron trap layer overlaps with the first region with the second insulator interposed between the electron trap layer and the first region and overlaps with the third region with the second insulator interposed between the electron trap layer and the third region,
wherein the first conductor overlaps with the third region with the first insulator interposed between the first conductor and the third region,
wherein the second conductor overlaps with the electron trap layer with the third insulator interposed between the second conductor and the electron trap layer, and
wherein the second conductor overlaps with the first region.

6. The semiconductor device according to claim 5, wherein the electron trap layer comprises a conductor or a semiconductor.

7. A semiconductor device comprising:
an electron trap layer;
a semiconductor overlapping with the electron trap layer, the semiconductor comprises a channel formation region;
an insulator between the electron trap layer and the semiconductor; and
a gate electrode arranged so as to control the number of electrons trapped by the electron trap layer.

8. The semiconductor device according to claim 7, wherein the electron trap layer is located under the semiconductor.

9. The semiconductor device according to claim 7, wherein the electron trap layer is located over the semiconductor.

10. The semiconductor device according to claim 7, wherein the gate electrode does not overlap with the channel formation region.

11. A semiconductor device comprising:
an electron trap layer;
an oxide semiconductor overlapping with the electron trap layer, the oxide semiconductor comprises a channel formation region;
an insulator between the electron trap layer and the oxide semiconductor; and
a gate electrode arranged so as to control the number of electrons trapped by the electron trap layer.

12. The semiconductor device according to claim 11, wherein the electron trap layer is located under the oxide semiconductor.

13. The semiconductor device according to claim 11, wherein the electron trap layer is located over the oxide semiconductor.

14. The semiconductor device according to claim 11, wherein the gate electrode does not overlap with the channel formation region.

15. The semiconductor device according to claim 11, wherein the oxide semiconductor comprises indium, gallium and zinc.

* * * * *